(12) United States Patent
Iguchi

(10) Patent No.: US 11,705,536 B2
(45) Date of Patent: Jul. 18, 2023

(54) IMAGE DISPLAY ELEMENT WITH IMPROVED LIGHT EMISSION EFFICIENCY

(71) Applicant: SHARP KABUSHIKI KAISHA, Sakai (JP)

(72) Inventor: Katsuji Iguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 360 days.

(21) Appl. No.: 16/854,412

(22) Filed: Apr. 21, 2020

(65) Prior Publication Data

US 2020/0343410 A1    Oct. 29, 2020

Related U.S. Application Data

(60) Provisional application No. 62/837,532, filed on Apr. 23, 2019.

(51) Int. Cl.
| | |
|---|---|
| *G09G 3/32* | (2016.01) |
| *H01L 33/40* | (2010.01) |
| *H01L 33/20* | (2010.01) |
| *H01L 33/60* | (2010.01) |
| *H01L 33/50* | (2010.01) |

(52) U.S. Cl.
CPC .............. *H01L 33/20* (2013.01); *G09G 3/32* (2013.01); *H01L 33/505* (2013.01); *H01L 33/60* (2013.01)

(58) Field of Classification Search
CPC ........................ H01L 27/156; H01L 33/00–60
See application file for complete search history.

(56) References Cited

U.S. PATENT DOCUMENTS

| | | | | |
|---|---|---|---|---|
| 10,244,687 | B1* | 4/2019 | Vardi | ................ H01L 33/44 |
| 2012/0119237 | A1* | 5/2012 | Leatherdale | .......... H01L 27/156 |
| | | | | 257/E33.006 |
| 2015/0362165 | A1* | 12/2015 | Chu | .................... H01L 27/156 |
| | | | | 362/235 |
| 2016/0155901 | A1 | 6/2016 | Lopez et al. | |
| 2018/0119939 | A1* | 5/2018 | Li | ............................ H01L 33/60 |
| 2018/0166424 | A1* | 6/2018 | Sim | ...................... H01L 33/483 |
| 2018/0226543 | A1* | 8/2018 | Masui | ................ H01L 33/0095 |
| 2020/0035748 | A1* | 1/2020 | Xia | ........................ H01L 27/156 |
| 2020/0135706 | A1* | 4/2020 | Sa | ........................... H01L 25/167 |

FOREIGN PATENT DOCUMENTS

| | | |
|---|---|---|
| JP | 2002-141492 A | 5/2002 |
| JP | 2009-266437 A | 11/2009 |
| JP | 2013-501357 A | 1/2013 |
| JP | 2016-528728 A | 9/2016 |
| JP | 2018-527748 A | 9/2018 |

* cited by examiner

*Primary Examiner* — Didarul A Mazumder
(74) *Attorney, Agent, or Firm* — ScienBiziP, P.C.

(57) ABSTRACT

In an image display element, a side surface of a nitride semiconductor is covered with a reflection material inclined so as to open in a light emitting direction, wavelength conversion units are surrounded by partition walls, and side surfaces of the partition walls facing the wavelength conversion units are reflection surfaces inclined so as to open in the light emitting direction.

16 Claims, 26 Drawing Sheets

FIG. 9A

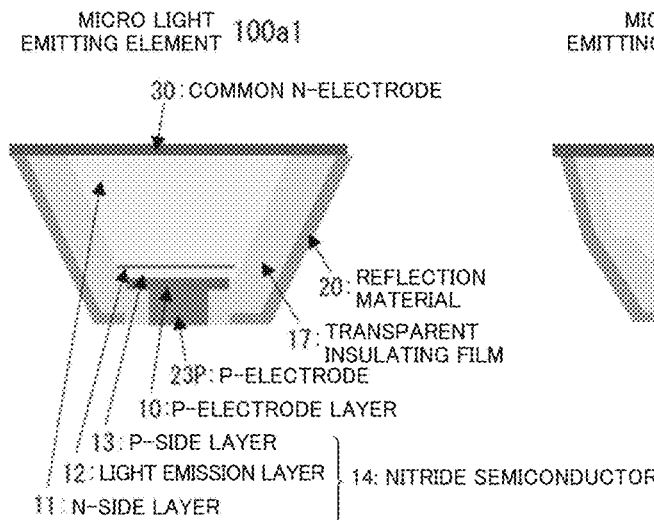

MICRO LIGHT EMITTING ELEMENT 100a1
30: COMMON N-ELECTRODE
20: REFLECTION MATERIAL
17: TRANSPARENT INSULATING FILM
23P: P-ELECTRODE
10: P-ELECTRODE LAYER
13: P-SIDE LAYER
12: LIGHT EMISSION LAYER
11: N-SIDE LAYER
14: NITRIDE SEMICONDUCTOR

FIG. 9B

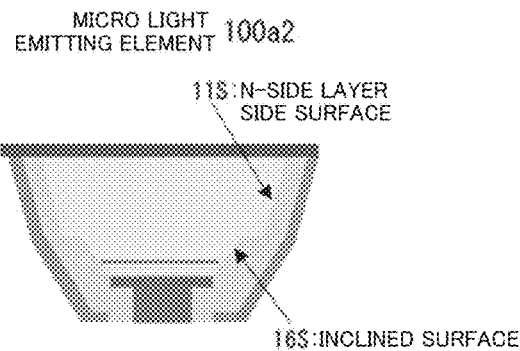

MICRO LIGHT EMITTING ELEMENT 100a2
11S: N-SIDE LAYER SIDE SURFACE
16S: INCLINED SURFACE

FIG. 9C

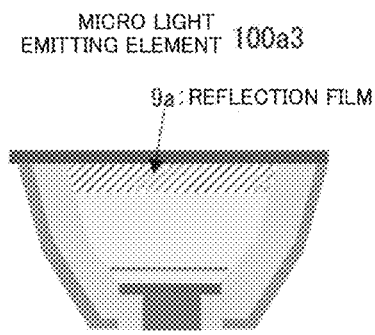

MICRO LIGHT EMITTING ELEMENT 100a3
9a: REFLECTION FILM

FIG. 9D

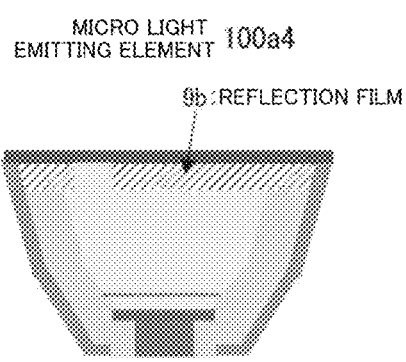

MICRO LIGHT EMITTING ELEMENT 100a4
9b: REFLECTION FILM

FIG. 9E

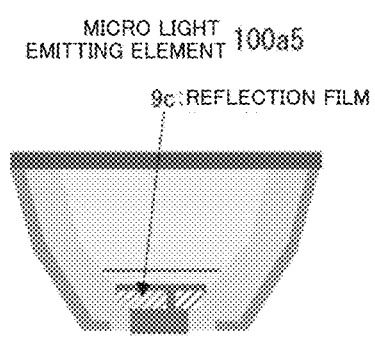

MICRO LIGHT EMITTING ELEMENT 100a5
9c: REFLECTION FILM

FIG. 9F

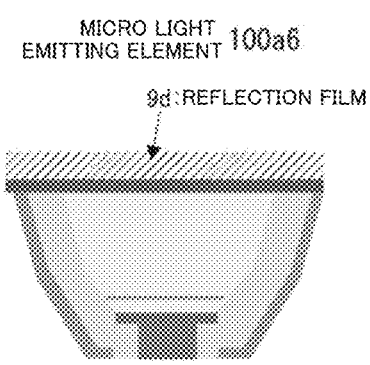

MICRO LIGHT EMITTING ELEMENT 100a6
9d: REFLECTION FILM

35: PARTITION WALL BASE MATERIAL

36: PARTITION WALL REFLECTION MATERIAL

37: OPENING PORTION

31: TRANSPARENT PORTION  32: RED WAVELENGTH CONVERSION UNIT  33: GREEN WAVELENGTH CONVERSION UNIT

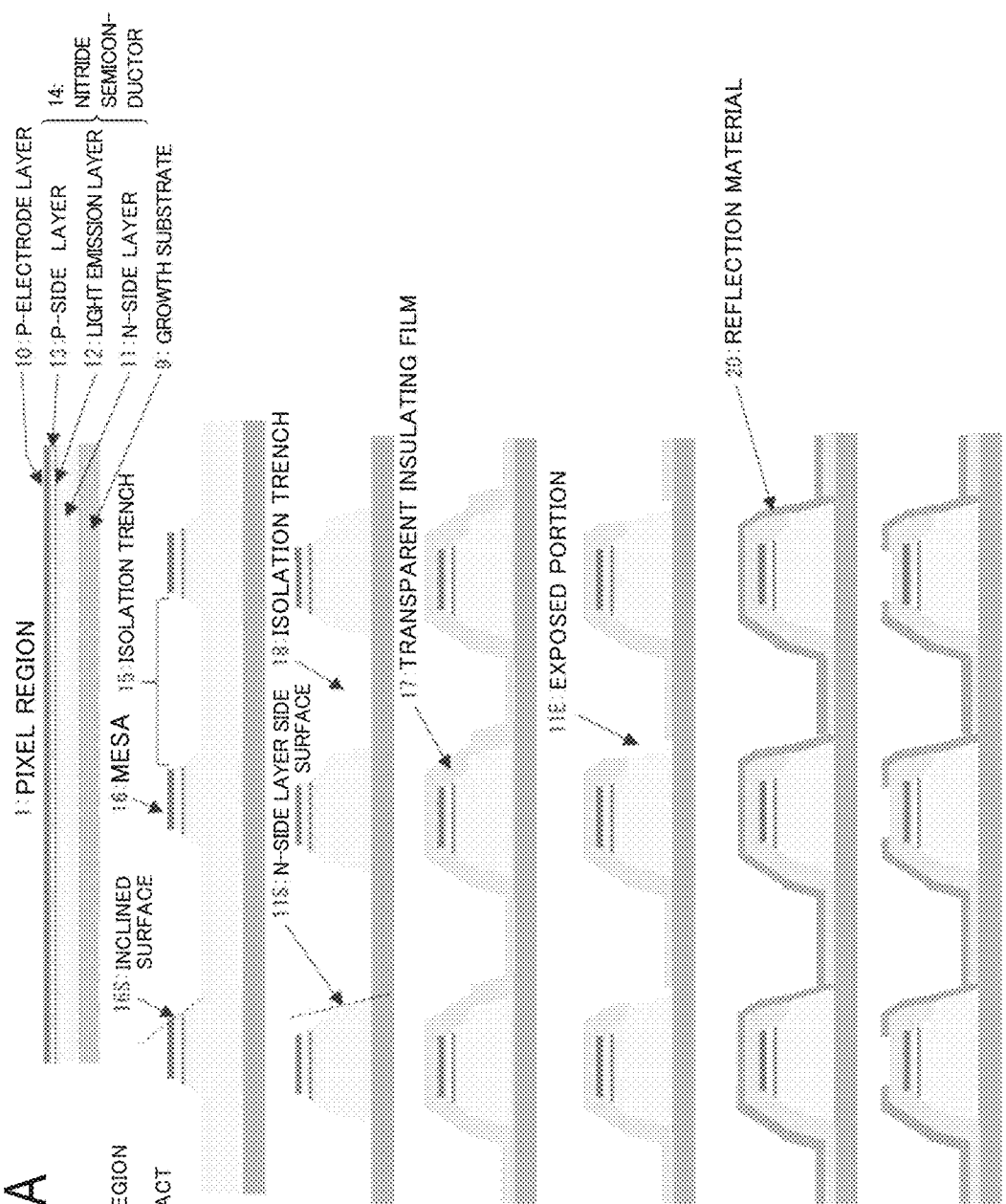

IMAGE DISPLAY ELEMENT WITH IMPROVED LIGHT EMISSION EFFICIENCY

TECHNICAL FIELD

The present invention relates to a micro light emitting element and an image display element including the same.

BACKGROUND ART

A display element has been proposed in which a plurality of micro light emitting elements constituting pixels are arranged on a driving circuit substrate. For example, in the technique disclosed in JP 2002-141492A, a driving circuit is formed on a silicon substrate, and a micro light emitting diode (LED) array that emits ultraviolet light is arranged on the driving circuit. In addition, in the technique, a wavelength conversion layer for converting ultraviolet light to red, green, and blue visible light is provided on the light emitting diode array, so that a small display element for displaying a color image is disclosed.

Such a display element has characteristics of high brightness and high durability in spite of a small size. Therefore, it is expected as a display element for a display device such as a glasses-like device, a head-up display (HUD) and the like.

As a method of manufacturing such a display element, since a material of the driving circuit substrate and a material of the micro light emitting element are different from each other, a method of forming both materials separately and thereafter bonding both materials is popular.

SUMMARY OF INVENTION

However, in a structure of the micro light emitting element and the display element disclosed in Patent Literature 1 described above, most (several tens %) of the light generated in a light emission layer is emitted from a side surface of the micro light emitting element toward an adjacent micro light emitting element. Such light is absorbed by the adjacent micro light emitting element and is re-emitted from the micro light emitting element. As a result, optical crosstalk occurs in the adjacent micro light emitting element, and a ratio of light emitted to the outside of the light generated by the micro light emitting element is reduced, which causes a problem that light emission efficiency is reduced. A similar problem also occurs in a wavelength conversion layer.

An aspect of the present invention has been made in view of the above problems, and an object thereof is to prevent optical crosstalk between adjacent micro light emitting elements and between adjacent wavelength conversion layers, and to provide a micro light emitting element and an image display element in which light emission efficiency of a conversion layer is improved.

(1) In order to solve the above problem, an image display element according to an aspect of the present invention includes a driving circuit substrate that includes a driving circuit supplying current to a micro light emitting element to emit light, the micro light emitting elements arranged in an array on the driving circuit substrate, and a wavelength conversion unit disposed on the micro light emitting element, and that converts excitation light emitted by the micro light emitting element into long wavelength light having a longer wavelength than the excitation light and emits the light to a side opposite to the driving circuit substrate, in which the micro light emitting element includes a semiconductor in which a first conductive layer, a light emission layer, and a second conductive layer having a conductivity type opposite to that of the first conductive layer are laminated in order from a light emitting surface side, a side surface of the semiconductor is inclined so as to open in a light emitting direction and is covered with a reflection material, the wavelength conversion unit is surrounded on sides by a partition wall, and a side surface of the partition wall facing the wavelength conversion unit is a reflection surface inclined so as to open in the light emitting direction.

(2) In addition, in the image display element of the aspect of the present invention, in addition to a configuration of the above (1), a bottom opening portion surrounded by the reflection surface is disposed inside the micro light emitting element from an upper end portion of the reflection material on the light emitting surface side.

(3) In addition, in the image display element of the aspect of the present invention, in addition to the configuration of the above (1), an image display element, a transparent insulating film is disposed between the side surface of the semiconductor and the reflection material.

(4) In addition, in the image display element of the aspect of the present invention, in addition to a configuration of the above (3), a bottom opening portion surrounded by the reflection surface covers the light emitting surface of the semiconductor.

(5) In addition, in the image display element of the aspect of the present invention, in addition to the configuration of the above (1), an inclination angle of the side surface of the partition wall is in a range of 85° to 45° with respect to an upper surface of the light emission layer.

(6) In addition, in the image display element of the aspect of the present invention, in addition to the configuration of the above (1), the micro light emitting elements arranged in an array include micro light emitting elements of sub pixels in which transparent portions are arranged instead of the wavelength conversion units, the transparent portion is surrounded on sides by a partition wall, and a side surface of the partition wall facing the transparent portion is a reflection surface inclined so as to open in the light emitting direction.

(7) In addition, in the image display element of the aspect of the present invention, in addition to the configuration of the above (3), a film thickness of the transparent insulating film is 75 nm or more.

(8) In addition, in the image display element of the aspect of the present invention, in addition to the configuration of the above (3), a film thickness of the transparent insulating film is 400 nm or more.

(9) In addition, in the image display element of the aspect of the present invention, in addition to the configuration of the above (1), an inclination angle of a side surface in a periphery of the light emission layer among the side surfaces of the semiconductor is 60° or less with respect to the upper surface of the light emission layer.

(10) In addition, in the image display element of the aspect of the present invention, in addition to a configuration of the above (9), the inclination angle of the side surface in the periphery of the light emission layer among the side surfaces of the semiconductor is 50° or less with respect to the upper surface of the light emission layer.

(11) In addition, in the image display element of the aspect of the present invention, in addition to the configuration of the above (1), an inclination angle of a side surface in a periphery of the first conductive layer among the side surfaces of the semiconductor is less than 90° with respect to the upper surface of the light emission layer.

(12) In addition, in the image display element of the aspect of the present invention, in addition to the configuration of the above (1), the reflection material electrically conducts the first conductive layer.

(13) In addition, in the image display element of the aspect of the present invention, in addition to the configuration of the above (1), the reflection material electrically conducts the second conductive layer.

(14) In addition, in the image display element of the aspect of the present invention, in addition to the configuration of the above (1), an inclination angle of the reflection surface with respect to the upper surface of the light emission layer is equal to or less than the inclination angle of the side surface of the first conductive layer with respect to the upper surface of the light emission layer.

(15) In addition, in the image display element of the aspect of the present invention, in addition to the configuration of the above (1), the reflection surface is formed of a reflection material, and the reflection material surrounding the side surface of the semiconductor and the reflection material forming the reflection surface of the partition wall are in direct contact with each other.

(16) In addition, in the image display element of the aspect of the present invention, in addition to a configuration of the above (15), the reflection material surrounding the side surface of the semiconductor and the reflection material forming the reflection surface of the partition wall are formed of the same material.

(17) In addition, in the image display element of the aspect of the present invention, in addition to the configuration of the above (1), the reflection surface is formed of the reflection material, and the reflection material forming the reflection surface of the partition wall electrically conducts the first conductive layer.

(18) In addition, in the image display element of the aspect of the present invention, in addition to a configuration of the above (17), the reflection material forming the reflection surface of the partition wall forms a portion of a wiring that electrically connects the first conductive layer and the driving circuit substrate.

(19) In addition, in the image display element of the aspect of the present invention, in addition to the configuration of the above (1), a reflection layer that transmits the excitation light and reflects the long wavelength light is provided inside the micro light emitting element.

(20) In addition, in the image display element of the aspect of the present invention, in addition to the configuration of the above (1), a reflection layer that reflects both the excitation light and the long wavelength light is provided inside the micro light emitting element.

Optical crosstalk between adjacent micro light emitting elements can be prevented, and the light emission efficiency of the micro light emitting element can be improved.

BRIEF DESCRIPTION OF DRAWINGS

FIGS. 9A to 9F are schematic cross-sectional views illustrating a modification example of the micro light emitting element according to Embodiment 1 of the present invention.

FIGS. 21A to 21G are schematic cross-sectional views illustrating manufacturing flows of the image display element according to Embodiment 6 of the present invention.

DESCRIPTION OF EMBODIMENTS

Embodiment 1

(Configuration of Image Display Element 200)

Figure 1:
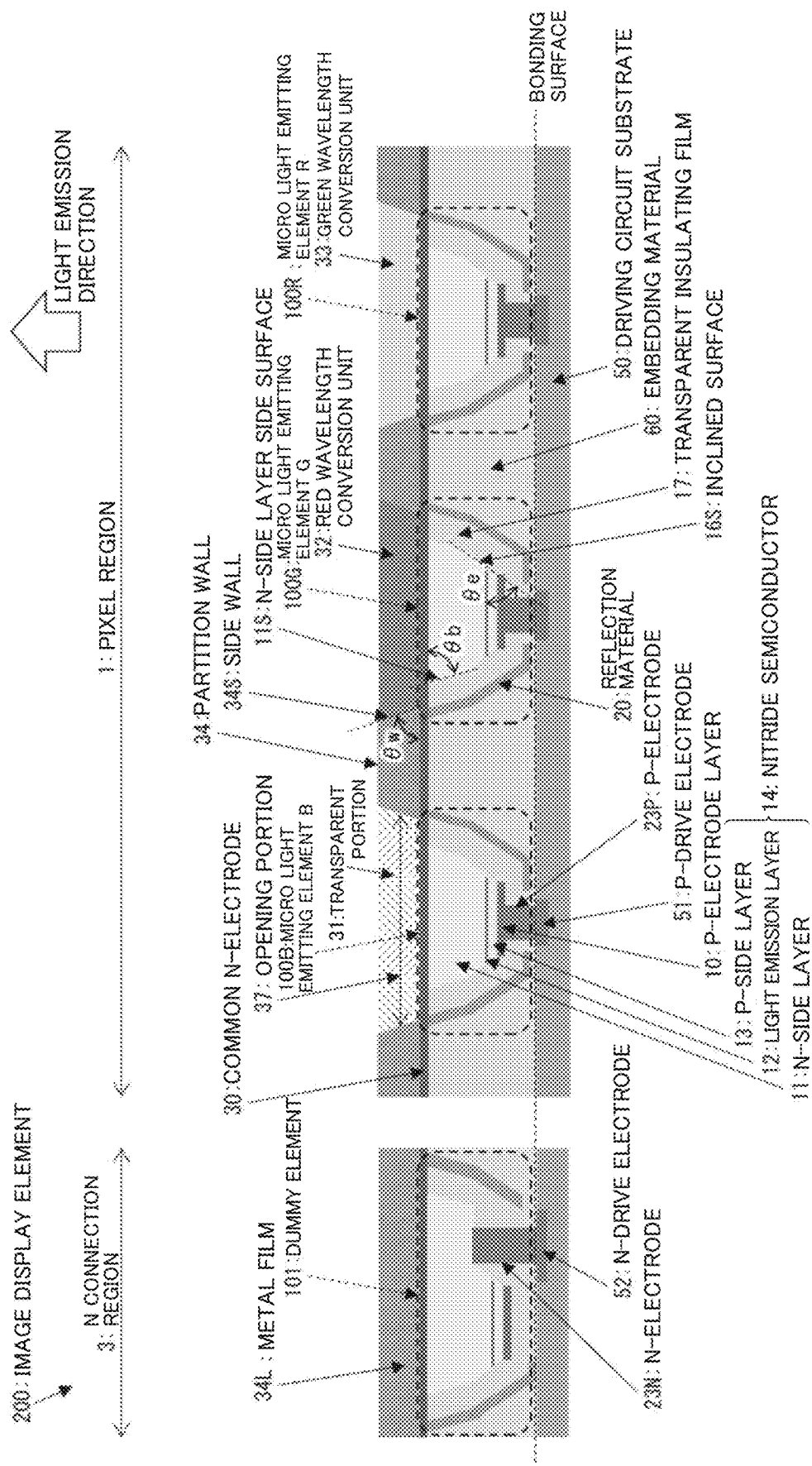
FIG. 1 is a schematic cross-sectional view of an image display element according to Embodiment 1 of the present invention.
Figure 2:
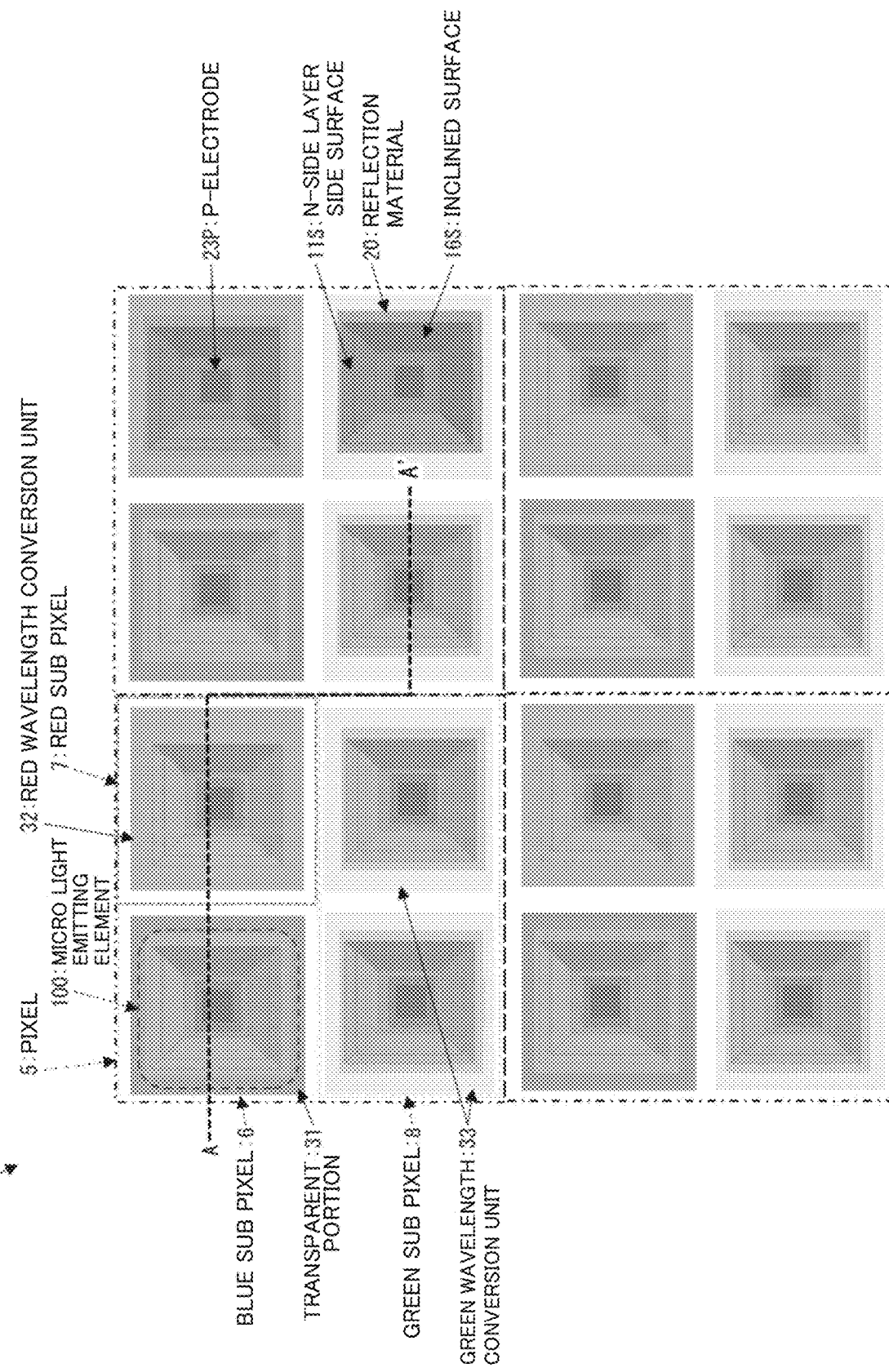
FIG. 2 is a schematic plan view of a micro light emitting element according to Embodiment 1 of the present invention.

An embodiment of the present invention will be described using an image display element 200 as a display element including a plurality of micro light emitting elements 100 as an example. FIG. 1 is a schematic cross-sectional view of the image display element 200 according to Embodiment 1 of the present invention. FIG. 2 is a schematic plan view of the micro light emitting element 100 according to Embodiment 1 of the present invention. In the description of a configuration of the image display element 200, a light emitting surface is called an upper surface, a surface opposite to the light emitting surface is called a lower surface, and a side surface other than the upper surface and the lower surface is called a side surface.

As illustrated in FIG. 2, the upper surface of the image display element 200 is a pixel region 1 in which a plurality of pixels 5 are arranged in an array. Each pixel 5 includes a blue sub pixel 6 that emits the blue light, a red sub pixel 7 that emits the red light, and a green sub pixel 8 that emits the green light. By adjusting the emission intensity of each of the blue sub pixel 6, the red sub pixel 7, and the green sub pixel 8, light of various colors can be emitted as the pixel 5. When it is not necessary to distinguish the blue sub pixel 6, the red sub pixel 7, and the green sub pixel 8, these may be simply referred to as a sub pixel. Each of the sub pixels includes the micro light emitting element 100. The number of micro light emitting elements 100 included in one image display element 200 may be set as appropriate. For example, in the pixel region 1, 3,000 or more micro light emitting elements 100 may be integrated.

FIG. 2 illustrates an example in which the green sub pixel 8 is configured to include two micro light emitting elements 100, and the number of the micro light emitting elements 100 constituting each sub pixel may be one or more. Arrangement pattern of sub pixels in the pixel is not limited to a pattern shown in FIG. 2 and can be modified. In addition, in FIG. 2, although the micro light emitting element 100 is drawn in a shape close to a square, the shape of the micro light emitting element 100 is not particularly limited, and may be any shape such as a rectangle, a polygon, a circle, and an ellipse. The length of the upper surface of the micro light emitting element 100 along the longitudinal direction is preferably 60 µm or less.

FIG. 1 illustrates a cross-sectional view taken along line A-A' of FIG. 2. As illustrated in FIG. 1, an N connection region 3 is provided outside the pixel region 1. A dummy element 101 is arranged in the N connection region 3, and the micro light emitting element 100 is arranged in the pixel region 1. More specifically, a micro light emitting element 100B is arranged in the blue sub pixel 6, a micro light emitting element 100R is arranged in the red sub pixel 7, and a micro light emitting element 100G is arranged in the green sub pixel 8, respectively. When it is not necessary to distinguish the micro light emitting elements 100B, 100R, and 100G, these are simply referred to as a micro light emitting element 100.

The micro light emitting elements 100 are arranged in a two-dimensional array on the driving circuit substrate 50 as illustrated in FIGS. 1 and 2. The micro light emitting elements 100B, 100R, and 100G have the same structure, and all elements emit the blue light. A transparent portion 31 is disposed above the micro light emitting element 100B in the blue sub pixel 6, a red wavelength conversion unit 32 is disposed above the micro light emitting element 100R in the red sub pixel 7, and a green wavelength conversion unit 33 is disposed above the micro light emitting element 100G in the green sub pixel 8. In the following description, when it is not necessary to particularly distinguish the red wavelength conversion unit 32 and the green wavelength conversion unit 33, these may be simply referred to as a wavelength conversion unit.

The blue light emitted from the micro light emitting element 100B passes through the transparent portion 31 in contact with the upper surface of the micro light emitting element 100B and is emitted to the outside. On the other hand, the blue light emitted by the micro light emitting element 100R is absorbed by the red wavelength conversion unit 32, converted into the red light, and emitted to the outside. Similarly, the blue light emitted by the micro light emitting element 100G is absorbed by the green wavelength conversion unit 33, converted into the green light, and emitted to the outside.

The transparent portion 31, the red wavelength conversion unit 32, and the green wavelength conversion unit 33 are separated by a partition wall 34. Since the partition wall 34 is provided so as to surround sides of the transparent portion 31, an opening portion (bottom opening portion) 37 surrounded by the partition wall 34 is formed at the bottom portion of the transparent portion 31. Therefore, the blue light emitted from the micro light emitting element 100B enters the transparent portion 31 through the opening portion 37 as a window. In addition, the light reflected in the transparent portion 31 passes through the opening portion 37 and enters the inside of the micro light emitting element 100B. The same applies to the red wavelength conversion unit 32 and the green wavelength conversion unit 33. The opening portions 37 are also formed at the bottom portions of these, and light passes through the opening portion 37. Although not illustrated, a light diffusion layer, a color filter, a micro lens, a black matrix, and the like may be disposed on the transparent portion 31, the red wavelength conversion unit 32, the green wavelength conversion unit 33, and the partition wall 34.

The micro light emitting element 100 is provided with a nitride semiconductor (semiconductor) 14, a P-electrode 23P, and a common N-electrode 30. A common N-electrode 30 is disposed on a light emitting surface side with respect to the nitride semiconductor 14. In addition, P-electrode 23P is disposed on the driving circuit substrate 50 side with respect to the nitride semiconductor 14. The type of semiconductor used for the micro light emitting element 100 is not particularly limited, and a semiconductor other than the nitride semiconductor 14 can be used.

The P-electrode 23P is connected to a P-drive electrode 51 on the driving circuit substrate 50. The common N-electrode 30 is connected to an N-drive electrode 52 on the driving circuit substrate 50 in the N connection region 3 outside the pixel region 1. The micro light emitting elements 100 are supplied with current from the corresponding P-drive electrodes 51 and emit light. A light emission direction is a direction opposite to the driving circuit substrate 50, and is on the common N-electrode 30 side.

The micro light emitting elements 100B, 100R, and 100G are individually divided, and a space between the micro light emitting elements 100 is filled with an embedding material 60. Although the details will be described later, the reflection material 20 and the P-electrode layer 10 can prevent light from leaking in the bottom direction and the side direction of the micro light emitting element 100. Therefore, the embedding material 60 may be formed of a transparent resin.

Here, in a micro light emitting element in the related art, optical crosstalk is prevented by a filler disposed between adjacent micro light emitting elements. Therefore, it is difficult to completely prevent optical crosstalk due to bubbles generated in the filler. In addition, it was necessary to lengthen the filling time in order to prevent bubbles from being generated in the filler. Furthermore, in the micro light emitting element in the related art, it is necessary to use a light absorbing material such as carbon black or a special material such as a white resin containing $TiO_2$ particles as a filler. From the above, a manufacturing cost of the micro light emitting element in the related art was increased due to the filler. On the other hand, in the image display element 200, since the material selection of the embedding material 60 is facilitated and the embedding material 60 is easily manufactured, the manufacturing cost can be reduced as compared with the micro light emitting element in the related art.

The nitride semiconductor 14 is formed by laminating an N-side layer 11 (first conductive layer), a light emission layer 12, and a P-side layer 13 (second conductive layer) in this order from the light emitting surface side. The P-side layer 13 and the N-side layer 11 have conductivity types opposite to each other.

In general, the light emission layer 12 is interposed between an N-type layer and a P-type layer. In this case, the N-side layer 11 is the N-type layer, and the P-side layer 13 is the P-type sphere. However, the N-type layer and the P-type layer may include a non-doped layer or a layer with a dopant having the opposite conductivity. Therefore, hereinafter, the N-type layer and the P-type layer will be referred to as an N-side layer 11 and a P-side layer 13, respectively.

In addition, hereinafter, a configuration in which the N-side layer 11 is disposed on the light emitting surface side of the nitride semiconductor 14 will be described, and the P-side layer 13 may be disposed on the light emitting surface side. Each of the N-side layer 11, the light emission layer 12, and the P-side layer 13 is normally optimized including a plurality of layers instead of a single layer, and since it does not directly relate to one aspect of the present invention, detailed structures of the N-side layer 11, the light emission layer 12, and the P-side layer 13 will not be described in detail.

The P-side layer 13 of the nitride semiconductor 14 conducts the P-electrode 23P through a P-electrode layer 10 disposed on the lower surface side of the P-side layer 13. The P-electrode layer 10 covers the P-side layer 13 from the surface opposite to the light emitting surface side, and also plays a role of preventing light emission downward. Therefore, it is preferable that the P-electrode layer 10 covers most of the lower surface of the P-side layer 13 so that light reaching the lower surface of the P-side layer 13 can be efficiently reflected upward.

The P-electrode layer 10 may have either a single-layer structure or a plurality of layers structure. On the side of the P-electrode layer 10 in contact with the P-side layer 13, it is preferable to dispose a metal layer having a high reflectance with respect to visible light. For example, the P-electrode layer 10 may have a metal layer containing silver or aluminum as a main component on the P-side layer 13 side. Furthermore, in order to realize good ohmic contact between such a metal layer and the P-side layer 13, a metal such as palladium or nickel may be partially disposed, or a significantly thin metal film such as palladium or nickel may be disposed. The driving circuit substrate 50 supplies a current to the micro light emitting element 100 in the pixel region 1 and controls light emission of the micro light emitting element 100.

Although not illustrated, the driving circuit substrate 50 includes a micro light emitting element driving circuit, a row selection circuit, a column signal output circuit, an image processing circuit, an input and output circuit, and the like. The micro light emitting element driving circuit controls a current supplied to each micro light emitting element 100. The row selection circuit selects a row of the micro light emitting elements 100 arranged in a two-dimensional matrix. The column signal output circuit outputs a light emission signal to each column of the micro light emitting elements 100 arranged in a two-dimensional matrix. The image processing circuit calculates the light emission signal based on an input signal.

The front surface of the driving circuit substrate 50 is a bonding surface for bonding with the plurality of micro light emitting elements 100, and the plurality of micro light emitting elements 100 are attached to the front surface of the driving circuit substrate 50. That is, the front surface of the driving circuit substrate 50 faces the surface of the micro light emitting element 100 opposite to the light emitting surface side. The driving circuit substrate 50 may be, for example, a silicon substrate (semiconductor substrate) on which a large scale integration (LSI) is formed, or may be a glass substrate or a resin substrate on which a circuit formed by a thin film transistor (TFT) is formed. The driving circuit substrate 50 can be manufactured by a known technique such as those described above.

On the front surface of a portion corresponding to the pixel region 1 of the driving circuit substrate 50, the P-drive electrodes 51 for supplying a current to the micro light emitting element 100 are arranged in a two-dimensional array. In addition, an N-drive electrode 52 is disposed on the front surface of the driving circuit substrate 50 in the N connection region 3 (outside the pixel region 1). The N-drive electrode 52 conducts with the common N-electrode 30 through the dummy element 101. In the dummy element 101, the common N-electrode 30 and the N-electrode 23N conduct with each other through the N-side layer 11. The dummy element 101 is connected to the N-drive electrode 52 by the same connection method as the micro light emitting element 100.

The micro light emitting element 100 of the present embodiment is a so-called vertical electrode type. The micro light emitting element 100 includes the P-electrode 23P on one surface and the common N-electrode 30 on the other surface. Specifically, in the micro light emitting element 100, the common N-electrode 30 is disposed on the light emitting surface side, and the P-electrode 23P is disposed on the surface opposite to the light emitting surface side. The light emitting surface of the micro light emitting element 100 is the upper surface of the micro light emitting element 100, and the side opposite to the light emitting surface of the micro light emitting element 100 is the lower side of the micro light emitting element 100. The P-electrode 23P and the P-drive electrode 51 are connected to each other in a one-to-one relationship.

In the pixel region 1, the P-electrode 23P connected to the P-side layer 13 is disposed on the lower surface of the micro light emitting element 100, the P-electrode 23P is connected to the P-drive electrode 51 on the driving circuit substrate 50, and transmits a current supplied from the driving circuit substrate 50 to the P-side layer 13. Hereinafter, only the structure in which the P-electrode 23P and the P-drive electrode 51 are directly connected to each other is illustrated, and a connecting member such as a bump, a paste, or a nanoparticle may be interposed between the two electrodes. The same applies to the N-electrode 23N and the N-drive electrode 52.

The current passed through the P-side layer 13 further passes through the light emission layer 12 and the N-side layer 11, flows to the common N-electrode 30, and flows to the N-drive electrode 52 of the driving circuit substrate 50 in the N connection region 3 outside the pixel region 1. In this manner, the micro light emitting element 100 emits light at a predetermined intensity according to the amount of current supplied from the driving circuit substrate 50.

The common N-electrode 30 is formed of a transparent conductive layer conductive to the N-side layer 11, that is, a transparent conductive film. The common N-electrode 30 may be, for example, an oxide semiconductor such as indium-tin-oxide (ITO), and indium-zinc-oxide (IZO), or may be a silver nanofiber film, or the like. The common N-electrode 30 is preferably as thin as possible in order to reduce the absorption of blue light. Although the wiring resistance is increased by reducing the thickness, in the configuration of FIG. 1, since the partition wall 34, which is a conductive material, is electrically connected to the common N-electrode 30 and disposed over the entire pixel region 1, the wiring resistance between the N-drive electrode 52 and the micro light emitting element 100 can be maintained low.

(Problems of Technique in the Related Art)

In the technique in the related art as disclosed in Patent Literature 1, most (several tens %) of light generated in the light emission layer of the micro light emitting element is emitted from the side surface of the micro light emitting element toward the adjacent micro light emitting element. As a result, optical crosstalk that appears to emit light from the micro light emitting element other than the micro light emitting element need to originally emit light occurs.

In a case where the micro light emitting elements are not completely separated from each other as in the image display element 200 of FIG. 1, and the micro light emitting elements are connected by a semiconductor such as a nitride semiconductor, similar optical crosstalk occurs when light leaks to an adjacent micro light emitting element through the semiconductor. Such optical crosstalk causes problems such as a decrease in contrast and a decrease in color purity.

A large amount of light is lost due to light emission from the side surface of the micro light emitting element, and light is confined inside the micro light emitting element, so that a ratio of light emitted to the outside to the light generated by the micro light emitting element is reduced, and the light emission efficiency is reduced. Such a decrease in light extraction efficiency is a phenomenon that occurs because the refractive index of the semiconductor constituting the micro light emitting element is higher than refractive index of air or resin. Problems such as an increase in power consumption and an increase in temperature due to heat generation occur due to a decrease in the light emission efficiency.

Furthermore, in a case where the light emitted from the micro light emitting element is used as the excitation light and the wavelength conversion layer converts the excitation light into light having a long wavelength (long wavelength light) and outputs the converted light, a similar problem occurs in the wavelength conversion layer. That is, light emitted from the side surface of the wavelength conversion layer toward the adjacent pixel is absorbed by the wavelength conversion layer of the adjacent pixel, converted to another wavelength, or re-emitted at the same wavelength. In either case, optical crosstalk occurs, deteriorating image quality. In addition, when the side surface of the wavelength conversion layer is surrounded by a light absorbing material for the purpose of preventing such optical crosstalk, the light output is significantly reduced.

An aspect of the present invention has been made in view of the above problems, and an object thereof is to prevent a decrease in contrast and a decrease in color purity by preventing the optical crosstalk both between the micro light emitting elements and between wavelength conversion layers adjacent to each other, and to reduce the power consumption by improving the light emission efficiency of the micro light emitting element and the wavelength conversion layer.

(Reflection Surface Surrounding Side Surface of Nitride Semiconductor 14)

In the micro light emitting element 100, a reflection surface surrounding the side surface of the nitride semiconductor 14 is formed, thereby preventing light leakage from the side of the nitride semiconductor 14. In addition, since the reflection surface is inclined so as to open in the light emitting direction, light traveling to the side of the nitride semiconductor 14 can be guided in the light emitting direction. This will be described below.

In the example of FIG. 1, an inclined surface (light emission layer inclined surface) 16S is formed in a periphery of the light emission layer 12 in the nitride semiconductor 14. The inclined surface 16S forms a portion of the side surface of the N-side layer 11, the entire periphery of the side surface of the light emission layer 12, and an entire periphery of a portion of the side surface of the P-side layer 13. As illustrated in FIG. 2, in a case where the planar shape of the micro light emitting element 100 is a quadrangle, the side surface of one micro light emitting element 100 includes four inclined surfaces 16S. The entire side surface of the P-side layer 13 is preferably inclined in the same manner as the periphery of the light emission layer 12, and depending on the manufacturing flow, the side surface of the P-side layer 13 on the P-electrode layer 10 side may not be inclined. In addition, in a case where the micro light emitting element 100 has a polygonal shape (N polygon) in a top view, N inclined surfaces 16S are formed. In addition, in a case where the planar shape of the micro light emitting element 100 is circular, the inclined surface 16S has the same shape as the side surface of a truncated cone.

In FIG. 1, an inclination angle of the inclined surface 16S with respect to the upper surface of the light emission layer 12 (surface perpendicular to the light emitting direction) is denoted by θe. The inclination angle θe can be said to be an angle formed between the inclined surface 16S and the display surface of the image display element 200. It is preferable that the inclination angle θe is approximately 40° or more and 55° or less. In addition, the angle may be 35° or more and 60° or less in consideration of manufacturing variations.

As illustrated in FIG. 1, the inclined surface 16S extends from the side surface of the P-side layer 13 to a portion of the side surface of the N-side layer 11, and does not reach the light emitting surface, that is, the upper surface of the micro light emitting element 100. A portion of the side surface of the N-side layer 11 forms an N-side layer side surface 11S. The N-side layer side surface 11S extends from the upper end portion of the inclined surface 16S to the light emitting surface.

In FIG. 1, an inclination angle of the N-side layer side surface 11S with respect to the upper surface of the light emission layer 12 (surface perpendicular to the light emitting direction) is denoted by θb. The inclination angle θb is preferably larger than the inclination angle θe. In addition, the inclination angle θb is less than 90°, and the smaller the angle, the more preferable. In a case where a horizontal plane of the light emission layer 12 is parallel to a horizontal plane that is the upper surface of the N-side layer 11, the inclination angle θb is an angle formed between the N-side layer side surface 11S and the horizontal plane of the N-side layer 11. On the other hand, in a case where the horizontal plane of the light emission layer 12 is not parallel to the horizontal plane of the N-side layer 11, the inclination angle θb is an angle formed between the N-side layer side surface 11S and the horizontal plane of the N-side layer 11.

However, in a case where the size of the micro light emitting element 100 is small (for example, in a case where the long side of the upper surface of the micro light emitting element 100 is 10 μm or less), when the inclination angle θb is reduced, the area of the horizontal plane of the light emission layer 12 is reduced. When the area of the horizontal plane of the light emission layer 12 is reduced, a current density of the current passing through the light emission layer 12 may increase, and the internal quantum efficiency may be reduced. Therefore, in a case where the size of the micro light emitting element 100 is small, the inclination angle θb is preferably approximately 70° or more and 85° or less.

The inclined surface 16S and the N-side layer side surface 11S are covered with a transparent insulating film 17, and the transparent insulating film 17 is covered with a reflection material 20. That is, both the inclined surface 16S and the N-side layer side surface 11S are covered with the reflection material 20. The transparent insulating film 17 is disposed between the inclined surface 16S and the reflection material 20.

The transparent insulating film 17 extends to between the N-side layer side surface 11S and the reflection material 20. Here, in the transparent insulating film 17, a portion disposed between the inclined surface 16S and the reflection material 20 is referred to as a first transparent insulating film, and a portion disposed between the N-side layer side surface 11S and the reflection material 20 is referred to as a second transparent insulating film. In this case, the second transparent insulating film is obtained by extending the first transparent insulating film to a position between the N-side layer side surface 11S and the reflection material 20. That is, the first transparent insulating film and the second transparent insulating film are integrated. The film thickness of the transparent insulating film 17 is preferably 75 nm or more, and more preferably 400 nm or more. The transparent insulating film 17 is preferably formed of a material that is transparent to visible light, such as $SiO_2$, and has a refractive index smaller than that of the nitride semiconductor 14.

The reflection material 20 is provided to form a reflection surface on the side of the nitride semiconductor 14, and may be formed of a single layer or a plurality of layers. The reflection material 20 preferably has a metal layer mainly formed of silver or aluminum having a high reflectance to visible light on the transparent insulating film 17 side, that is, on the nitride semiconductor 14 side. The reflection material 20 needs to shield the light, and the total thickness thereof is preferably several tens nm or more. The P-electrode 23P and the reflection material 20 may be formed of the same material, and in this case, the manufacturing flow can be simplified. As a matter of course, the P-electrode 23P and the reflection material 20 may be formed of different materials.

It is preferable that the reflection material 20 is disposed so as to overlap with the P-electrode layer 10 in a plan view from the side opposite to the light emitting surface side. In a case where there is a gap between the reflection material 20 and the P-electrode layer 10 (reflection material 20 and the P-electrode layer 10 do not overlap) in a plan view from the side opposite to the light emitting surface side, this is because light is emitted from the gap to the outside and causes the optical crosstalk.

(Reflection Surface Formed by Partition Wall 34)

The red wavelength conversion unit 32 is surrounded on the sides by the partition wall 34, and the side wall 34S of the partition wall 34 facing the red wavelength conversion unit 32 is a reflection surface inclined so as to open in the light emitting direction (in other words, inclined in a forward taper). In addition, the green wavelength conversion unit 33 and the transparent portion 31 are similarly surrounded on the sides. As a result, light traveling toward the sides of the transparent portion 31, the red wavelength conversion unit 32, and the green wavelength conversion unit 33 can be guided in the light emitting direction.

In FIG. 1, an inclination angle of the side wall 34S with respect to the upper surface of the light emission layer 12 (surface perpendicular to the light emitting direction) is denoted by θw. Therefore, θw is the inclination angle of the reflection surface. θw is preferably smaller than 90°, and more preferably approximately 45° to 85°. This is because in a case where θw is too small, the bottom portion width of the partition wall 34 increases, the width of the partition wall 34 occupying the length of one side of the sub pixel increases, and the micro light emitting element 100 becomes smaller. In addition, in this case, when the area of the sub pixel is small, the area of the micro light emitting element 100 is reduced, and an effective area of the light emission layer 12 is reduced, so that there is a possibility that the current density passing through the light emission layer 12 may increase, the light emission efficiency may decrease, or the temperature may increase.

Inside the red wavelength conversion unit 32, the blue light is absorbed and the red light is generated. Of the generated red light, there is not much the red light emitted directly into the air. A portion of the generated red light is lost by reflection in the red wavelength conversion unit 32. Most of the generated red light is incident on the nitride semiconductor 14, returns to the red wavelength conversion unit 32 through reflection in the nitride semiconductor 14 again. A portion of the red light returned to the red wavelength conversion unit 32 is emitted into the air, and the rest is lost by reflection in the red wavelength conversion unit 32 or is incident on the nitride semi-fitting body 14 again.

As described above, in order that the red light is emitted in the light emitting direction, it is significantly important to reduce the loss due to reflection in the red wavelength conversion unit 32, and to efficiently return the red light incident on the nitride semiconductor 14 to the red wavelength conversion unit 32. The same applies to the green light. In addition, a considerable portion of the blue light incident on the transparent portion 31 from the micro light emitting element 100B is also reflected at the interface between the transparent portion 31 and the air. A portion of the blue light reflected in this manner is lost by the reflection at the transparent portion 31, and the remaining portion is incident on the nitride semiconductor 14 and returns to the transparent portion 31 again after being reflected in the nitride semiconductor 14. Therefore, as for the red light, it is significantly important to reduce the loss due to the reflection in the transparent portion 31 and to efficiently return the blue light incident on the nitride semiconductor 14 to the transparent portion 31, similarly to the red light.

In order to reduce light loss due to reflection inside the transparent portion 31, the red wavelength conversion unit 32, and the green wavelength conversion unit 33, it is necessary to cover the periphery of these members except for a connection portion with the micro light emitting element 100 and the upper surface (light emitting surface) with a material having a high reflectance. Therefore, in the image display element 200, the partition wall 34 is formed of a material having a high reflectance (for example, metal material) to form a reflection surface in the periphery of the transparent portion 31, the red wavelength conversion unit 32, and the green wavelength conversion unit 33. The partition wall 34 may have at least a portion facing the side surface of the transparent portion 31, the red wavelength conversion unit 32, and the green wavelength conversion unit 33 as the reflection surface. Therefore, the front surface of the partition wall 34 may be covered with a high reflectance reflection material, and the side wall of the partition wall 34 may be formed of a high reflectance metal film. The higher the reflectance, the more the light loss can be reduced.

In addition, it is desirable that the opening portion 37 at the bottom portion of the partition wall 34 is located inside the upper end portion of the reflection material 20 of the micro light emitting element 100. In this case, the embedding material 60 is not exposed in a case where the micro light emitting element 100 is viewed from above. According to this configuration, light traveling toward the driving circuit substrate 50 from the transparent portion 31, the red wavelength conversion unit 32, and the green wavelength conversion unit 33 can be made unlikely to leak to the embedding material 60. Such light can be guided to the micro light emitting element 100 and returned to the transparent portion 31, the red wavelength conversion unit 32, and the green wavelength conversion unit 33 through the micro light emitting element 100.

(Manufacturing Flow of Micro Light Emitting Element 100)

Next, a manufacturing flow of the micro light emitting element 100 will be described with reference to FIGS. 3A-3I. FIGS. 3A to 3I are schematic cross-sectional views illustrating the manufacturing flow of the micro light emitting element 100. In the description of the manufacturing flow of the micro light emitting element 100, the P-electrode layer 10 side is referred to as an upper side, and a growth substrate 9 side is referred to as a lower side. In addition, FIGS. 3A to 3I illustrate cross-sectional views of the pixel region 1 on the right side, and cross-sectional views of the N connection region 3 on the left side.

Figure 3A:
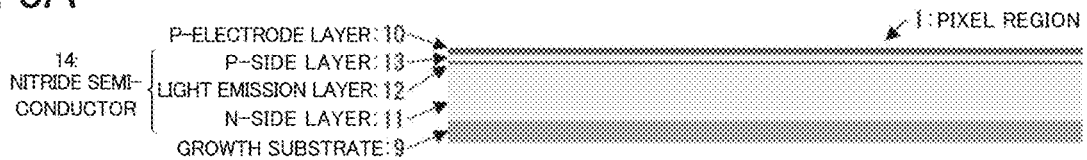
FIGS. 3A to 3I are schematic cross-sectional views illustrating manufacturing flows of the micro light emitting element according to Embodiment 1 of the present invention.

In the manufacturing flow of the micro light emitting element 100, first, as illustrated in FIG. 3A, the nitride semiconductor 14 is formed by sequentially laminating the N-side layer 11, the light emission layer 12, and the P-side layer 13 on the growth substrate 9.

The P-electrode layer 10 is further deposited on the nitride semiconductor 14.

Figure 3B:
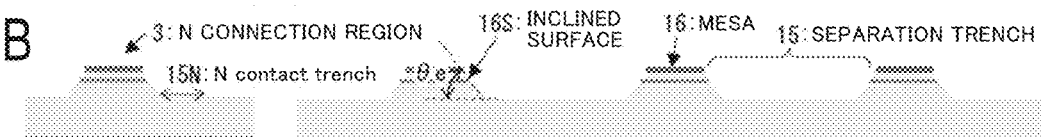

Next, as illustrated in FIG. 3B, the P-electrode layer 10, the P-side layer 13, the light emission layer 12, and the N-side layer 11 are partially etched to form a separation trench 15. At this time, the portion including the light emission layer 12 is a mesa 16. The mesa 16 includes the N-side layer 11, the light emission layer 12, the P-side layer 13, and the P-electrode layer 10. In the example of FIG. 3B, the separation trenches 15 are formed in a grid pattern at equal intervals in the vertical and horizontal directions in a plan view. Therefore, the mesas 16 are located in a two-dimensional matrix, and have a truncated quadrangular pyramid shape. The mesa 16 is the micro light emitting element 100 through the flows after FIG. 3C (refer to FIG. 2). The shape of the mesa 16 is not limited to a truncated quadrangular pyramid, and may be a truncated cone or a truncated pyramid other than the truncated quadrangular pyramid. In addition, as illustrated in FIG. 3B, in the N connection region 3, an N contact trench 15N is formed simultaneously with the division.

The inclined surface 16S, which is the side surface of the mesa 16, is formed such that the inclination angle $\theta e$ (refer to FIG. 1) formed by the inclined surface 16S and the horizontal plane of the light emission layer 12 is, for example, 50°. The inclined surface 16S is preferably formed such that the inclination angle $\theta e$ is 40° or more and 55° or less. By the inclined surface 16S, light traveling in a direction parallel or substantially parallel to the horizontal plane of the light emission layer 12, which occupies most of the light emitted from the light emission layer 12, can be reflected toward the light emitting surface. As a result, the light extraction efficiency of the micro light emitting element 100 can be increased.

As described above, the micro light emitting element 100 has a structure in which the reflection material 20 covers the side wall of the nitride semiconductor 14 in order to prevent the optical crosstalk. Since the reflection material 20 is formed on the inclined surface 16S and has the same inclination as the inclined surface 16S, in a case where the inclined surface 16S is perpendicular to the horizontal plane of the light emission layer 12, the light emitted in a direction parallel to the horizontal plane of the light emission layer 12 is not emitted to the outside by repeating reflection. Therefore, it is desirable that the inclination angle $\theta e$ of the inclined surface 16S is less than 90°.

In addition, when the inclination angle $\theta e$ deviates more than 45°, an incident angle when the light emitted from the light emission layer 12 is incident on the light emitting surface is too large, total reflection occurs on the light emitting surface, and the light is not emitted to the outside. Therefore, it is desirable that the inclination angle $\theta e$ is in the above range. The inclination angle $\theta e$ may be different for each of the plurality of side surfaces of the mesa 16. In that case, there are a plurality of inclination angles $\theta e$, and the minimum angle among the plurality of inclination angles θe is preferably 40° or more and 55° or less, and all the inclination angles θe are more preferably 40° or more and 55° or less.

Figure 3C:
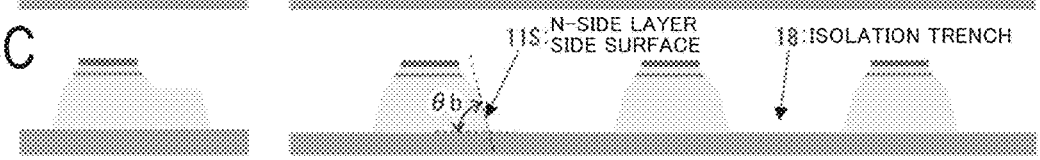

After the formation of the separation trenches 15, as illustrated in FIG. 3C, isolation trenches 18 for individually separating the nitride semiconductors 14 are formed. The side surface of the N-side layer 11 formed by the isolation trench 18 is the N-side layer side surface 11S. The N-side layer side surface 11S is formed such that an inclination angle θb (refer to FIG. 1) which is an angle formed between the N-side layer side surface 11S and the horizontal plane of the growth substrate 9 is, for example, 80°. The N-side layer side surface 11S is preferably formed such that the inclination angle θb is 70° or more and 85° or less. That is, the inclination angle θb is preferably larger than the inclination angle θe.

In order to improve the light extraction efficiency of the micro light emitting element 100, it is preferable that the inclination angle θb is as small as possible within an angle range that is larger than the inclination angle θe. In a later flow, the growth substrate 9 is separated, and the interface between the N-side layer 11 and the growth substrate 9 or a processed surface of the N-side layer 11 is a light emitting surface, so that the inclination angle θb is equal to the angle between the N-side layer side surface 11S and the light emitting surface.

In FIG. 3C, the isolation trench 18 reaches the growth substrate 9, and the N-side layer 11 having a constant thickness may be left. That is, the isolation trench 18 does not have to reach the growth substrate 9. In this case, in FIG. 4C in a later flow, after the growth substrate 9 is separated, the remaining N-side layer 11 is removed by etching, polishing, or the like, so that the micro light emitting elements 100 can be divided individually as illustrated in FIG. 1. After forming the isolation trench 18, a thermal treatment and a wet processing may be applied to recover or to remove crystalline defects caused by a dry etching. In this manufacturing process, high temperature processing and many kind of wet chemicals are easily applied because the micro light emitting element 100 is formed on the growth substrate 9 and does not have no corrosive metal electrode.

The shape of the micro light emitting element 100 in the state where the image display element 200 is formed is important, and the transition of the shape of the micro light emitting element during the manufacturing flow is not important. The inclination angle θb of the N-side layer side surface 11S may be different for each of the plurality of side surfaces of the N-side layer 11. In that case, there are a plurality of inclination angles θb, and the minimum angle among the plurality of inclination angles θb is preferably 70° or more and 85° or less, and all the inclination angles θb are more preferably 70° or more and 85° or less.

Figure 3D:

After the formation of the isolation trench 18, as illustrated in FIG. 3D, the transparent insulating film 17 is deposited so as to cover exposed portions of the growth substrate 9, the N-side layer 11, the light emission layer 12, the P-side layer 13, and the P-electrode layer 10. For example, a 700 nm thick $SiO_2$ film may be deposited as the transparent insulating film 17 by a chemical vapor deposition method (CVD). The transparent insulating film 17 may be SiN, SiON, SiCO, or a laminated film of these films in addition to the $SiO_2$ film. In order to make the thickness of the transparent insulating film 17 covering the side surface of the micro light emitting element 100 uniform, it is preferable to form the transparent insulating film 17 by the CVD method. As the CVD method, many kind of CVDs such as plasma CVD, thermal CVD, photo CCVD, and the like can be applied.

Figure 3E:
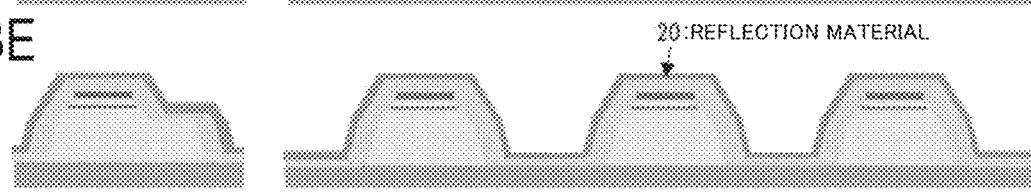
Figure 3F:
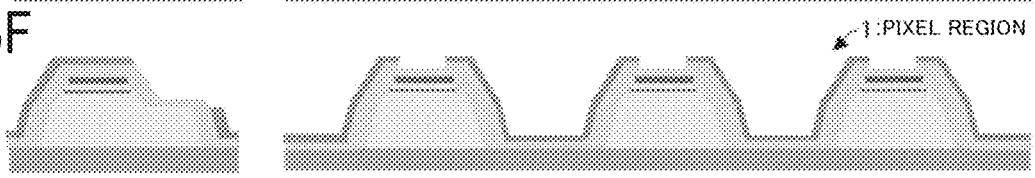

After depositing the transparent insulating film 17, the reflection material 20 is deposited on the transparent insulating film 17, as illustrated in FIG. 3E. Furthermore, as illustrated in FIG. 3F, the reflection material 20 is patterned. The patterned reflection material 20 covers a periphery of the side wall of the nitride semiconductor 14, has an opening portion above the mesa 16 in the pixel region 1, and has an opening portion above the N contact trench 15N in the N connection region 3.

Figure 3G:
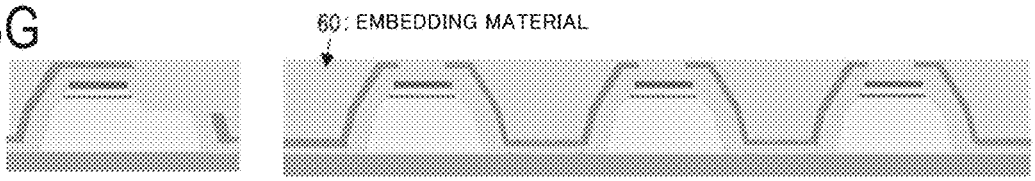

Next, as illustrated in FIG. 3G, the embedding material 60 is deposited. The upper surface of the deposited embedding material 60 is flattened by, for example, a chemical-mechanical-polishing method (CMP). The embedding material 60 is, for example, $SiO_2$, SiN, SiON, or a laminated film of these films. Various film forming techniques such as a CVD method, a sputtering method, and a coating method can be used for forming the film of the embedding material 60.

Figure 3H:
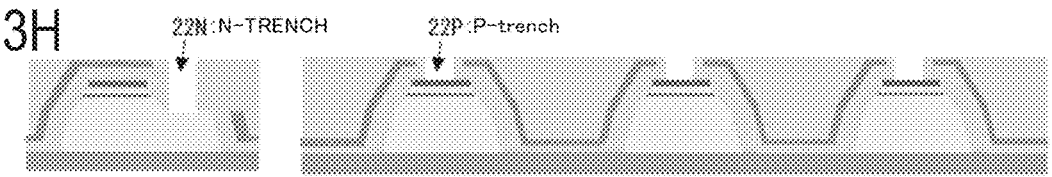

After flattening the upper surface of the embedding material 60, as illustrated in FIG. 3H, a P-trench 22P and an N-trench 22N are formed in the embedding material 60, respectively. The P-trench 22P has a hole shape and reaches the P-electrode layer 10. The N-trench 22N has a hole shape or a line shape, and reaches the N contact trench 15N.

Figure 3I:
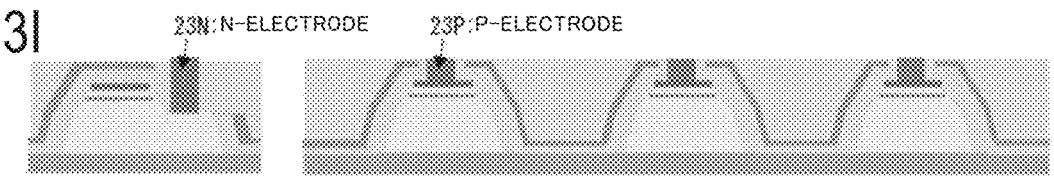

After forming the P-trench 22P and the N-trench 22N, as illustrated in FIG. 3I, the P-electrode 23P and the N-electrode 23N are formed by embedding a metal film in the P-trench 22P and the N-trench 22N. The metal film is, for example, a combination of a barrier film such as tantalum (Ta), tungsten (W), and titanium nitride (TiN) with copper. The metal film may be a combination of gold (Au) or nickel (Ni) or the like and a barrier film corresponding thereto. The P-electrode 23P and the N-electrode 23N may be formed of the same material.

The P-electrode 23P and the N-electrode 23N can be formed by, for example, a damascene method. In the damascene method, a metal thin film is deposited on a base structure having a trench, and the metal thin film is polished by a CMP method. As a result, the upper surface of the base structure and the upper surface of the metal thin film can be made flat by leaving the metal thin film in the trench.

As described above, the P-electrode 23P is disposed on the P-electrode layer 10, and the N-electrode 23N is disposed on the N contact trench 15N. The upper surface of each of the P-electrode 23P and the N-electrode 23N is flat with respect to the front surface, which serves as a bonding surface, of the driving circuit substrate 50.

Since a periphery of the micro light emitting element 100 is covered with the reflection material 20, even when the transparent insulating film is interposed between the micro light emitting elements 100, light leakage between the micro light emitting elements 100 adjacent to each other can be prevented. Therefore, even when a commonly used insulating film such as $SiO_2$ is used as the embedding material 60, it is possible to prevent a problem such as a decrease in contrast and color purity from occurring.

(Manufacturing Flow of Image Display Element 200)

Next, a manufacturing flow of the image display element 200 will be described with reference to FIGS. 4A-4I. FIGS. 4A to 4I are schematic cross-sectional views illustrating the manufacturing flow of the image display element 200. In the description of the manufacturing flow of the image display element 200, the growth substrate 9 side is referred to as an upper side, and the driving circuit substrate 50 side is referred to as a lower side.

Figure 4A:
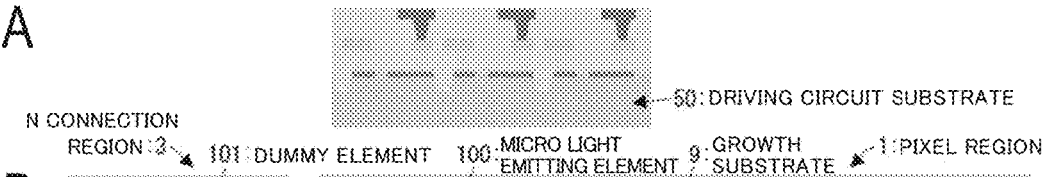
FIGS. 4A to 4I are schematic cross-sectional views illustrating manufacturing flows of the image display element according to Embodiment 1 of the present invention.

The driving circuit substrate 50 illustrated in FIG. 4A is manufactured. The driving circuit substrate 50 can be formed, for example, on a single crystal silicon substrate (wafer) by a normal complementary metal-oxide semiconductor (CMOS) process. The micro light emitting element 100 and the driving circuit substrate 50 may be in a wafer state, respectively, or the micro light emitting element 100 may be separated for each image display element 200. In addition, both the micro light emitting element 100 and the driving circuit substrate 50 may be separated for each image display element 200. In the drawings after FIG. 4B, only the P-drive electrode 51 and the N-drive electrode 52 are illustrated for the driving circuit substrate 50, and other structures are omitted.

Figure 4B:
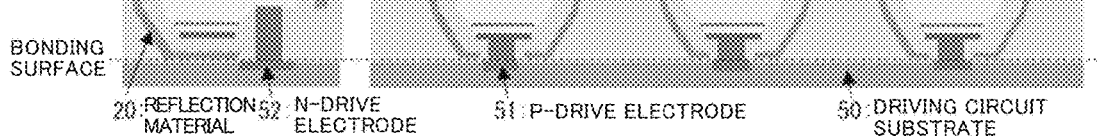

After the driving circuit substrate 50 is manufactured, as illustrated in FIG. 4B, the micro light emitting element 100 in the pixel region 1 and the dummy element 101 in the N connection region 3 are bonded to the driving circuit substrate 50. At that time, the P-electrode 23P and the N-electrode 23N are precisely aligned so as to overlap the corresponding P-drive electrode 51 and the N-drive electrode 52, respectively. In FIG. 4B, the reflection material 20 is not in direct contact with the front surface of the driving circuit substrate 50, and may be in direct contact.

Figure 4C:
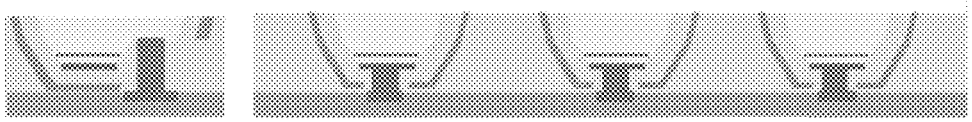

The two wafers are bonded by performing plasma cleaning of the front surface, activation by ion irradiation, heating, pressurization, and the like in accordance with the material of the bonding surface between the micro light emitting element 100 and the driving circuit substrate 50. In the subsequent flows, as illustrated in FIG. 4C, the growth substrate 9 is removed.

Figure 4D:

For removing the growth substrate 9, various methods such as grinding, polishing, plasma etching, wet etching, wet etching of the sacrificial layer, and laser lift-off can be used. At this time, processing such as removal of a portion of the N-side layer 11 may be performed. After removing the growth substrate 9, the common N-electrode 30 is deposited so as to cover the exposed portions of the N-side layer 11, the transparent insulating film 17, the reflection material 20, and the embedding material 60, as illustrated in FIG. 4D. As the common N-electrode 30, for example, an ITO film can be used. The common N-electrode 30 is preferably as thin as possible in order to reduce light absorption and avoid optical crosstalk through the common N-electrode 30, and preferably has a thickness of 10 nm to 300 nm. In this example, the upper end of the reflection material 20 is in contact with the common N-electrode 30, so that the reflection material 20 electrically conducts to the N-side layer 11. However, it is also possible to isolate the reflection material 20 form the common N-electrode 30 by covering the upper end of the reflection material 20 with an insulating film. In such case, the reflection material 20 is in electrically floating state.

Figure 4E:
Figure 4F:
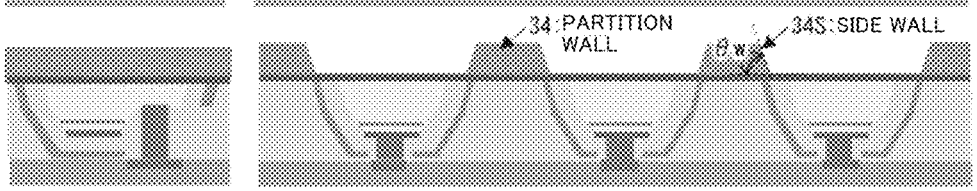

Next, as illustrated in FIG. 4E, a metal film 34L is deposited so as to cover the common N-electrode 30. As illustrated in FIG. 4F, the metal film 34L is etched to form the partition wall 34. Photolithography technique and dry etching technique can be used for the etching. In this flow, the inclination angle θw of the side wall 34S of the partition wall 34 can be set to various values by adjusting the inclination angle of the side wall of the photoresist and the anisotropy of dry etching. Except for the pixel region 1, for example, like the N connection region 3, most of the metal film 34L may be left and used as a portion of the common N-electrode 30. Also in the pixel region 1, the metal film 34L remains vertically and horizontally connected as the partition wall 34, so that the wiring resistance of the common N-electrode 30 can be reduced even when the ITO film is thinned. The partition wall 34 may be patterned by a lift-off method instead of a combination of thin film deposition and dry etching.

Figure 4G:
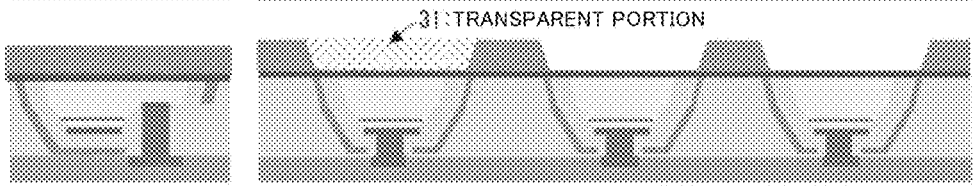
Figure 4H:
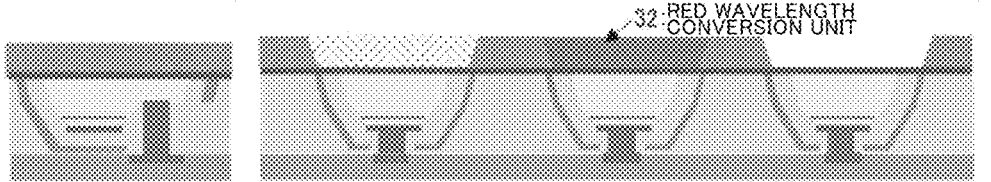
Figure 4I:
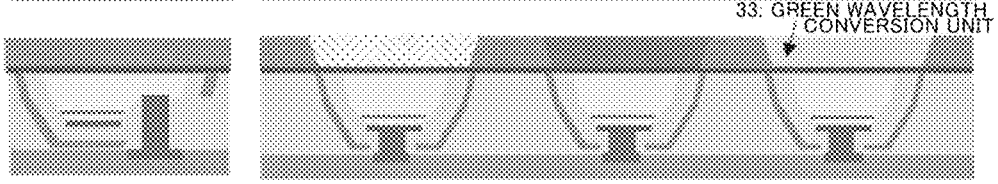

Next, as illustrated in FIGS. 4G to 4I, the transparent portion 31, the red wavelength conversion unit 32, and the green wavelength conversion unit 33 are sequentially formed above the micro light emitting element 100 separated by the partition wall 34. Each of the forming orders is not limited to the order illustrated in FIGS. 4A-4I. The transparent portion 31, the red wavelength conversion unit 32, and the green wavelength conversion unit 33 are each prepared as a positive resist or negative resist material, and the pattern may be formed by a photolithography technique, or the pattern may be formed by a printing method such as inkjet printing, screen printing, or the like. For the red wavelength conversion unit 32 and the green wavelength conversion unit 33, phosphors that absorb blue light as excitation light and down-convert to red light or the green light, nanoparticles such as quantum dots, and quantum rods, and the like can be used.

Although not illustrated, after forming the transparent portion 31, the red wavelength conversion unit 32, and the green wavelength conversion unit 33, in order to block moisture and oxygen, a silicon nitride film, a $SiO_2$ film, a silicon resin, and the like may be disposed as a passivation material.

(Light Emission Efficiency of Micro Light Emitting Element 100)

The light emission efficiency of the micro light emitting element 100 was evaluated. The evaluated micro light emitting element 100 has an arrangement pitch of 10 μm, a square shape, an inclination angle θb of 80°, an inclination angle θe of 50°, a thickness of the P-side layer 13 of 100 nm, and a thickness of the N-side layer 11 of 6 μm. In addition, the size of the upper surface of the N-side layer 11 is 8 μm×8 μm, and the depth D in a portion of the inclined surface 16S occupied by the N-side layer 11 is 1 μm.

The depth D is a depth along a vertical direction (direction from the upper surface to the lower surface of the micro light emitting element 100). The N-side layer 11 of the nitride semiconductor 14 is mainly a GaN layer, the light emission layer 12 is a multiple quantum well layer of InGaN and GaN, and the peak wavelength of light emitted from the light emission layer 12 is 450 nm.

Figure 5A:
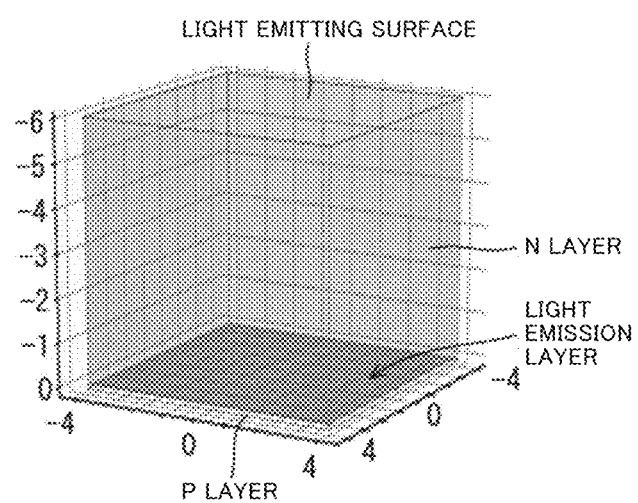
FIG. 5A is a view illustrating a shape of a micro light emitting element 100 having a rectangular parallelepiped structure.

FIG. 5A is a diagram illustrating the shape of a micro light emitting element having a rectangular parallelepiped structure, and is a comparative example. On the other hand, FIG. 5B is a view illustrating the shape of the micro light emitting element 100 having the truncated bent pyramid type structure according to Embodiment 1 of the present invention.

Figure 5B:
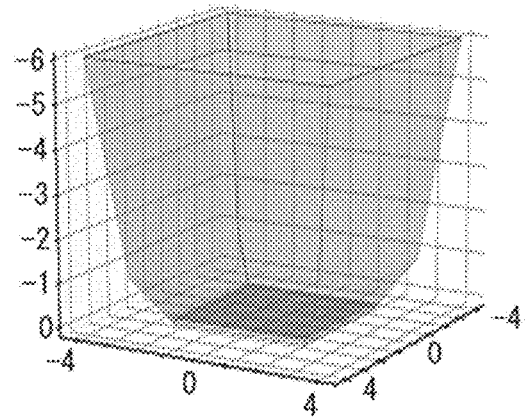
FIG. 5B is a view illustrating a micro light emitting element having a truncated bent pyramid type structure according to Embodiment 1 of the present invention.

In both the case of FIG. 5A and the case of FIG. 5B, the size of the upper surface of the N-side layer 11 is 8 μm×8 μm, and the same nitride semiconductor is used as the nitride semiconductor. The constituent material and the forming process are the same between the case of FIG. 5A and the case of FIG. 5B except for the difference in shape. However, in the case of FIG. 5A, the separation trench and the isolation trench were machined so as not to be inclined as much as possible.

In each case, a transparent resin layer was disposed on the upper surface of the N-side layer. In addition, in each case, 10,000 elements of 100 rows×100 columns were simultaneously turned on in the micro light emitting element, and the total luminous flux intensity was evaluated. The amount of current per micro light emitting element 100 is 5 μA. The measurement results are illustrated in Table 1 below. As illustrated in Table 1, the external quantum efficiency of the truncated bent pyramid type structure of FIG. 5B was approximately 3.6 times that of the simple rectangular parallelepiped structure of FIG. 5A.

Table 1 External Quantum Efficiency

TABLE 1

| | Rectangular parallelepiped structure | Truncated quadrangular pyramid type structure |
|---|---|---|
| External quantum efficiency (External quantum efficiency) | 12% | 43% |
| Area ratio of light emission layer to light emitting surface Area ratio of light emission layer to light emitting surface | 100% | 32% |
| Estimated value for internal quantum efficiency Estimated effective internal quantum efficiency | 66% | 53% |

In the truncated bent pyramid type structure illustrated in FIG. 5B, although the area of the light emission layer was reduced to approximately ⅓, such a significant improvement was obtained as compared with the rectangular parallelepiped structure illustrated in FIG. 5A. In order to clarify the reason, the light extraction efficiency was simulated using a ray trace method. The results are illustrated in Table 2 below. The estimated value for internal quantum efficiency in Table 1 is an estimated value calculated from the external quantum efficiency in Table 1 using the light extraction efficiency in Table 2. The values illustrated in Table 2 are simulation values.

Table 2 Light Extraction Efficiency

TABLE 2

| | Rectangular parallelepiped structure | Truncated quadrangular pyramid type structure |
|---|---|---|
| Light extraction efficiency | 17.9% | 80.7% |
| Side surface absorption Side surface absorption | 29.4% | 8.8% |
| Bottom surface absorption Bottom surface absorption | 29.5% | 6.0% |
| Internal absorption Internal absorption | 23.2% | 4.5% |
| Average number of reflections Average internal reflection number | 85.4 | 25.4 |

The light extraction efficiency indicates the ratio of the amount of light emitted from the upper surface of the micro light emitting element into the transparent resin layer, and the side surface absorption indicates the ratio of the amount of light absorbed by the reflection materials 20 on all the side surfaces of the micro light emitting element. The bottom surface absorption indicates the ratio of the amount of light absorbed by the P-electrode layer 10 on the lower surface of the micro light emitting element, and the internal absorption indicates the ratio of the light absorbed by the nitride semiconductor 14. The average number of reflections indicates the average value of the number of reflections inside the nitride semiconductor 14 until the light emitted from the light emission layer 12 is emitted to the outside or absorbed by the reflection material 20.

The tendency of the light extraction efficiency in Table 2 matches well the tendency of the external quantum efficiency in Table 1, and it is considered that the difference in the external quantum efficiency is the main cause of the difference in the light extraction efficiency. Only light incident on the upper surface of the micro light emitting element at an angle equal to or less than the critical total reflection angle is emitted from the upper surface of the micro light emitting element to the outside. The critical total reflection angle is approximately 37° in a case of light incident on the transparent resin layer from GaN.

In the rectangular parallelepiped structure illustrated in FIG. 5A, the angle of incidence on the upper surface of the micro light emitting element is constant regardless of the number of internal reflections. Therefore, light emitted from the light emission layer 12 in the horizontal direction is not emitted to the outside. On the other hand, in the truncated bent pyramid type structure of FIG. 5B, light emitted in the horizontal direction from the light emission layer 12 is reflected upward by the inclined surface 16S, is incident on the light emitting surface at an angle equal to or less than the critical total reflection angle, and is emitted to the outside.

Furthermore, even in a case where the light is not emitted to the outside in the initial state where the light is emitted from the light emission layer 12, each time the light emitted from the light emission layer 12 is reflected by the N-side layer side surface 11S, the incident angle of the light on the upper surface of the micro light emitting element 100 changes. Therefore, light emitted from the light emission layer 12 is emitted to the outside after repeating internal reflection. Therefore, the light extraction efficiency can be significantly improved.

(Effect of Transparent Insulating Film 17)

Figure 6A:
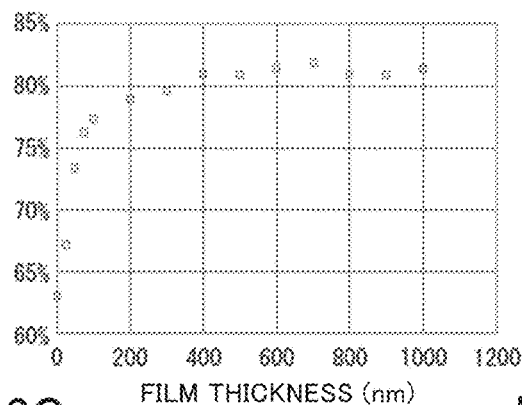
FIG. 6A is a graph illustrating a simulation result of dependency of light extraction efficiency on a film thickness of a transparent insulating film.

In order to examine the effect of the transparent insulating film 17, in the micro light emitting element 100, the dependency of the light extraction efficiency on the film thickness of the transparent insulating film 17 was simulated. FIG. 6A illustrates the result in a case where $SiO_2$ is used as the transparent insulating film 17. FIG. 6A is a graph illustrating a simulation result of the dependency of the light extraction efficiency on the film thickness of the transparent insulating film 17.

In FIG. 6A, the horizontal axis is the film thickness, and the vertical axis is the light extraction efficiency. In a case where there is no transparent insulating film 17, the light extraction efficiency is 63%. As described above, by adopting the truncated bent pyramid type structure, the light extraction efficiency is significantly higher than that of the rectangular parallelepiped structure having the transparent insulating film 17, without providing the transparent insulating film 17. This indicates that the shape of the nitride semiconductor 14 is significantly important.

In addition, the film thickness of the transparent insulating film 17 was increased, and the light extraction efficiency was increased. However, the change in a case where the film thickness of the transparent insulating film 17 was 400 nm or more was poor. Therefore, it is most preferable that the film thickness of the transparent insulating film 17 is 400 nm or more, and even when the film thickness is 75 nm or more, the rate of decrease in light extraction efficiency is within 5%, so that the film thickness may be at least 75 nm or more.

It is considered that the transparent insulating film 17 improves the light extraction efficiency by improving the reflectance on the side surface of the micro light emitting element 100. In the rectangular parallelepiped structure, the effect of the transparent insulating film 17 is significantly weak. It is considered that this is because even when the reflectance on the side surface of the micro light emitting element of the rectangular parallelepiped structure is improved, the angle of incidence on the upper surface of the micro light emitting element does not change, the light totally reflected on the upper surface of the micro light emitting element is totally reflected no matter how many times reflection is repeated, and the light extraction efficiency is not improved. Therefore, the inclined surface 16S and the inclined N-side layer side surface 11S that can change the incident angle on the upper surface of the micro light emitting element 100 are important.

(Effect of Dimensions and Angles of Each Part)

The results of examining the change in light extraction efficiency with respect to the dimensions and angles of each part of the micro light emitting element 100 using the simulation are illustrated in FIGS. 6B to 6F. FIGS. 6B to 6F are graphs illustrating simulation results of dependency of the light extraction efficiency on the dimensions and angles of each part in the image display element 200 illustrated in FIG. 1. FIGS. 6B to 6F also illustrate the ratio (area ratio) of the area of the light emission layer 12 to the area of the light emitting surface (upper surface of the N-side layer 11). The vertical axes in FIGS. 6B to 6F indicate the light extraction efficiency or the area ratio.

In each of the cases in FIGS. 6B to 6F, unless otherwise specified, the size of the upper surface of the N-side layer 11 is 8 µm×8 µm, the thickness of the N-side layer 11 is 6 µm, and the thickness of the P-side layer 13 is 0.1 µm. In addition, the inclination angle θe of the inclined surface 16S is 50°, the depth D in the portion occupied by the N-side layer 11 in the inclined surface 16S is 1 µm, and the inclination angle θb of the N-side layer side surface 11S is 80°.

Figure 6B:
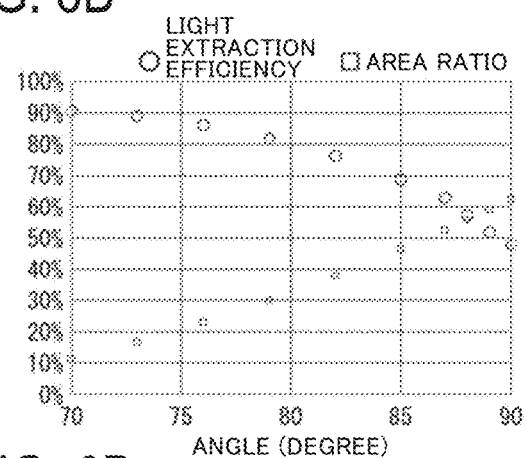
FIGS. 6B to 6F are graphs illustrating simulation results of dependency of the light extraction efficiency on dimensions and angles of each part in the image display element illustrated in FIG. 1.

FIG. 6B illustrates the dependency of the light extraction efficiency on the inclination angle θb in the N-side layer side surface 11S. The horizontal axis in FIG. 6B is the inclination angle θb. As illustrated in FIG. 6B, the light extraction efficiency is improved, as the inclination angle θb of the N-side layer side surface 11S is decreased. It is preferable that the inclination angle θb of the N-side layer side surface 11S is 83° or less.

Figure 6C:
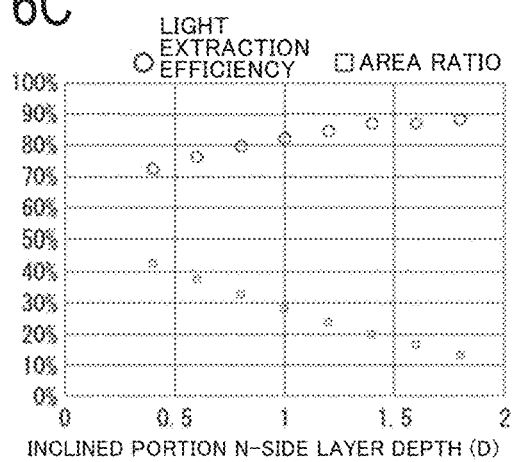

FIG. 6C illustrates the dependency of the light extraction efficiency on the depth D in the portion occupied by the N-side layer 11 in the inclined surface 16S. The horizontal axis in FIG. 6C is the depth D. As illustrated in FIG. 6C, the light extraction efficiency is improved as the depth D is increased. The depth D is preferably 0.6 µm or more.

Figure 6D:
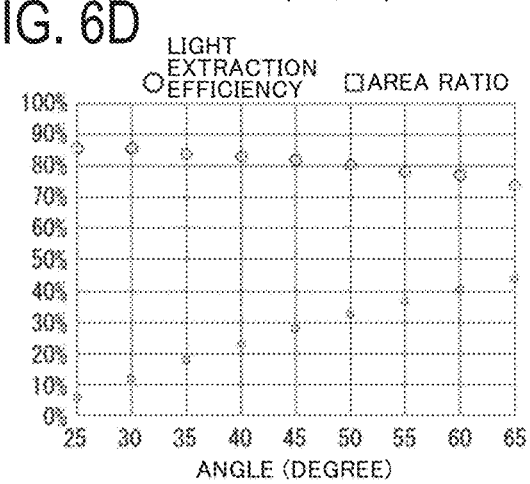

FIG. 6D illustrates the dependency of the light extraction efficiency on the inclination angle θe of the inclined surface 16S. The horizontal axis in FIG. 6D is the inclination angle θe. In order to improve the light extraction efficiency, the inclination angle θe is preferably 60° or less, and more preferably 50° or less.

Figure 6E:
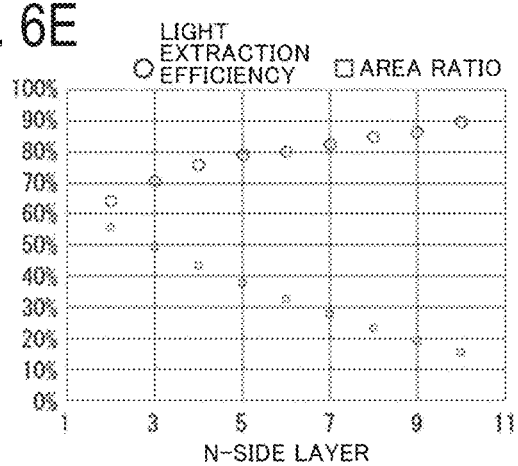

FIG. 6E illustrates the dependency of the light extraction efficiency on the thickness of the N-side layer 11. The thickness is a thickness along the vertical direction (direction from the upper surface to the lower surface of the micro light emitting element 100). The horizontal axis in FIG. 6E is the thickness of the N-side layer 11. The light extraction efficiency is improved, as the thickness of the N-side layer 11 is increased. The thickness of the N-side layer 11 is preferably 3 µm or more.

Figure 6F:
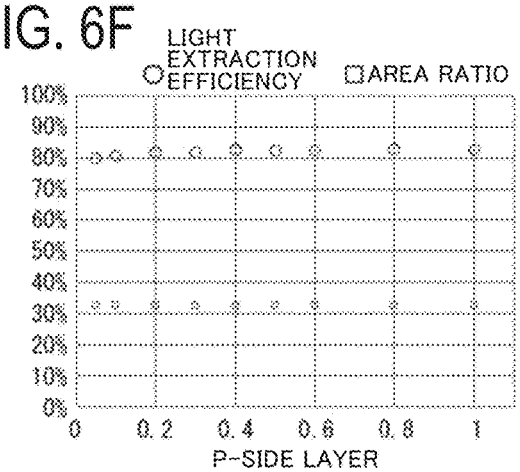

FIG. 6F illustrates the dependency of the light extraction efficiency on the thickness of the P-side layer 13. The horizontal axis in FIG. 6F is the thickness of the P-side layer 13. As the thickness of the P-side layer 13 is increased, the light extraction efficiency is improved, and the effect is smaller than the other parameters illustrated in FIGS. 6B to 6E.

From these drawings, the micro light emitting element 100 can achieve a light extraction efficiency of at least 48% or more. This indicates a significantly large improvement of approximately 2.7 times the light extraction efficiency of the rectangular parallelepiped structure illustrated in Table 2. Furthermore, in the micro light emitting element 100, light extraction efficiency of 70% or more can be achieved by appropriately selecting the dimensions and angles of each part.

In the micro light emitting element 100, the entire periphery of the side surface of the light emission layer 12 is configured to include a portion of the inclined surface 16S, and the N-side layer side surface 11S from the inclined surface 16S to the upper surface of the N-side layer 11 is inclined at an angle larger than that of the inclined surface 16S. In addition, in the micro light emitting element 100, the inclined surface 16S and the N-side layer side surface 11S are covered with the reflection material 20.

As a result, the optical crosstalk between the micro light emitting elements 100 can be prevented, and the light extraction efficiency can be significantly improved. Furthermore, the light extraction efficiency can be further improved by disposing the transparent insulating film 17 between the inclined surface 16S, the N-side layer side surface 11S, and the reflection material 20.

(Conversion Efficiency of Wavelength Conversion Unit)

The partition wall 34 was formed on the micro light emitting element 100, the transparent portion 31 and the red wavelength conversion unit 32 were formed, and the external quantum efficiency was evaluated. The height of the partition wall 34 is 5.5 µm, and the thickness of the transparent portion 31 and the red wavelength conversion unit 32 is 5.0 µm. In a case where the material of the partition wall 34 was aluminum, the case where the inclination angle of the side wall 34S was substantially 90° and the case where the inclination angle was 80° were compared. In the case where the inclination angle of the side wall 34S was 80°, a case where the partition wall 34 was formed of a resin material (CF: color filter) was also compared.

As illustrated in Table 3, in the case where the partition wall 34 is formed of a resin material (CF: color filter), the partition wall 34 absorbs both the blue light and the red light, so that the reflectance at the partition wall 34 is low, and the light output is significantly lower than a case where the partition wall 34 is formed of aluminum. As illustrated in Table 3, in the case where the partition wall 34 was formed of aluminum, the external quantum efficiency of the blue light was approximately 25% higher at 80° than at 90°.

As illustrated in Table 4, in the case of the red light, the external quantum efficiency was obtained approximately 30% higher in a case where the partition wall 34 of aluminum was set to 80° than the case of 90°. Similar results were obtained with the green light, and the table was omitted. The inclination angle θe of the inclined surface 16S is 50°, the depth D of the portion occupied by the N-side layer 11 in the inclined surface 16S is 1 µm, the thickness of the N-side layer 11 is 6 µm, and the inclination angle θb of the N-side layer side surface 11S is 80°.

Table 3 Blue Light External Quantum Efficiency

TABLE 3

|  | Partition wall side wall inclination angle | | |
| --- | --- | --- | --- |
|  | Al-80° | Al-90° | CF-80° |
| External quantum efficiency (External quantum efficiency) | 34.8% | 27.9% | 20.0% |

Table 4 Red Light External Quantum Efficiency

TABLE 4

|  | Partition wall side wall inclination angle | | |
|---|---|---|---|
|  | Al-80° | Al-90° | CF-80° |
| External quantum efficiency (External quantum efficiency) | 13.8% | 10.6% | 6.8% |

(Effect of Material and Inclination Angle of Side Wall 34S)

The above results illustrate that the material and the inclination angle of the side wall 34S have a significantly large effect on the transparent portion 31 and the red wavelength conversion unit 32. In order to examine the possibility of further improvement, the light extraction efficiency was simulated using the above-described ray tracing method. In this simulation, the material of the side wall 34S was aluminum.

Figure 7:
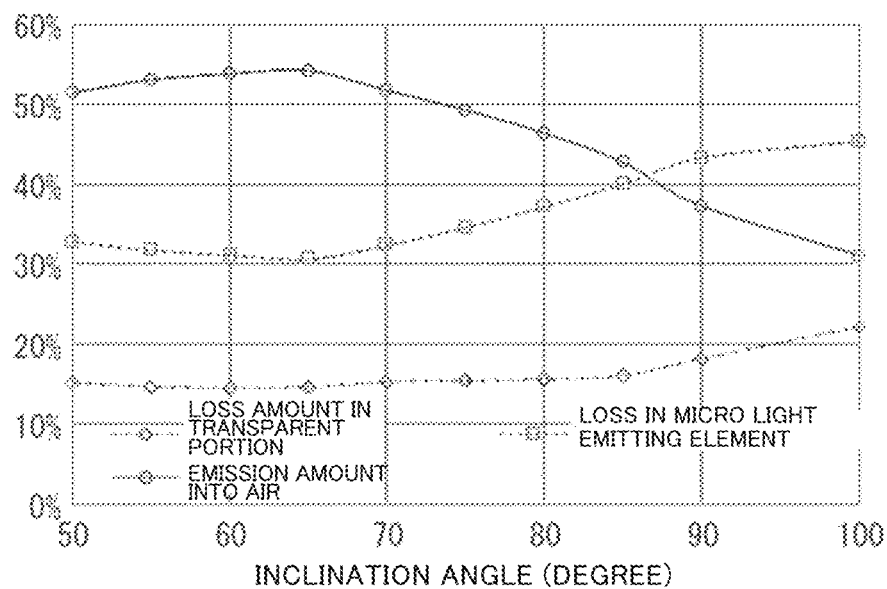
FIG. 7 is a simulation result illustrating dependency of light extraction efficiency of blue light on a partition wall inclination angle in a blue sub pixel 6 of the image display element according to Embodiment 1 of the present invention.

FIG. 7 illustrates the result of simulating the extraction efficiency of the blue light from the transparent portion 31 by changing the inclination angle of the side wall 34S. The results illustrated in FIGS. 6A-6F are a blue light extraction efficiency from the micro light emitting element 100 into the uniform resin, and FIG. 7 illustrates a blue light extraction efficiency in which the light generated by the micro light emitting element 100 is emitted into the air through the transparent portion 31.

In the simulation results illustrated in FIG. 7, it was observed that the emission amount of blue light increased as the inclination angle of the side wall 34S was reduced from 90°, and tended to be maximum near 65°. In addition, it was found that in a case where the inclination angle was large, the loss amount in the micro light emitting element 100 was large.

Table 5 summarizes the results obtained by summarizing how the blue light generated by the micro light emitting element 100B is emitted into the air. Regarding the light generated by the micro light emitting element 100B, "LED1" in Table 5 indicates an amount (E) incident on the transparent portion 31 and an amount (L) absorbed in the micro light emitting element 100B. Regardless of the inclination angle of the side wall 34S, approximately 80% of the light is incident on the transparent portion 31, and approximately 20% is absorbed in the micro light emitting element 100B.

Table 5 Simulation Results of Blue Light Emission Amount and Loss Amount into the Air

TABLE 5

|  |  | Side wall inclination angle | | | |
|---|---|---|---|---|---|
|  |  | 70° | 80° | 90° | 80°* |
| LED1 | L: Loss amount in micro light emitting element | 20.5% | 20.8% | 20.8% | 21.6% |
|  | E: Amount incident on transparent portion | 79.5% | 79.2% | 79.2% | 78.4% |
| TR1 | L: Loss amount in transparent portion | 11.7% | 10.8% | 10.9% | 47.3% |
|  | R: Amount returned to micro light emitting element | 25.3% | 33.1% | 40.5% | 5.4% |
|  | E: Emission amount into air | 42.4% | 35.2% | 27.7% | 25.6% |
| LED2 | L: Loss amount in micro light emitting element | 9.0% | 11.3% | 13.2% | 2.3% |
|  | E: Amount incident on transparent portion | 16.3% | 21.8% | 27.3% | 3.1% |
| TR2 | L: Loss amount in transparent portion | 2.8% | 3.3% | 4.3% | 1.8% |
|  | R: Amount returned to micro light emitting element | 6.1% | 10.4% | 17.0% | 0.7% |
|  | E: Emission amount into air | 7.3% | 7.9% | 5.9% | 0.6% |
| LED3 | L: Loss amount in micro light emitting element | 2.2% | 3.6% | 5.5% | 0.3% |
|  | E: Amount incident on transparent portion | 3.8% | 6.7% | 11.3% | 0.4% |
| TR3 | L: Loss amount in transparent portion | 0.6% | 1.0% | 1.8% | 0.2% |
|  | R: Amount returned to micro light emitting element | 1.5% | 3.2% | 7.2% | 0.1% |
|  | E: Emission amount into air | 1.6% | 2.4% | 2.3% | 0.1% |
| Total | Loss amount in transparent portion | 15.3% | 15.6% | 18.2% | 49.4% |
|  | Loss amount in micro light emitting element | 32.4% | 37.2% | 43.3% | 24.3% |
|  | Emission amount into air | 51.8% | 46.4% | 37.3% | 26.7% |

*In a case where side wall is made of light absorbing resin, the other is aluminum Regarding the blue light (LED1-E) incident on the transparent portion 31, "TR1" in Table 5 indicates separately the amount (L) lost in the transparent portion 31, the amount (R) returned to the micro light emitting element 100B, and the amount (E) emitted into the air. The result of TR1-E indicates that the smaller the inclination angle of the side wall 34S, the higher the light extraction efficiency from the transparent portion 31.

Regarding the blue light (TR1-R) returned to the micro light emitting element 100B, "LED2" in Table 5 indicates the amount (E) incident on the transparent portion 31 and the amount (L) absorbed in the micro light emitting element 100B. Approximately ⅓ of the TR1-R was absorbed in the micro light emitting element 100B, and approximately ⅔ returned to the transparent portion 31. As described above, the blue light is emitted into the air while reciprocating between the micro light emitting element 100B and the transparent portion 31 many times. The number of round trips may be more than 10 times, and Table 5 illustrates up to third times.

Table 5 illustrates that the efficiency of emitting the blue light into the air can be increased by reducing the inclination angle of the side wall 34S. Furthermore, the amount of blue light returning from the transparent portion 31 to the micro light emitting element 100B is large, and the larger the inclination angle of the side wall 34S, the larger the amount thereof. Therefore, in order to improve the blue light extraction efficiency from the transparent portion 31, the blue light returning from the transparent portion 31 to the micro light emitting element 100B may be efficiently returned to the transparent portion 31 again.

In a case where the transparent portion 31 is not provided above the micro light emitting element 100B that emits the blue light and there is a space surrounded by the partition wall 34, the emission amount of blue light is reduced by approximately 15%. Without the transparent portion 31, light is emitted directly from the nitride semiconductor 14 into the air, and this is because total reflection in the nitride semiconductor 14 occurs for a wider incident angle. Since the refractive index of the transparent portion 31 is larger than that of air and the range of the incident angle at which total reflection occurs is narrow, the amount of light incident on the transparent portion 31 is significantly increased as compared with the case of air. Even when the light incident on the transparent portion 31 is totally reflected at the interface between the transparent portion 31 and the air, the light changes the angle of incidence on the interface between the transparent portion 31 and air through reflection in the transparent portion 31 and reflection in the nitride semiconductor 14, and is emitted to the outside. Therefore, in order to increase the efficiency of emitting the blue light to the outside, it is preferable that the transparent portion 31 is provided instead of air.

The light emission from the red wavelength conversion unit 32 was simulated separately for the absorption efficiency at which the blue light, which was the excitation light, was absorbed by the red wavelength conversion unit 32, and the efficiency at which the red light generated by the red wavelength conversion unit 32 was emitted into the air.

Figure 8:
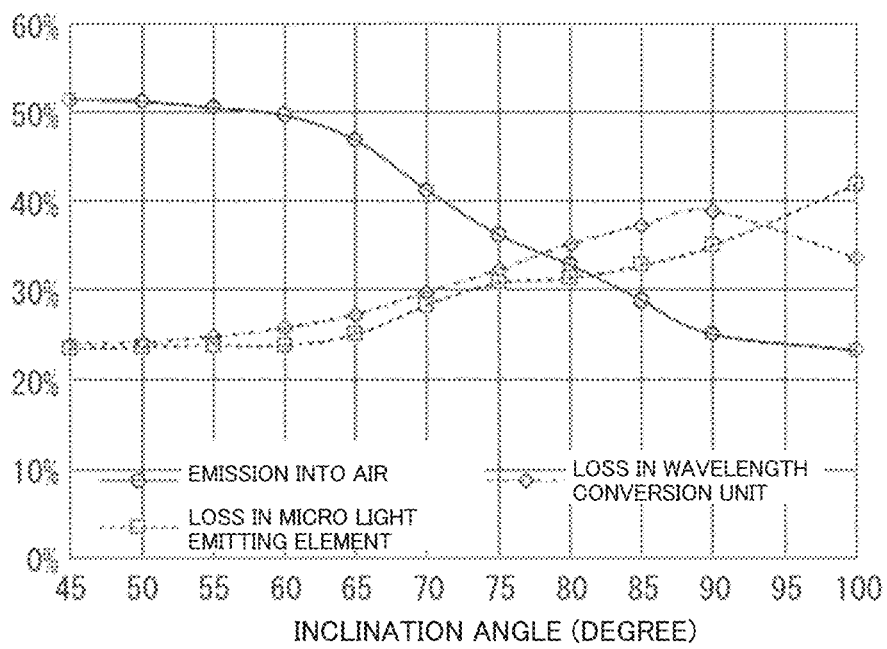
FIG. 8 is a simulation result illustrating dependency of light extraction efficiency of red light on a partition wall inclination angle in a red sub pixel 7 of the image display element according to Embodiment 1 of the present invention.

FIG. 8 illustrates the red light extraction efficiency at which the red light generated by the red wavelength conversion unit 32 is emitted into the air. Table 6 summarizes the results obtained by summarizing how the red light generated by the red wavelength conversion unit 32 is emitted into the air.

Table 6 Simulation Results of Red Light Emission Amount and Loss Amount into Air

TABLE 6

| | | Side wall inclination angle | | | |
|---|---|---|---|---|---|
| | | 70° | 80° | 90° | 80°* |
| LED1 | L: Loss amount | 20.1% | 19.8% | 19.8% | 26.8% |
| | E: Amount absorbed by wavelength conversion unit | 79.9% | 80.2% | 80.2% | 73.2% |
| WLC1 | L: Loss amount in wavelength conversion unit | 19.6% | 24.3% | 25.7% | 54.9% |
| | R: Amount returned to micro light emitting element | 60.9% | 63.5% | 65.1% | 35.7% |
| | E: Emission amount into air | 19.4% | 12.2% | 9.2% | 9.3% |
| LED2 | L: Loss amount in micro light emitting element | 22.6% | 23.3% | 23.3% | 12.9% |
| | E: Amount incident on wavelength conversion unit | 38.3% | 40.2% | 41.8% | 22.8% |
| WLC2 | L: Loss amount in wavelength conversion unit | 8.2% | 8.3% | 8.8% | 13.7% |
| | R: Amount returned to micro light emitting element | 12.0% | 16.0% | 21.2% | 2.0% |
| | E: Emission amount into air | 18.0% | 15.8% | 11.7% | 7.2% |
| LED3 | L: Loss amount in micro light emitting element | 4.7% | 6.1% | 7.6% | 0.8% |
| | E: Amount incident on wavelength conversion unit | 7.3% | 9.8% | 13.5% | 1.1% |
| WLC3 | L: Loss amount in wavelength conversion unit | 1.6% | 1.9% | 2.9% | 0.6% |
| | R: Amount returned to micro light emitting element | 2.5% | 4.1% | 7.7% | 0.2% |
| | E: Emission amount into air | 3.1% | 3.7% | 2.8% | 0.3% |
| LED4 | L: Loss amount in micro light emitting element | 1.0% | 1.5% | 2.7% | 0.1% |
| | E: Amount incident on wavelength conversion unit | 1.5% | 2.5% | 4.8% | 0.1% |
| WLC4 | L: Loss amount in wavelength conversion unit | 0.3% | 0.5% | 1.0% | 0.1% |
| | R: Amount returned to micro light emitting element | 0.5% | 1.1% | 2.8% | 0.0% |
| | E: Emission amount into air | 0.6% | 0.9% | 1.0% | 0.0% |
| Total | Emission amount into air | 41.3% | 32.8% | 25.2% | 16.8% |
| | Loss amount in wavelength conversion unit | 29.8% | 35.2% | 38.9% | 69.2% |
| | Loss amount in micro light emitting element | 28.4% | 31.4% | 35.1% | 13.9% |

*In a case where side wall is made of light absorbing resin, the other is aluminum LED1-E in Table 6 indicates a ratio of absorption by the red wavelength conversion unit 32 among the blue light generated by the micro light emitting element 100R. Regardless of the inclination angle of the side wall 34S, approximately 80% of the light was absorbed by the red wavelength conversion unit 32. The remaining 20% was absorbed in the micro light emitting element 100R and the side wall 34S.

Regarding the red light generated by the red wavelength conversion unit 32, WLC1 in Table 6 indicates separately the amount (L) lost in the red wavelength conversion unit 32, the amount (R) returned to the micro light emitting element, and the amount (E) emitted into the air. Approximately 60% of the light is incident on the micro light emitting element 100R. In addition, the loss in the red wavelength conversion unit 32 is large.

Regarding the red light (WLC1-R) incident on the micro light emitting element 100R, LED2 in Table 6 indicates the amount (E) incident on the red wavelength conversion unit 32 and the amount (L) absorbed in the micro light emitting element 100R. Approximately a little more than ⅓ of the WLC1-R is absorbed in the micro light emitting element 100R, and approximately a little less than ⅔ is returned to the red wavelength conversion unit 32. In this manner, the red light is emitted into the air while reciprocating between the micro light emitting element 100R and the red wavelength conversion unit 32 many times. The number of round trips can be more than 10 times, and Table 6 illustrates up to four times.

Table 6 illustrates that the efficiency of emitting the red light into the air can be increased by reducing the inclination angle of the side wall 34S. Furthermore, the amount of red light incident on the micro light emitting element 100R from the red wavelength conversion unit 32 is large, and the larger the inclination angle of the side wall 34S, the larger the amount thereof. Therefore, in order to improve the red light extraction efficiency from the red wavelength conversion unit 32, the red light incident on the micro light emitting element 100R from the red wavelength conversion unit 32 may be efficiently returned to the red wavelength conversion unit 32 again.

Tables 5 and 6 illustrate simulation results in a case where the partition walls 34 were formed of a light absorbing resin. In any case of blue light and red light, the loss in the transparent portion 31 and the red wavelength conversion unit 32 increases, and the amount of light emitted into the air is significantly reduced. In the case of red light, the effect is particularly large, and the amount of light emitted into the air is reduced by approximately half. These trends are consistent with the results illustrated in Tables 3 and 4. Therefore, arranging a material that transmits and absorbs light at the interface between the transparent portion 31 and the wavelength conversion units 32 and 33 is not preferable because the light extraction efficiency is reduced.

(Combination of Inclination Angles θw and θb)

As described above, the smaller the inclination angle θw of the side wall 34S of the partition wall 34, the inclination angle θb of the N-side layer side surface 11S, and the inclination angle θe of the light emission layer inclined surface 16S, the higher the light extraction efficiency. However, in a case where the size of the pixel 5 is specified, it is necessary to find an optimal combination. In particular, since the height of the partition wall 34 and the thickness of the N-side layer 11 are larger than the height of the light emission layer inclined surface 16S, when both the inclination angles θw and θb are reduced, the area of the light emission layer 12 may be significantly reduced, and the internal quantum efficiency may be reduced. In this case, there are a problem that which one of the inclination angles θw and θb is reduced to increase the overall efficiency.

Therefore, a simulation of light extraction efficiency was performed for combinations of the inclination angles θw and θb illustrated in Table 7. Since the thicknesses of the wavelength conversion units 32 and 33 and the thickness of the N-side layer side surface 11S are approximately on the same scale, the combinations in Table 7 are intended to keep the area of the light emission layer 12 constant.

Table 7 Simulation Results of Light Extraction Efficiency for Each Combination of Inclination Angles θw and θb

TABLE 7

|  | θw | | |
| --- | --- | --- | --- |
|  | 70° | 75° | 80° |
| θb | | | |
|  | 80° | 75° | 70° |
| Amount absorbed by wavelength conversion unit | 79.9% | 82.6% | 84.1% |
| Emission amount into air | 41.3% | 37.8% | 35.7% |
| Total efficiency | 33.0% | 31.2% | 30.0% |

When the inclination angle θb is reduced, the amount of blue light absorbed by the wavelength conversion units 32 and 33 increases, and since θw is reduced, the amount of red light emitted from the wavelength conversion units 32 and 33 into the air is reduced. Overall, the efficiency is higher when the inclination angle θw is smaller than θb. As seen from this example, even when the inclination angle θb is smaller than 80°, the amount of blue light absorbed by the wavelength conversion units 32 and 33 does not significantly increase. On the other hand, when the inclination angle θw is reduced, the amount of long wavelength light emitted from the wavelength conversion units 32 and 33 increases significantly. Therefore, in general, by setting θw≤θb, the light extraction efficiency is improved.

As described above, the transparent portion 31 and the wavelength conversion units 32 and 33 disposed on the micro light emitting element 100 having improved light extraction efficiency are surrounded by the partition wall 34 having the side wall 34S formed of a highly reflective metal. Therefore, the light extraction efficiency can be significantly improved. In particular, the side wall 34S is preferably inclined so as to open in the light emitting direction, and the inclination angle is preferably approximately 85° to 45°. Furthermore, in a plan view, the opening portion 37 of the partition wall 34 is disposed inside the upper end portion of the reflection material 20, so that light leakage from the transparent portion 31 and the wavelength conversion units 32 and 33 can be prevented, and the optical crosstalk can be suppressed. However, the opening portion 37 preferably covers the nitride semiconductor 14 of the micro light emitting element 100 in a plan view. This is because when the nitride semiconductor 14 and the partition wall 34 of the micro light emitting element 100 overlap each other, light incidence from the micro light emitting element 100 to the transparent portion 31 and the wavelength conversion units 32 and 33 is prevented, and the light extraction efficiency is reduced.

Modification Example

FIGS. 9A-9F illustrate a modification example of Embodiment 1. The difference from Embodiment 1 lies in the micro light emitting element. Even when the micro light emitting element 100 illustrated in FIG. 1 is replaced with several different micro light emitting elements as illustrated in FIGS. 9A-9F, the same effect as in Embodiment 1 can be obtained.

A micro light emitting element 100a1 illustrated in FIG. 9A has a configuration in which the inclination angle θe of the inclined surface 16S of Embodiment 1 is the same as the inclination angle 19b of the N-side layer side surface 11S. The micro light emitting element 100a1 has a simple truncated quadrangular pyramid shape. The inclination angle θe and the inclination angle θb may be substantially the same as each other.

In a micro light emitting element 100a2 illustrated in FIG. 9B, the thickness of the transparent insulating film 17 on the light emission layer inclined surface 16S and the N-side layer side surface 11S are different from each other. The inclination angle θe and the inclination angle θb may be the same or different.

Micro light emitting elements 100a3 to 100a5 illustrated in FIGS. 9C to 9E include therein reflection films 9a, 9b, and 9C (reflection layers) that reflect the long wavelength light whose wavelength is converted. The reflection films 9a and 9b are disposed on the light emission side of the light emission layer 12, and the blue light as the excitation light transmits the reflection films 9a and 9b. The reflection film 9C is disposed on the driving circuit substrate 50 side of the light emission layer 12, and also reflects the blue light as the excitation light. Each of the reflection films 9a, 9b, and 9C is divided for each micro light emitting element, and is disposed inside the reflection material 20. In a micro light emitting element 100a6 illustrated in FIG. 9F, a reflection film 9d (reflection layer) is disposed above the common N-electrode. The reflection film 9d is disposed on the light emission side of the light emission layer 12, and the blue light as the excitation light transmits the reflection film 9d.

In each of the above configurations, the same effect as in Embodiment 1 can be obtained. Furthermore, since the micro light emitting elements 100a3 to 100a6 reflect long wavelength light incident on the micro light emitting elements from the wavelength conversion units 32 and 33, the loss in the micro light emitting elements is reduced, and the light extraction efficiency can be further improved.

Embodiment 2

(Configuration of Image Display Element 200b)

Another embodiment of the present invention will be described below with reference to FIG. 10 and FIGS. 11A-11E. For convenience of description, members having the same functions as the members described in the above embodiment are denoted by the same reference numerals, and description thereof will not be repeated. The same applies to Embodiment 3 and subsequent embodiments.

In an image display element 200b of Embodiment 2, the configuration of a partition wall 34b is different from that of the image display element 200 of Embodiment 1. In the present embodiment, it is intended to realize an image display element having a finer micro light emitting element than in Embodiment 1.

Figure 10:
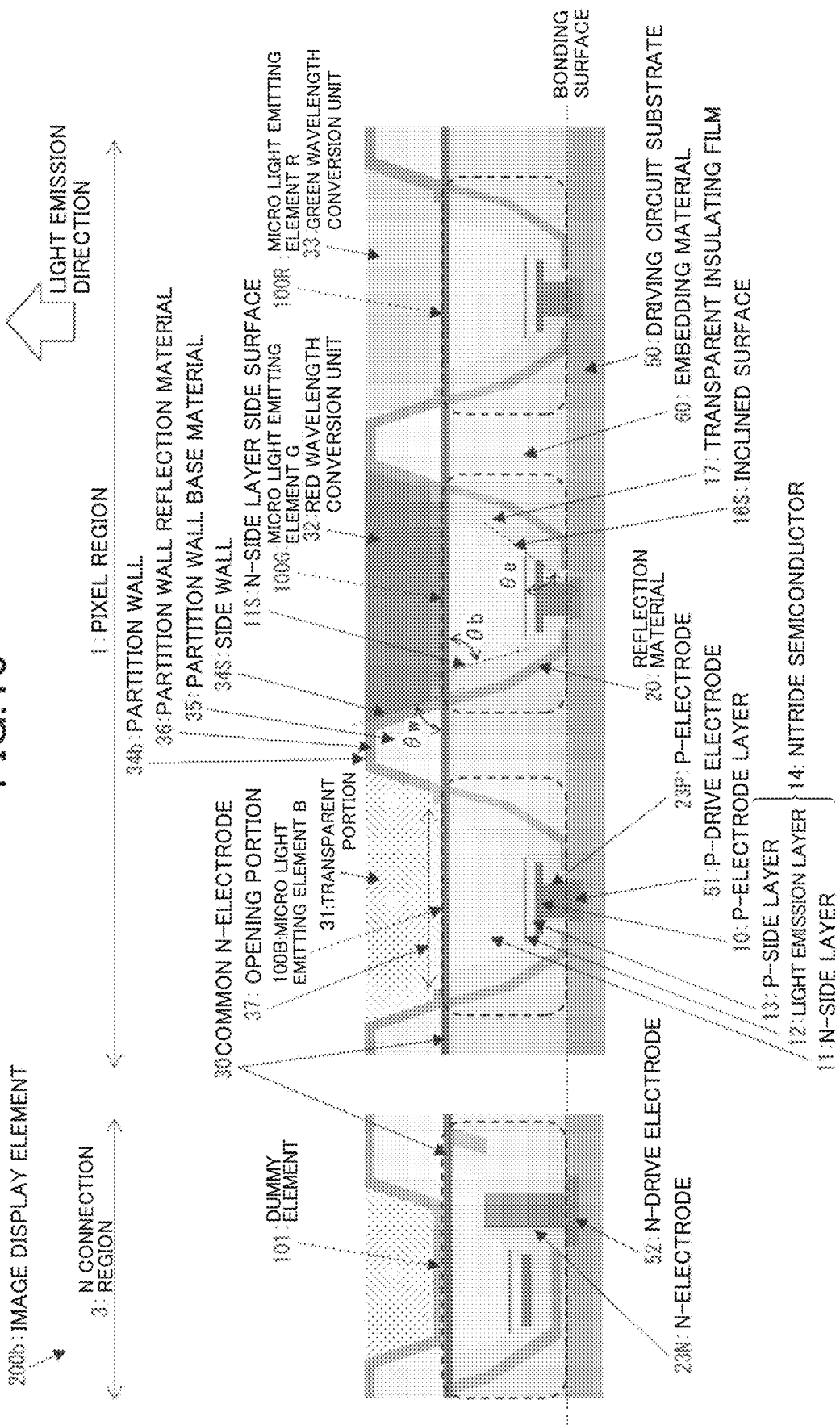
FIG. 10 is a schematic cross-sectional view of an image display element according to Embodiment 2 of the present invention.

As illustrated in FIG. 10, the partition wall 34b of the present embodiment has a configuration including a partition wall base material 35 and a partition wall reflection material 36. The front surface of the partition wall reflection material 36 on the side surface of the partition wall 34b is a reflection surface, and is the side wall 34S. In a case where the thickness of the partition wall reflection material 36 is substantially constant, the inclination angle θw of the reflection surface is approximately equal to the inclination angle of the side surface of the partition wall base material 35. The partition wall base material 35 can be formed of an inorganic material such as $SiO_2$ or SiN, or a resin material such as a photoresist material. The partition wall reflection material 36 can be formed of, for example, a highly reflective metal film.

The point that the side wall 34S of the partition wall 34 is covered with a highly reflective metal material, the point that the opening portion 37 of the partition wall reflection material 36 is disposed inside the upper end portion of the reflection material 20, and the point that the opening portion 37 covers the light emitting surface of the nitride semiconductor 14 are the same as in Embodiment 1. Therefore, the image display element 200b can exhibit the same effect as the image display element 200 of Embodiment 1.

When a metal film is deposited as in the embodiment 1 and is processed into a partition wall 34 having an inclined surface by a photolithography method and a dry etching technique, it is necessary to deposit the metal film larger than the height of the partition wall 34. Since the height of the partition walls may be several μm, although a significantly thick metal film is required, the front surface of such a thick metal film has large irregularities, and it is difficult to perform precise alignment with an underlayer. In addition, since it is desirable to dispose the opening portion 37 at the bottom portion of the side wall 34S inside the upper end portion of the reflection material 20, as the pixel size of the image display element 200e is small, the partition wall 34 is required to be more precisely aligned with the reflection material 20. Therefore, it is the aim of the present embodiment to avoid the above problem by forming a central portion of the partition wall (partition wall base material 35) with a transparent material that is easy to perform precise alignment, and has little surface irregularities, and covering the front surface with the partition wall reflection material 36.

(Manufacturing Flow of Image Display Element 200b)

Figure 11A:
FIGS. 11A to 11E are schematic cross-sectional views illustrating manufacturing flows of the image display element according to Embodiment 2 of the present invention.
Figure 11B:
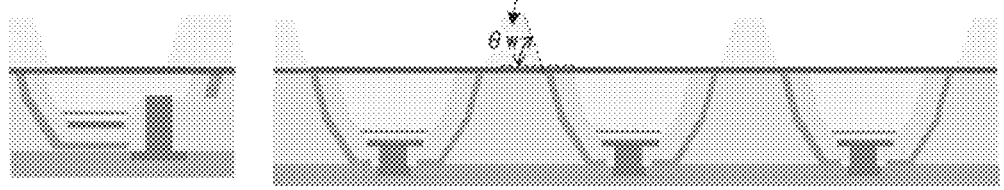

A manufacturing flow of the image display element 200b will be described below with reference to FIGS. 11A-11E. FIG. 11A is the same as FIG. 4D, and a flow of forming the micro light emitting element 100B until the state of FIG. 11A is the same as that of the image display element 200 of Embodiment 1. Next, as illustrated in FIG. 11B, the partition wall base material 35 is formed. It is preferable that the bottom portion of the partition wall base material 35 does not overlap the upper end portion of the reflection material 20 in a plan view. The partition wall base material 35 may be formed of, for example, a negative resist. Alternatively, the partition wall base material 35 may be formed by depositing a thin film of $SiO_2$ or the like and processing the deposited thin film by photolithography technique and dry etching technique. The partition wall base material 35 is preferably transparent to visible light, and the side wall thereof is preferably set to a predetermined inclination angle θw.

Figure 11C:
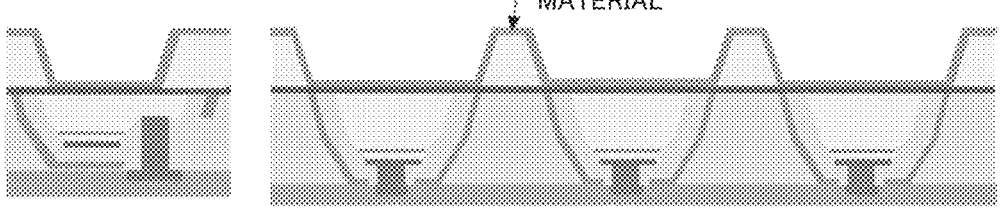

Next, as illustrated in FIG. 11C, the partition wall reflection material 36 is deposited. Similarly to the reflection material 20, the partition wall reflection material 36 is preferably a metal thin film having high reflectivity to visible light or a material having the same characteristics.

Figure 11D:
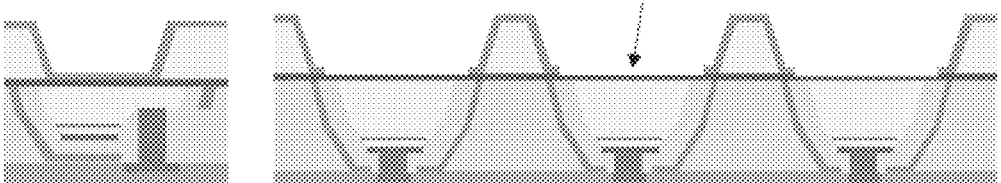
Figure 11E:
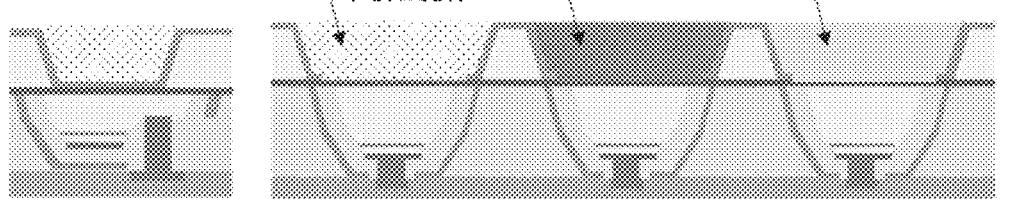

Next, as illustrated in FIG. 11D, the opening portion 37 is provided in a portion overlapping the light emitting surface of the micro light emitting element 100 in a plan view. The opening portion 37 can be formed by, for example, a photolithography technique and a wet or dry etching technique. The opening portion 37 is preferably located inside the micro light emitting element 100 from the upper end portion of the reflection material 20 in a plan view. In addition, in order to facilitate the reciprocation of light between the micro light emitting element 100, the transparent portion 31 and the wavelength conversion units 32 and 33, the opening portion 37 preferably covers the light emitting surface of the micro light emitting element 100 as widely as possible. In particular, it is preferable to overlap the entire light emitting surface of the nitride semiconductor 14. Thereafter, as illustrated in FIG. 11E, the transparent portion 31, the red wavelength conversion unit 32, and the green wavelength conversion unit 33 are sequentially formed on the micro light emitting element 100.

As described above, according to the image display element 200b, the same effects as in Embodiment 1 can be realized. Furthermore, the image display element 200b has an additional advantage that the pixel 5 is easily miniaturized.

Embodiment 3

(Configuration of Image Display Element 200c)

Another embodiment of the present invention will be described below with reference to FIG. 12 and FIGS. 13A-13G. An image display element 200c of Embodiment 3 has a configuration similar to that of the image display element 200b of Embodiment 2. The image display element 200c is different from the image display element 200b in that the image display element 200c is manufactured by forming the transparent portion 31 and the wavelength conversion units 32 and 33 on a substrate different from the driving circuit substrate 50 to bond to the driving circuit substrate 50 having the micro light emitting element 100.

Figure 12:
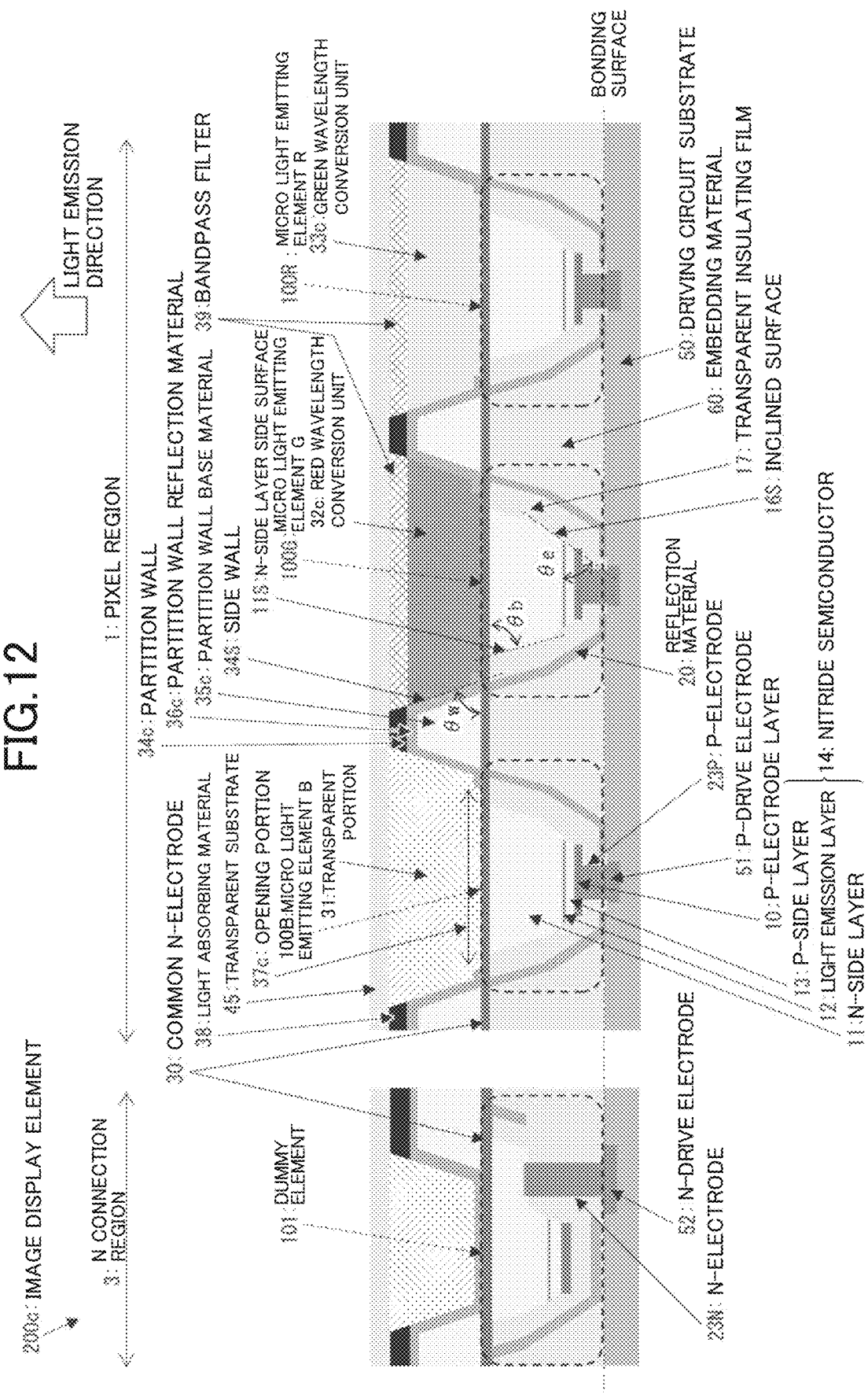
FIG. 12 is a schematic cross-sectional view of an image display element according to Embodiment 3 of the present invention.

As illustrated in the cross-sectional view of FIG. 12, the image display element 200c includes a transparent substrate 45, a light absorbing material 38, and a bandpass filter 39 on the front surface. The image display element 200c is manufactured by forming these structures, the transparent portion 31, the wavelength conversion units 32 and 33, and the partition wall 34C on the transparent substrate 45 and thereafter bonding these to the driving circuit substrate 50. Therefore, it is easy to form such an additional structure. In addition, since the transparent portion 31 and the wavelength conversion units 32 and 33, which are non-defective, are bonded to the non-defective driving circuit substrate 50 including the non-defective micro light emitting element 100, there is an advantage that the yield can be improved.

(Manufacturing Flow of Image Display Element 200c)

Manufacturing flows of a transparent portion 31C, wavelength conversion units 32C and 33C, a partition wall 34C, and the like will be described with reference to FIGS. 13A-13G. The flows from the formation of the micro light emitting element 100, the bonding to the driving circuit substrate 50, to the formation of the common N-electrode 30 are the same as those of Embodiment 1.

Figure 13A:
FIGS. 13A to 13G are schematic cross-sectional views illustrating manufacturing flows of the image display element according to Embodiment 3 of the present invention.
Figure 13B:

As illustrated in FIG. 13A, a dielectric multilayer film 39L such as a distributed Bragg reflector (DBR) is deposited on the transparent substrate 45. Next, as illustrated in FIG. 13B, the dielectric multilayer film 39L is removed except for portions corresponding to the wavelength conversion units 32 and 33, thereby completing the bandpass filter 39. The bandpass filter 39 reflects the blue light as the excitation light and transmits long wavelength light such as the red light and the green light whose wavelength is converted. By providing the bandpass filter 39, the wavelength conversion units 32C and 33C can be made thin without reducing the absorption of the excitation light. Therefore, the material cost of forming the wavelength conversion unit can be reduced, the height of the partition wall 34C can be reduced, and the aspect ratio can be reduced, so that the pixel can be easily miniaturized. In addition, in the present configuration, since the dielectric multilayer film 39L is deposited directly on the transparent substrate 45, it can be deposited at a higher temperature than a case of being deposited on the wavelength conversion units 32 and 33. By depositing at a high temperature, a more stable dielectric multilayer film 39L can be formed.

Figure 13C:

Subsequently, as illustrated in FIG. 13C, the light absorbing material 38 is formed between the sub pixels. The light absorbing material 38 is a black mask. The bandpass filter 39 and the light absorbing material 38 can be omitted.

Figure 13D:
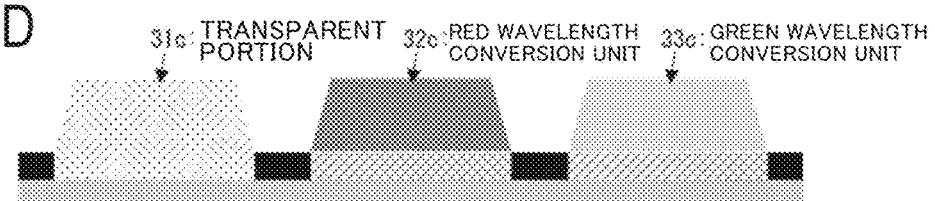

Subsequently, as illustrated in FIG. 13D, the transparent portion 31C, the red wavelength conversion unit 32C, and the green wavelength conversion unit 33C are sequentially formed. At this time, the inclination angle of the side surface of the transparent portion 31C, the red wavelength conversion unit 32C, and the green wavelength conversion unit 33C determines θw.

Figure 13E:
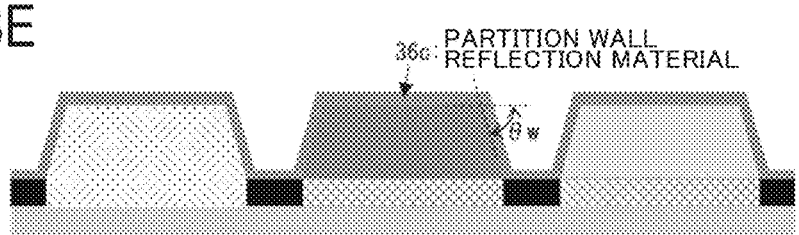
Figure 13F:
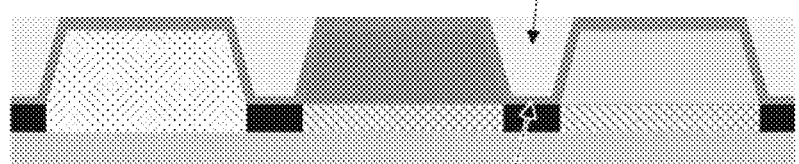

Next, as illustrated in FIG. 13E, the partition wall reflection material 36C is deposited. The partition wall reflection material 36C is the same material as the partition wall reflection material 36 of Embodiment 2. Subsequently, as illustrated in FIG. 13F, recessed portions between the transparent portion 31C, the red wavelength conversion unit 32C, and the green wavelength conversion unit 33C are filled with the partition wall base materials 35C. The partition wall base material 35C may be a resin material or an inorganic material such as $SiO_2$. After the partition wall base material 35C is filled, it is preferable that the partition wall reflection materials 36C above the transparent portion 31C, the red wavelength conversion unit 32C, and the green wavelength conversion unit 33C are exposed.

Figure 13G:
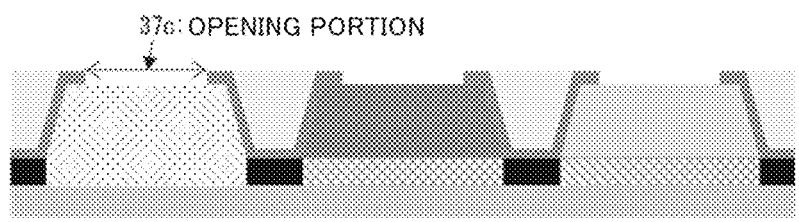

Next, as illustrated in FIG. 13G, opening portions 37C are formed on the upper surfaces of the transparent portion 31C, the red wavelength conversion unit 32C, and the green wavelength conversion unit 33C. As a result, the transparent portion 31C, the wavelength conversion units 32C and 33C, and the partition wall 34C are formed on the transparent substrate 45. Finally, after applying a transparent resin covering the opening portion 37C, the driving circuit substrate 50 on which the micro light emitting elements 100 are integrated is attached to the opening portion 37C side, thereby completing the image display element 200c in FIG. 12.

As described above, also in the configuration and the manufacturing method of the image display element 200c, the same effects as those of the image display element 200b of Embodiment 2 can be realized. Furthermore, according to the image display element 200c, it is easy to provide an additional structure such as a bandpass filter or a black mask on the front surface of the image element, and there is an additional advantage that the yield can be improved.

Embodiment 4

(Configuration of Image Display Element 200d)

Another embodiment of the present invention will be described below with reference to FIG. 14 to FIGS. 16K-16P. A micro light emitting element 100d provided in an image display element 200d of the embodiment is different from the image display elements 200 and 200b of Embodiments 1 and 2 in that the P-electrode 23P and the N-electrode 23N are provided on the lower surface thereof. In addition, in the image display element 200d, the reflection material 20d is connected to the N-side layer 11 and serves as a wiring connecting the N-electrode 23N and the N-side layer 11. In a manufacturing flow of the image display element 200d, there is no need to form a common N-electrode formed of a transparent conductive film after bonding the micro light emitting element 100d to a driving circuit substrate 50d, and the manufacturing flow is simplified. The image display element 200d is the same as the image display element 200b except for these points.

Figure 14:
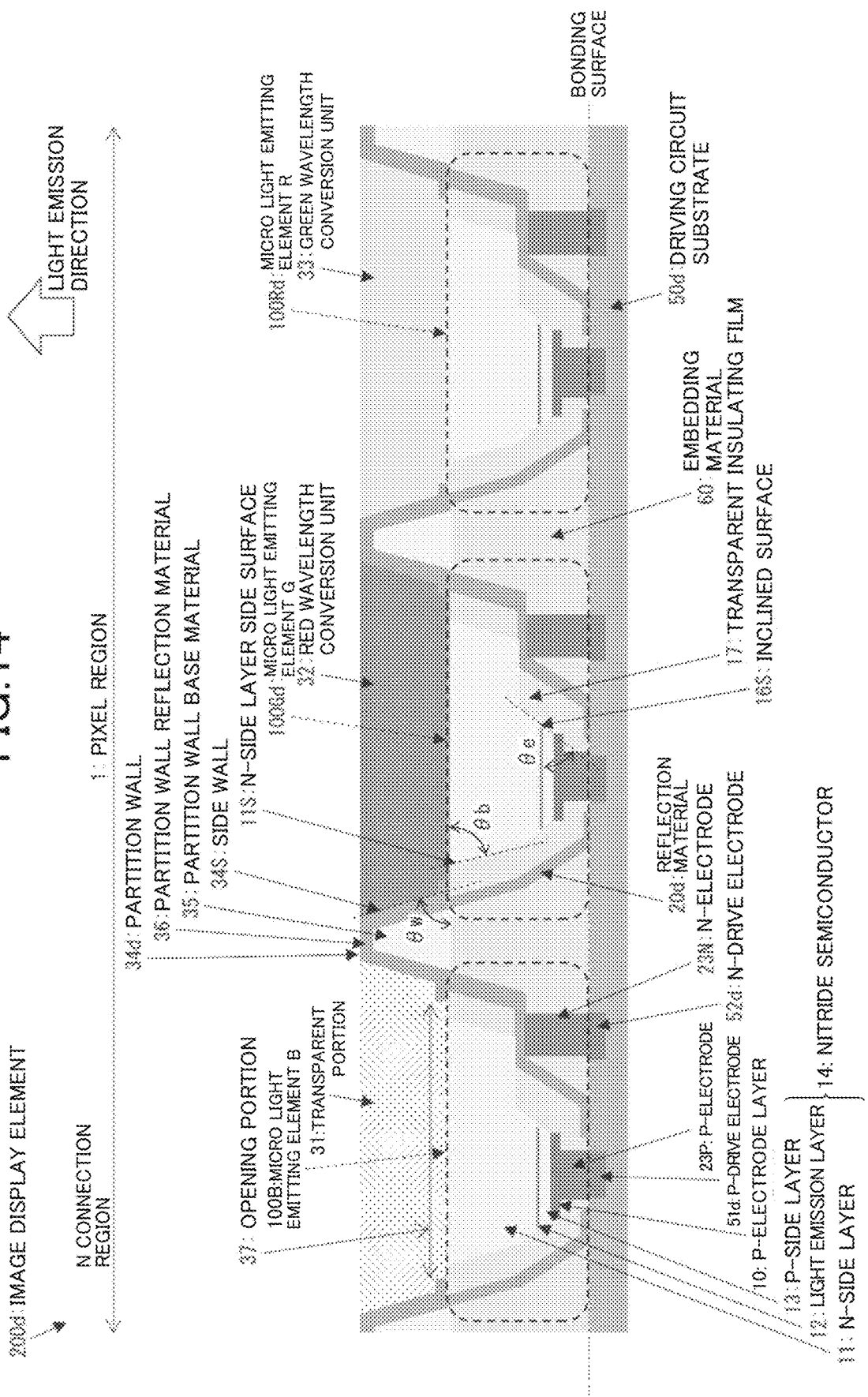
FIG. 14 is a schematic cross-sectional view of an image display element according to Embodiment 4 of the present invention.

The driving circuit substrate 50d includes a P-drive electrode 51d connected to the P-electrode 23P of each micro light emitting element 100d and an N-drive electrode 52d connected to the N-electrode 23N in the pixel region 1. Therefore, in this embodiment, since the dummy element 101 is not required, only the pixel region 1 will be described. In FIG. 14, the N-electrode 23N of each micro light emitting element 100d is connected to the corresponding one N-drive electrode 52d, and one N-drive electrode 52d may be connected to a plurality of N-electrodes 23N.

(Manufacturing Flow of Image Display Element 200d)

FIGS. 15A to 15J and FIGS. 16K to 16P are schematic cross-sectional views illustrating the manufacturing flow of the image display element 200d. In the description of the manufacturing flows of the micro light emitting element 100d in FIGS. 15A to 15J, a side on which the nitride semiconductor 14, the transparent insulating film 17, and the like are formed is referred to as an upper side with respect to the growth substrate 9. On the other hand, in the description of the manufacturing flows of the image display element 200d in FIGS. 16K to 16P, the growth substrate 9 side is referred to as an upper side and the driving circuit substrate 50d side is referred to as a lower side.

Figure 15A:
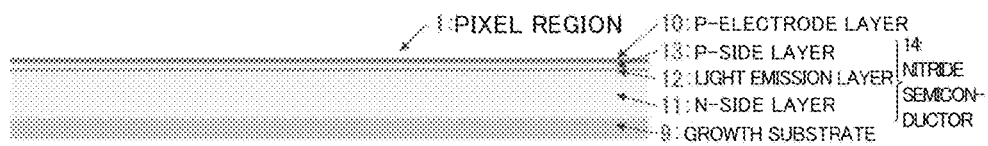
FIGS. 15A to 15J are schematic cross-sectional views illustrating manufacturing flows of the image display element according to Embodiment 4 of the present invention.
Figure 15B:
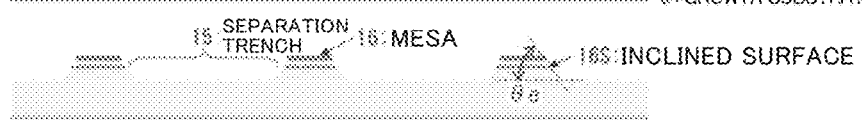
Figure 15C:
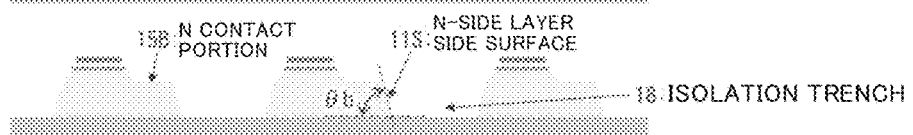

FIGS. 15A, 15B, and 15C correspond to FIGS. 3A, 3B, and 3C. The difference is that, as illustrated in FIG. 15C, when forming the isolation trench 18, a portion of the bottom portion of the separation trench 15 adjacent to the mesa 16 is left as an N contact portion 15B. The N contact portion 15B is used to electrically connect the reflection material 20d and the N-side layer 11 later.

Figure 15D:
Figure 15E:
Figure 15F:
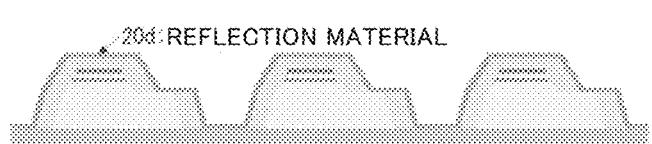

Next, as illustrated in FIG. 15D, the transparent insulating film 17 is deposited so as to cover the mesas 16 and the like. As illustrated in FIG. 15E, the transparent insulating film 17 is processed to provide an N-side opening portion 19 in the N contact portion 15B. Furthermore, as illustrated in FIG. 15F, a reflection material 20d is deposited so as to cover the transparent insulating film 17 and the like. The reflection material 20d contacts the N-side layer 11 at the N-side opening portion 19. In FIG. 15E, the transparent insulating film 17 at the bottom portion of the isolation trench 18 is also removed. This is because the side surface of the N-side layer 11 is covered with the reflection material 20d as much as possible. However, the transparent insulating film 17 at the bottom portion of the isolation trench 18 may be left in a case where the transparent insulating film 17 can be removed in a later flow of separating the growth substrate 9.

Figure 15G:
Figure 15H:
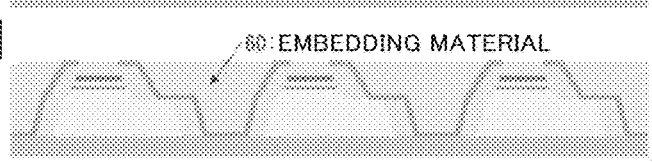
Figure 15I:
Figure 15J:
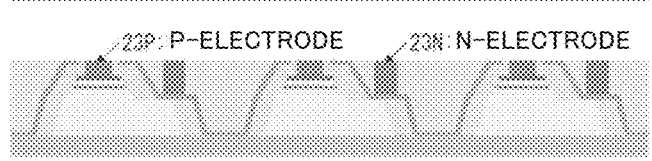

FIGS. 15G and 15H are the same flows as in FIGS. 3F and 3G, and a P opening portion 21 which is the opening portion of the reflection material 20d is provided above the mesa 16, and the embedding material 60 is formed. Thereafter, as illustrated in FIG. 15I, the embedding material 60 and the transparent insulating film 17 are etched to form a P-trench 22P at the position of the P opening portion 21 and an N-trench 22N at the position of the N-side opening portion 19. The P-trench 22P reaches the P-electrode layer 10 above the mesa 16, and the N-trench 22N reaches the reflection material 20d. Next, as illustrated in FIG. 15J, a P-electrode 23P and an N-electrode 23N are formed in the same manner as FIG. 3I. Unlike FIGS. 3A-3I, the N-electrode 23N is also formed in the pixel region 1.

Figure 16K:
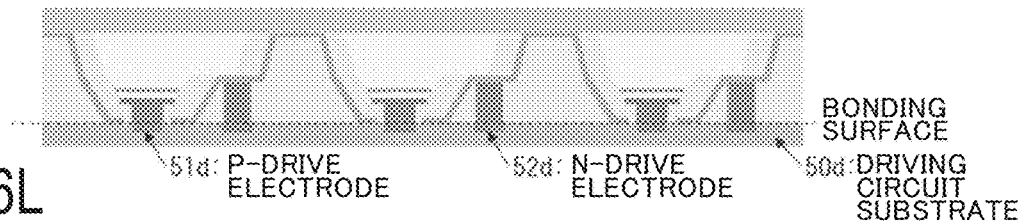
FIGS. 16K to 16P are schematic cross-sectional views illustrating the manufacturing flow of the image display element according to Embodiment 4 of the present invention.
Figure 16L:
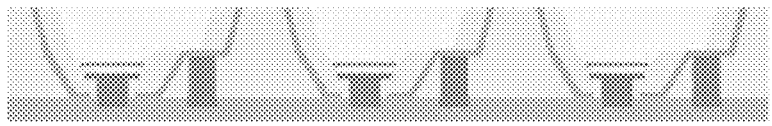
Figure 16M:
Figure 16N:
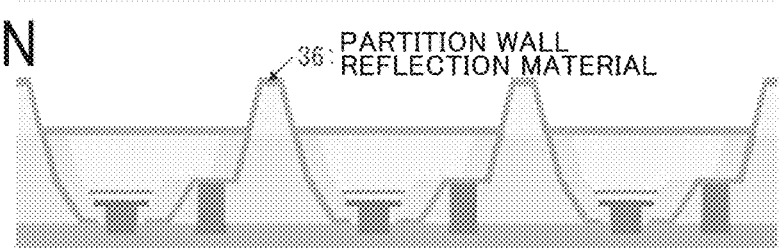
Figure 16O:
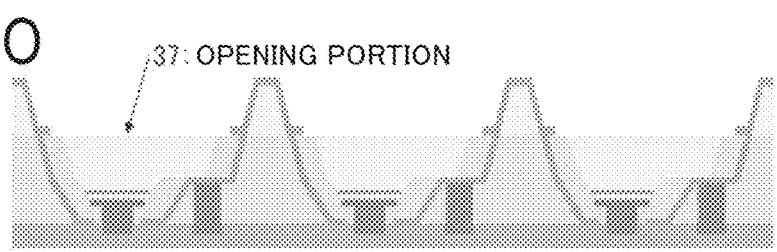
Figure 16P:
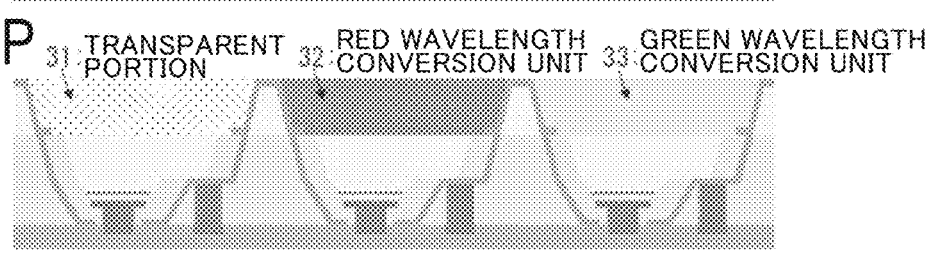

Next, as illustrated in FIGS. 16K and 16L, the micro light emitting element 100d is bonded to the driving circuit substrate 50d, and the growth substrate 9 is separated. This is the same flows as in FIGS. 4B and 4C. The difference from FIGS. 4A-4I is that not only the P-electrode 23P and the P-drive electrode 51d but also the N-electrode 23N and the N-drive electrode 52d exist in the pixel region 1. In FIG. 16L, the reflection material 20d in contact with the growth substrate 9 is also removed in the flow of separating the growth substrate 9, and the reflection material 20d may be left. When left, the reflection material 20d is electrically connected between the micro light emitting elements 100d, so that even when there is a sub pixel in which the N-electrode 23N and the N-drive electrode 52d have a poor connection, there is an advantage that the sub pixel is not a defective pixel.

FIGS. 16M, 16N, 16O, and 16P are flows corresponding to in FIGS. 11B, 11C, 11D, and 11E, and description will be omitted. The difference from FIGS. 11A-11E is that the common N-electrode 30 between the partition wall reflection material 36 and the reflection material 20d is eliminated, and the partition wall reflection material 36 is in direct contact with the reflection material 20d in FIGS. 16K-16P. This structure has an advantage that light leakage from one sub pixel to another sub pixel can be substantially completely prevented.

As described above, also in the configuration of the image display element 200d, the same effect as in Embodiment 1 can be realized. Furthermore, the present embodiment has an additional advantage that the manufacturing flow is simple.

Embodiment 5

(Configuration of Image Display Element 200e)

Another embodiment of the present invention will be described below with reference to FIG. 17 to FIGS. 19H-19M. An image display element 200e of Embodiment 5 is different from the other embodiments in that a reflection material 20e is continuous with a partition wall reflection material 36e.

Figure 17:
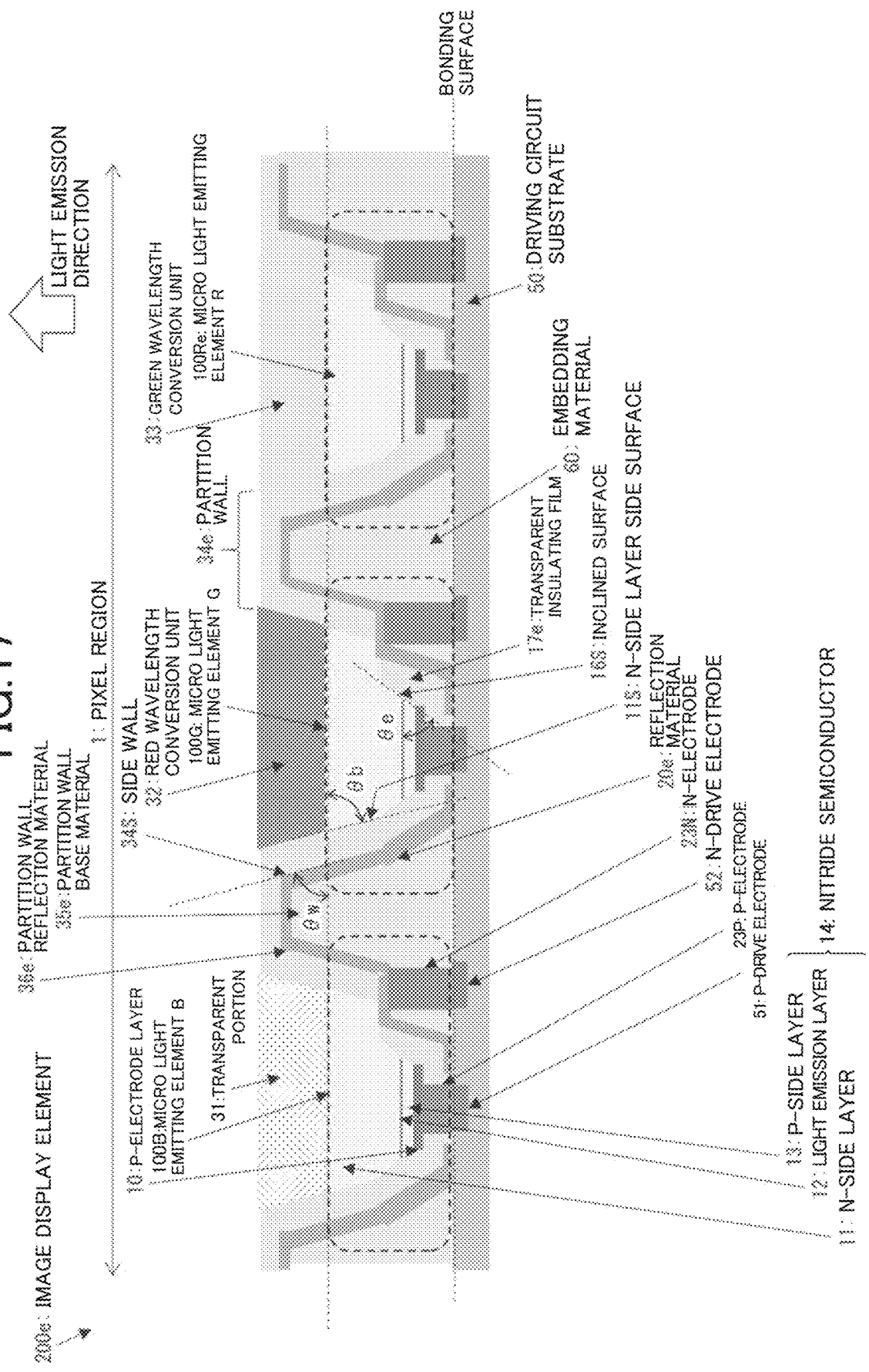
FIG. 17 is a schematic cross-sectional view of an image display element according to Embodiment 5 of the present invention.

A micro light emitting element 100e constituting the image display element 200e has a shape similar to the micro light emitting element 100d as illustrated in the cross-sectional view of FIG. 17, and the reflection material 20e extends to the side of the transparent portion 31 and the wavelength conversion units 32 and 33. The same applies to the transparent insulating film 17. In addition, the embedding material 60 forms a portion of a partition wall 34e. Therefore, the reflection surface of the partition wall 34e is the surface of the partition wall reflection material 36e connected to the reflection material 20e on the transparent insulating film 17e side.

(Manufacturing Flow of Image Display Element 200e)

Figure 18A:
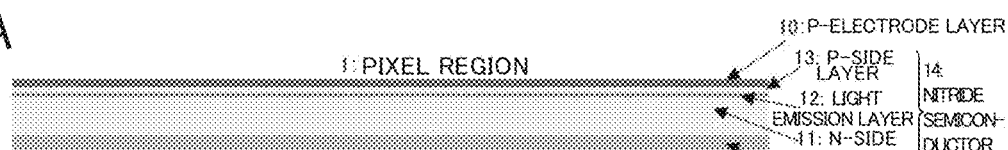
FIGS. 18A to 18G are schematic cross-sectional views illustrating the manufacturing flow of the image display element according to Embodiment 5 of the present invention.
Figure 18B:
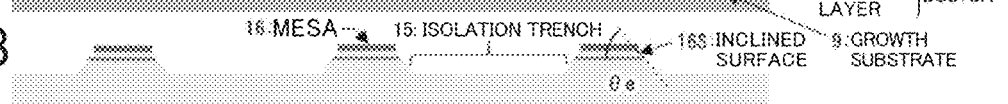
Figure 18C:
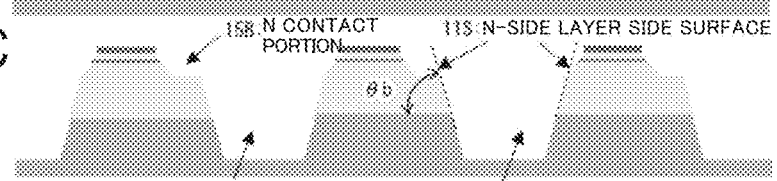
Figure 18D:
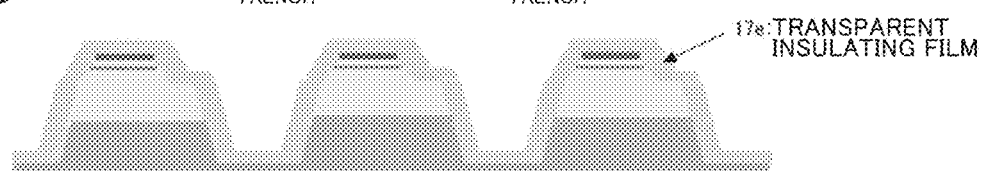

FIGS. 18A-18G and FIGS. 19H-19M illustrate the manufacturing flows of the image display element 200e. FIGS. 18A and 18B are the same as FIGS. 15A and 15B. Next, as illustrated in FIG. 18C, an isolation trench 18e is formed. The isolation trench 18e is different from the separation trenches 18 of other embodiments in that the isolation trench 18e extends to a portion of the front surface side of the growth substrate 9. In other words, in forming the isolation trench 18e, the P-electrode layer 10 and the nitride semiconductor 14 are engraved, and the front surface of the growth substrate 9 is also engraved. Since the depth of the growth substrate 9 portion of the isolation trench 18e determines the thickness of the wavelength conversion units 32 and 33, and the like, the depth of the isolation trench 18e is determined according to the target thickness of the wavelength conversion units 32 and 33. Next, as illustrated in FIG. 18D, a transparent insulating film 17e is deposited.

Figure 18E:
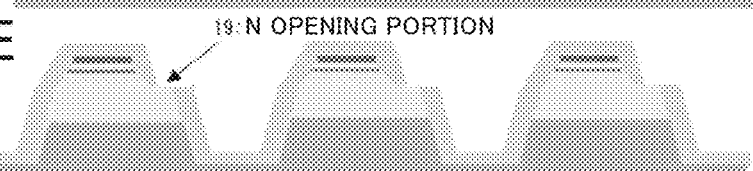
Figure 18F:
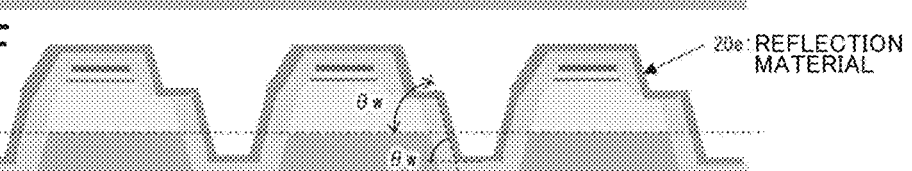
Figure 18G:
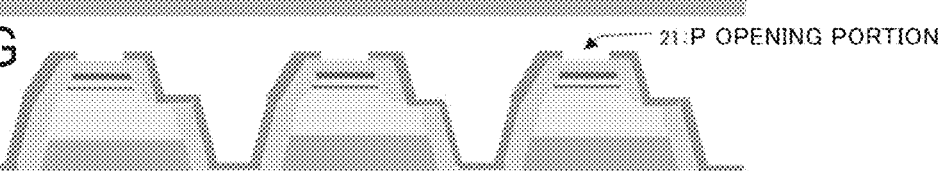

The flows in FIGS. 18E to 18G and in FIGS. 19H to 19K are the same as the flows in FIGS. 15E to 15J and the flow in FIG. 16K. The difference is that the isolation trench 18e is deep and extends to the growth substrate 9. Therefore, the reflection material 20e covers the side wall of the isolation trench 18e on the growth substrate 9 side, and the embedding material 60 also embeds the bottom portion of the isolation trench 18e (portion below the upper surface of the growth substrate 9).

Next, as illustrated in FIG. 18F, the reflection material 20e is deposited so as to cover the transparent insulating film 17e and the like. As illustrated in FIG. 18F, the front surface of the transparent insulating film 17 deposited on the side wall of the isolation trench 18e on the growth substrate 9 side determines the inclination angle θw of the partition wall 34e. In FIGS. 18A-18G, the inclination angles θb and θw are equal to each other, and θb and θw may be different from each other. This is because the nitride semiconductor 14 and the growth substrate 9 are formed of different materials, and have different etching characteristics when forming the isolation trenches 18e, so that the taper angles generated by the etching are different. As described above, in the manufacturing flow of the image display element 200e, the reflection material surrounding the side surface of the nitride semiconductor 14 and the reflection material of the partition wall 34e can be simultaneously formed of the same material. As a result, the manufacturing flow is simplified.

Figure 19H:
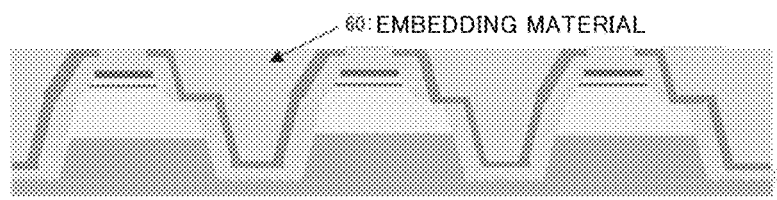
FIGS. 19H to 19M are schematic cross-sectional views illustrating the manufacturing flow of the image display element according to Embodiment 5 of the present invention.
Figure 19I:
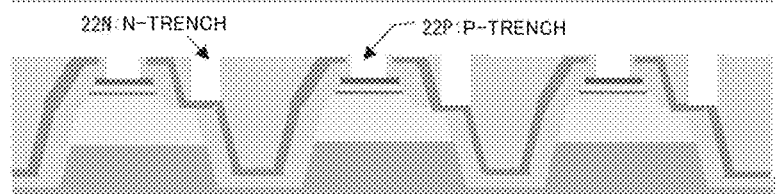
Figure 19J:
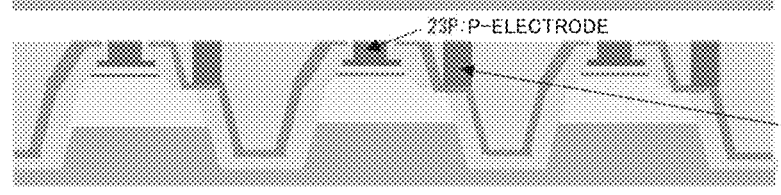
Figure 19K:
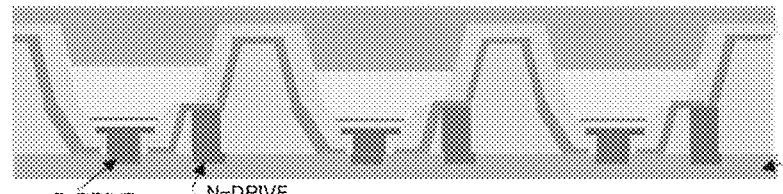
Figure 19L:
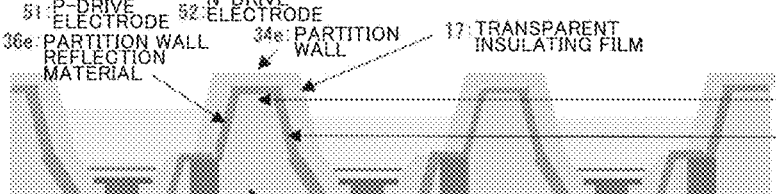
Figure 19M:
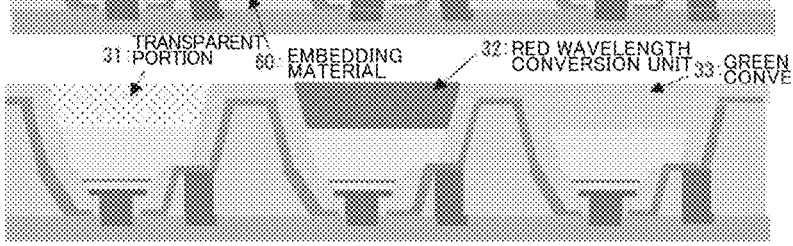

Next, as illustrated in FIG. 19L, the growth substrate 9 is separated. At this time, the portion of the growth substrate 9 in contact with the nitride semiconductor 14 is also removed. For example, in a case where the growth substrate 9 is a silicon substrate, the growth substrate 9 can be removed by isotropic plasma etching or wet etching. In this flow, the partition wall 34e is formed, and a recessed portion surrounded by the partition wall 34e is formed above the micro light emitting element 100e. The partition wall 34e is configured to include the embedding material 60, the reflection material 20e, and the transparent insulating film 17 in this order from the inside. That is, a partition wall base material 35e is formed of the embedding material 60, and the partition wall reflection material 36e is configured to include a portion of the reflection material 20e. Furthermore, the transparent insulating film 17 is also disposed between the partition wall reflection material 36e and the wavelength conversion units 32 and 33. As illustrated in FIG. 19M, the flow of forming the transparent portion 31 and the wavelength conversion units 32 and 33 in the recessed portion surrounded by the partition wall 34e is the same as in the other embodiments.

In the image display element 200e, there is no blocking object between the wavelength conversion units 32 and 33 and the transparent portion 31 and the nitride semiconductor 14, and the side surface of the nitride semiconductor 14 is surrounded by the reflection material 20e. Therefore, the effect of reducing loss due to reciprocation of light between the wavelength conversion units 32 and 33 or the transparent portion 31 and the nitride semiconductor 14 is high. That is, the same effect as in Embodiment 1 can be obtained also in the image display element 200e. In addition, since the manufacturing flow of the partition wall 34e is incorporated in the manufacturing flow of the micro light emitting element 100e, the image display element 200e has an additional advantage that the manufacturing flow is simple.

Embodiment 6

(Configuration of Image Display Element 200f)

Another embodiment of the present invention will be described below with reference to FIG. 20 to FIGS. 22H-22N. An image display element 200f of Embodiment 6 is different from the other embodiments in that the reflection material 20 is in contact with a portion of the N-side layer side surface 11S and forms a portion of the wiring to the N-electrode 23N.

Figure 20:
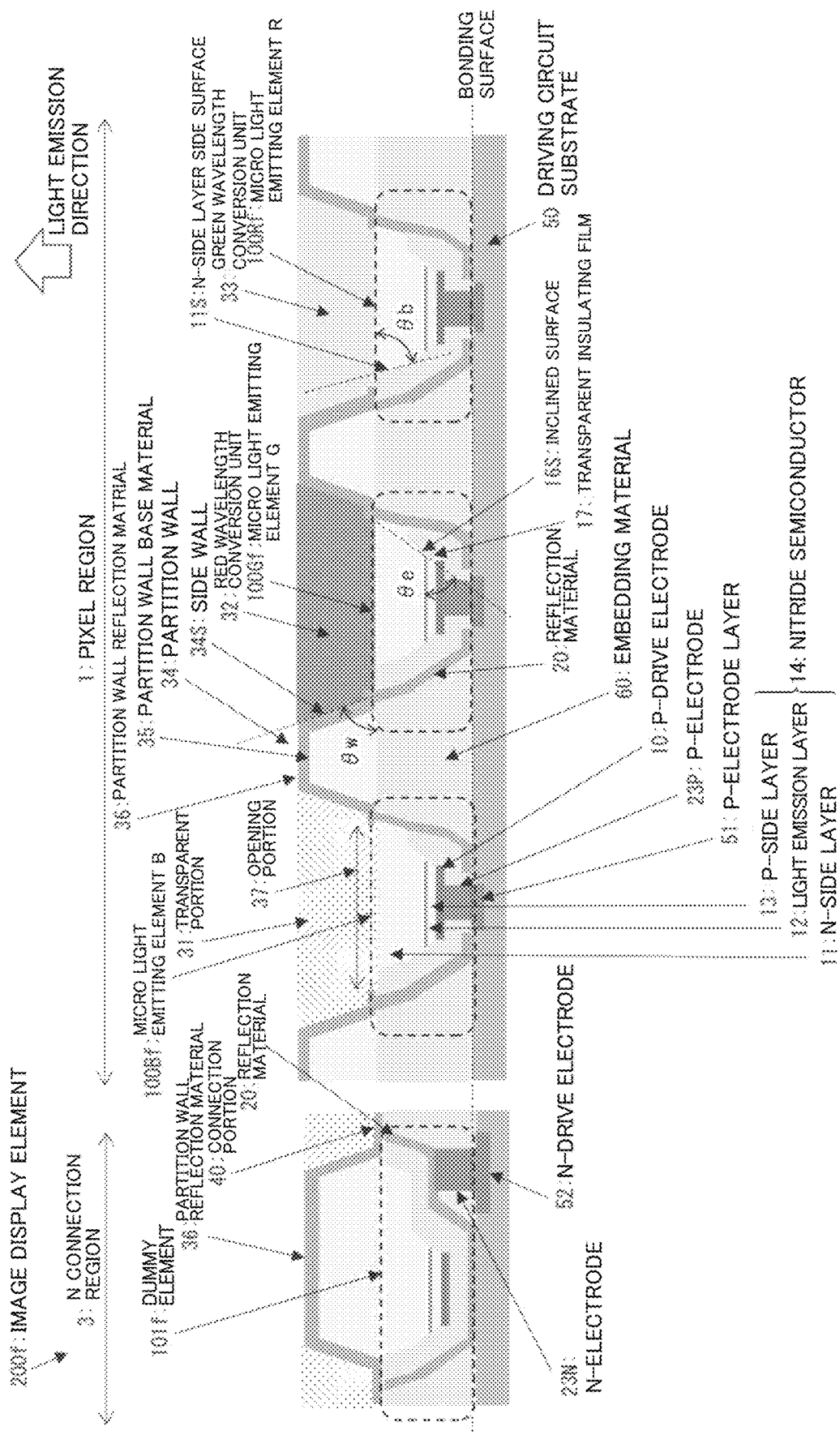
FIG. 20 is a schematic cross-sectional view of an image display element according to Embodiment 6 of the present invention.

The micro light emitting element 100f constituting an image display element 200f has a shape similar to the micro light emitting element 100B as illustrated in the cross-sectional view of FIG. 20, and is different in that the common N-electrode 30 is omitted and the partition wall reflection material 36 plays the role of a common N-electrode. In the dummy elements 101 of Embodiments 1 and 2, the common N-electrode 30 and the N-electrode 23N are connected to each other through the N-side layer 11, and in a dummy element 101f of the present embodiment, the partition wall reflection material 36 and the N-electrode 23N are connected to each other through the reflection material 20. In addition, in the dummy element 101f, a connection portion 40 connecting the reflection material 20 and the partition wall reflection material 36 is provided. Since the transparent conductive film constituting the common N-electrode 30 absorbs visible light although it is small, the light emission efficiency can be improved by omitting the common N-electrode 30.

(Manufacturing Flow of Image Display Element 200f)

FIGS. 21A-21G and FIGS. 22H-22N illustrate manufacturing flows of the image display element 200f. FIGS. 21A to D are the same as FIGS. 3A to 3D. As illustrated in FIG. 21E, a portion of the transparent insulating film 17 on the N-side layer side surface 11S is removed to form an exposed portion 11E. The exposed portion 11E is provided on a portion of the N-side layer side surface 11S. Since most of the N-side layer side surface 11S is covered with the transparent insulating film 17, the effect due to a decrease in light reflectance on the N-side layer side surface 11S is not significant. FIGS. 21F to 21G and FIGS. 22H to 22J are the same flows as in FIGS. 3E to 3I. However, the reflection material 20 is electrically connected to the N-side layer 11 at the exposed portion 11E. In addition, the N-trench 22N is provided on the reflection material 20 that covers the N contact trench 15N.

Figure 22H:
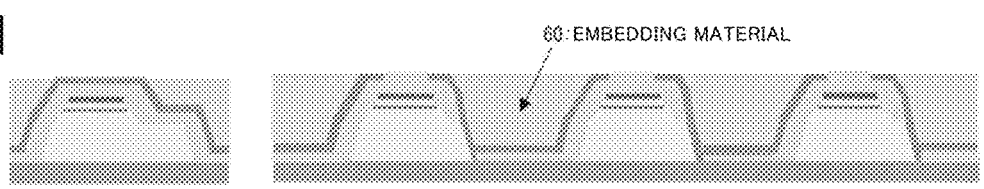
FIGS. 22H to 22N are schematic cross-sectional views illustrating the manufacturing flow of the image display element according to Embodiment 6 of the present invention.
Figure 22I:
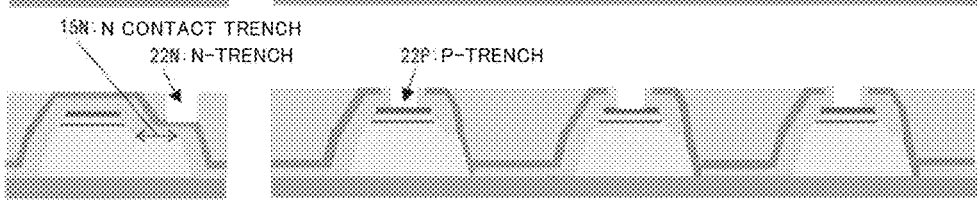
Figure 22J:
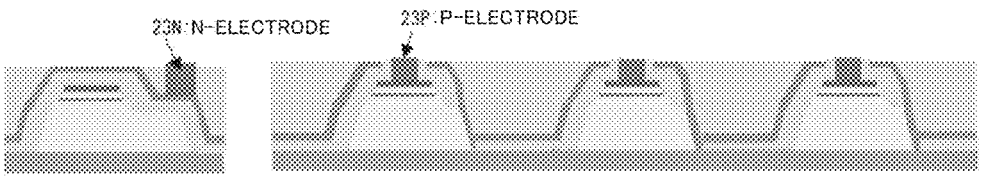
Figure 22K:
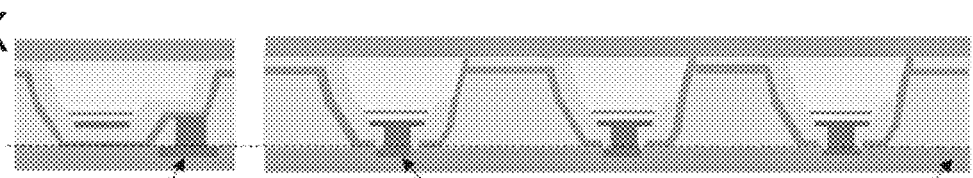
Figure 22L:
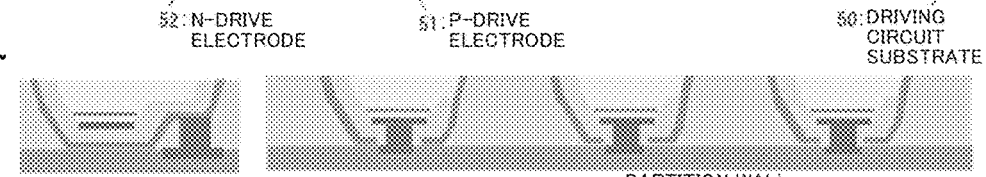
Figure 22M:
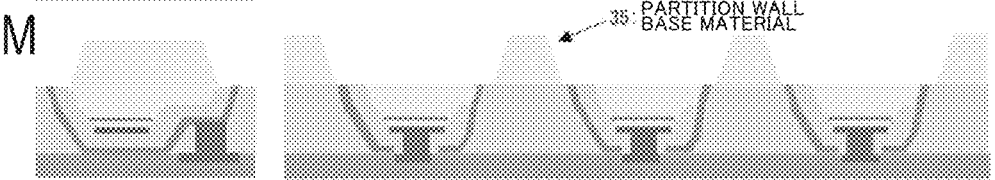
Figure 22N:
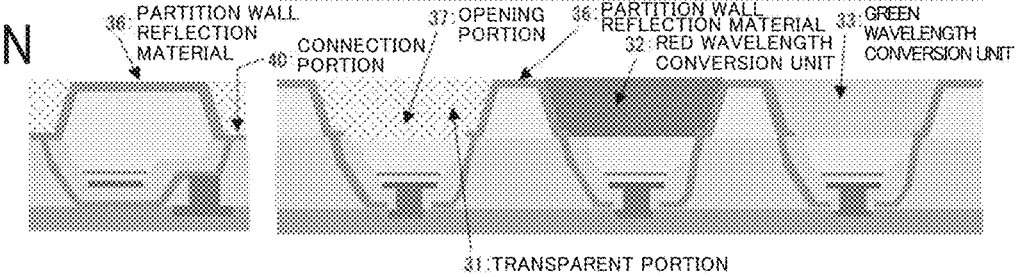

FIGS. 22K and 22L are the same as in FIGS. 4B and (C), and the flows after in FIG. 22M are the same as the flows after in FIG. 11B. The difference is that a disposition position of the partition wall base material 35 is different because the connection portion 40 connecting the partition wall reflection material 36 and the reflection material 20 is provide in the N connection region 3. Specifically, the connection portion 40 is provided at the upper end portion of the reflection material 20 of the dummy element 101f without disposing the partition wall base material 35.

As described above, also in the image display element 200f, the same effects as in Embodiment 1 can be realized. Furthermore, the image display element 200f has an additional advantage that the light emission efficiency can be increased and the manufacturing flow can be simplified by omitting the common N-electrode 30.

Modification Example

Figure 23:
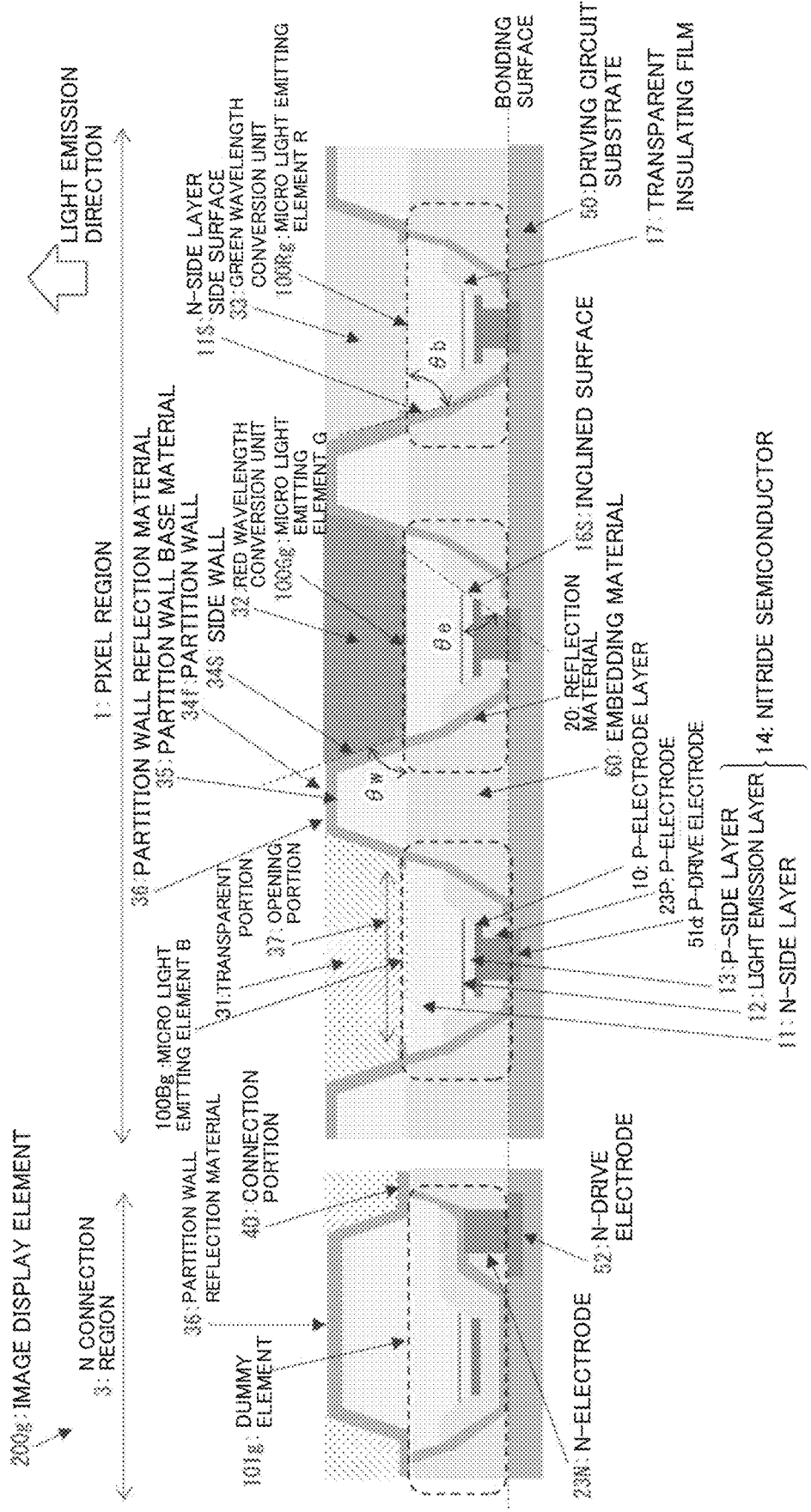
FIG. 23 is a schematic cross-sectional view of an image display element according to a modified example of Embodiment 6 of the present invention.

FIG. 23 illustrates a modification example of Embodiment 6. An image display element 200g of the present modification example has a configuration in which the micro light emitting element 100f of Embodiment 6 is replaced with a micro light emitting element 100g illustrated in FIG. 23. The micro light emitting element 100g differs from the micro light emitting element 100f in that the reflection material 20 is in contact with the N-side layer side surface 11S over the entire surface. That is, in the micro light emitting element 100g, the transparent insulating film 17 is disposed only between the inclined surface 16S surrounding the light emission layer 12, and the reflection material 20. In addition, the image display element 200g is provided with a dummy element 101g having the connection portion 40, similar to the dummy element 101f of the image display element 200f.

In the image display element 200g, when an end portion on the bottom portion of the partition wall reflection material 36 and the upper end portion of the reflection material 20 are overlapped each other, in consideration of the manufacturing margin in processing, there may be a case where the end portion on the bottom portion of the partition wall reflection material 36 covers a portion of the upper surface of the nitride semiconductor 14. However, compared to the size of the micro light emitting element 100g, the overlapping area between the partition wall reflection material 36 and the nitride semiconductor 14 is small, and the influence on the light emission efficiency is not large. Therefore, also in the present configuration, the same effect as in Embodiment 6 can be obtained.

Figure 24A:
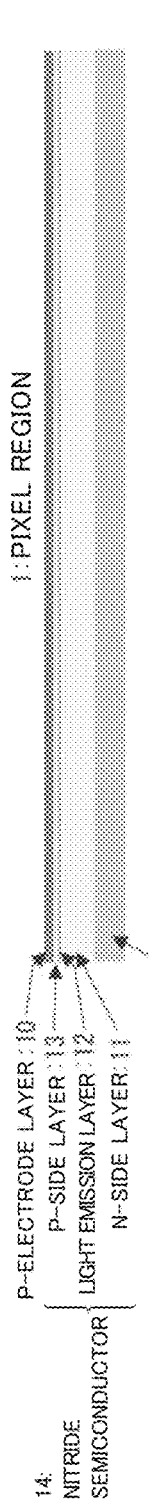
FIGS. 24(a) to 24(e) are schematic cross-sectional views illustrating manufacturing flows of a micro light emitting element according to the modified example of Embodiment 6 of the present invention.
Figure 24B:
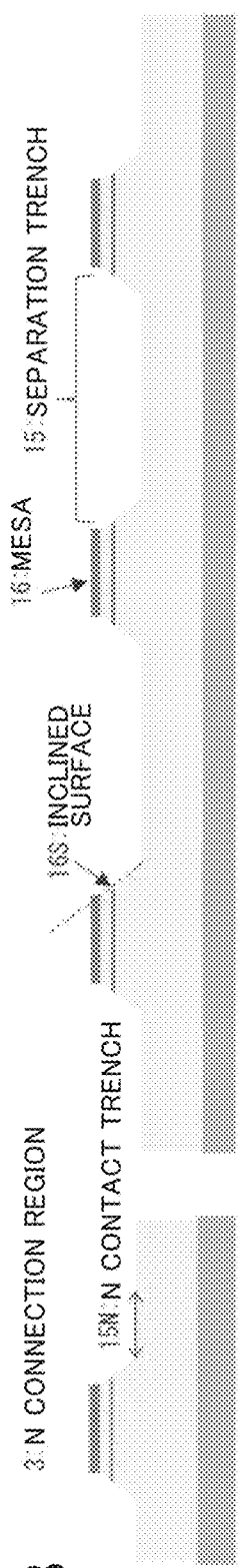
Figure 24C:
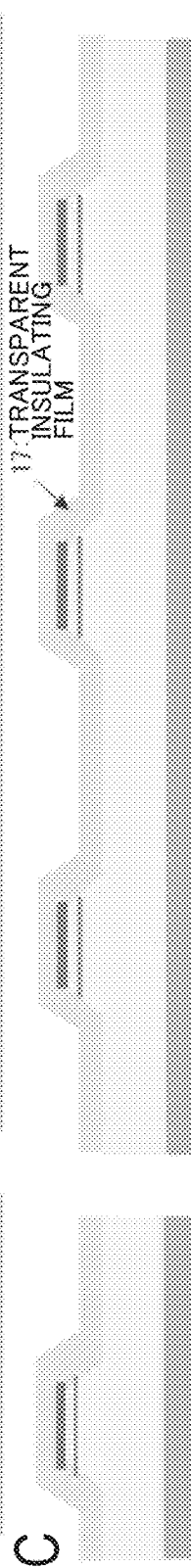
Figure 24D:
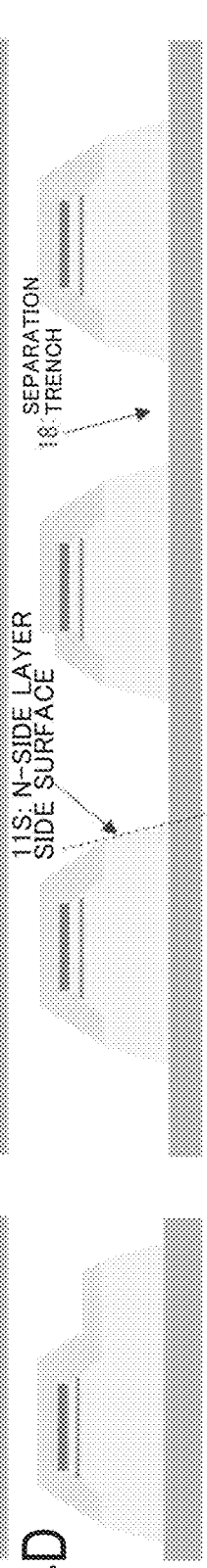
Figure 24E:
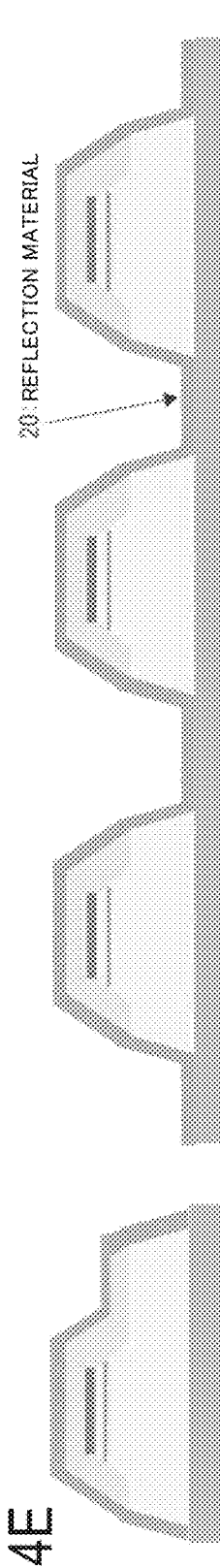

FIGS. 24A-24E illustrates a manufacturing flow of the present configuration. The difference from the manufacturing flow of Embodiment 6 illustrated in FIGS. 21A-21G and FIGS. 22H-22N is that after FIG. 24B, the transparent insulating film 17 is deposited in the flow in FIG. 24C, and thereafter the isolation trench 18 is formed in the flow in FIG. 24D. Manufacturing flows after FIG. 24E are the same as those in Embodiment 6, and a description thereof will not be repeated.

Embodiment 7

(Configuration of Image Display Element 200h)

Another embodiment of the present invention will be described below with reference to FIG. 25 to FIGS. 27G-27M. An image display element 200h of Embodiment 7 is different from the other embodiments in that a reflection material 20h also serves as the P-electrode.

Figure 25:
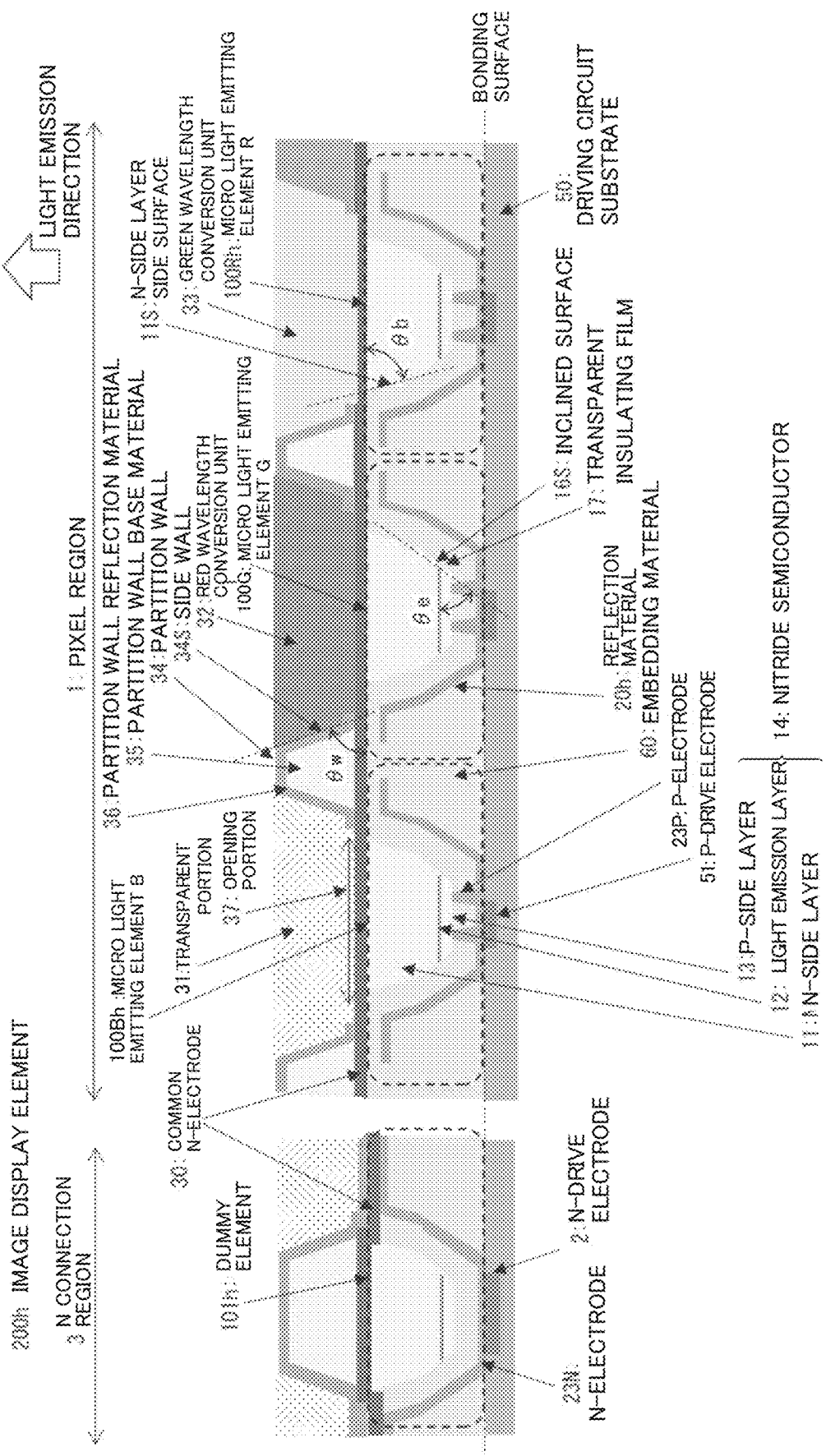
FIG. 25 is a schematic cross-sectional view of an image display element according to Embodiment 7 of the present invention.

In a micro light emitting element 100h constituting the image display element 200h, the reflection material 20h is connected to the P-side layer 13, as illustrated in the cross-sectional view of FIG. 25. That is, the reflection material 20h also functions as the P-electrode 23P. A reflection material 20h covers most of the inclined surface 16S and the N-side layer side surface 11S. In addition, the transparent insulating film 17 is disposed between the inclined surface 16S, the N-side layer side surface 11S, and the reflection material 20h. The opening portion 37 is disposed inside the micro light emitting element 100h with respect to the upper end portion of the reflection material 20h.

(Manufacturing Flow of Image Display Element 200h)

FIGS. 26A-26F and FIGS. 27G-27M illustrate manufacturing flows of the image display element 200h. FIGS. 26A to 26D are the same as FIGS. 3A to 3D. The difference is that the P-electrode layer 10 is omitted, and that a dummy element 101h in the N connection region 3 does not necessarily require the N contact trench 15N adjacent to the mesa 16. It is also possible to have the P-electrode layer in this structure.

Figure 26A:
FIGS. 26(a) to 26(f) are schematic cross-sectional views illustrating manufacturing flows of the image display element according to Embodiment 7 of the present invention.
Figure 26B:
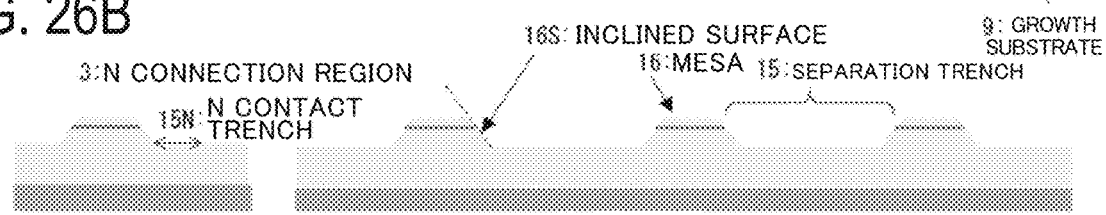
Figure 26C:
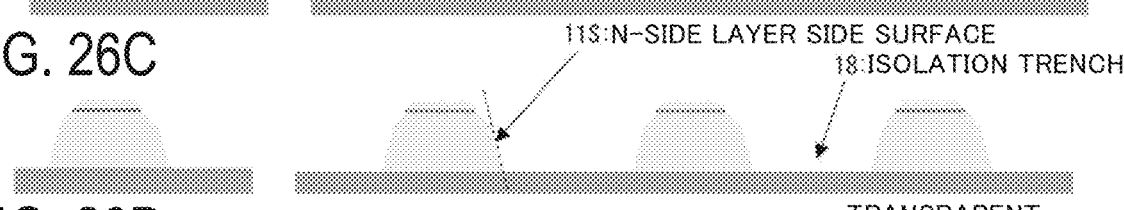
Figure 26D:
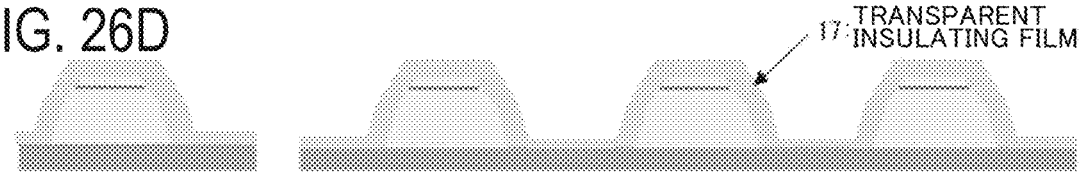
Figure 26E:
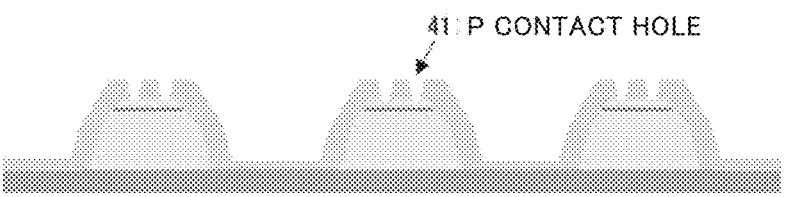

Next, as illustrated in FIG. 26E, the P contact hole 41 is opened at a position above the mesa 16 in the pixel region 1. At the bottom portion of the P contact hole 41, the front surface of the P-side layer 13 appears. The number of P contact holes 41 provided in each mesa 16 may be one or more.

Figure 26F:
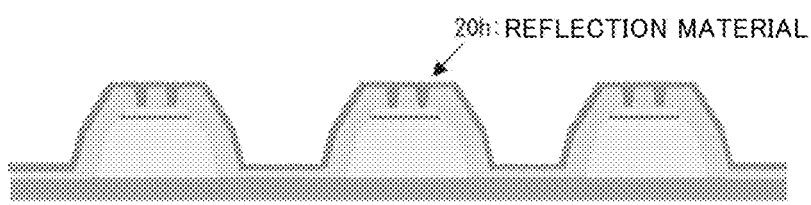

Next, as illustrated in FIG. 26F, the reflection material 20h is deposited on the transparent insulating film 17. The reflection material 20h may be configured to include a plug portion filling the P contact hole 41 and a film portion deposited on the front surface of the transparent insulating film 17. The reflection material 20h is electrically connected to the P-side layer 13 through the P contact hole 41.

Figure 27G:
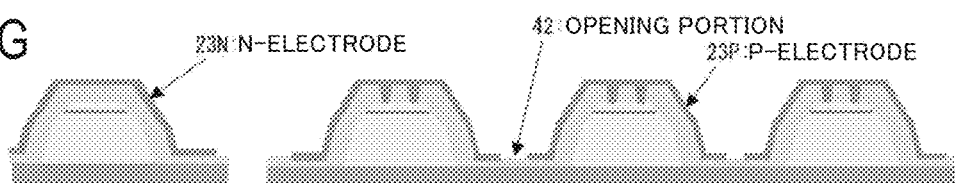
FIGS. 27(g) to 27(m) are schematic cross-sectional views illustrating manufacturing flows of the image display element according to Embodiment 7 of the present invention.

Next, as illustrated in FIG. 27G, an opening portion 42 dividing the reflection material 20h for each micro light emitting element 100h is provided. As a result, the reflection material 20h is the P-electrode 23P of each micro light emitting element 100h. Similarly, in a dummy element 101h in the N connection region 3, the divided reflection material 20h is the N-electrode 23N. It is also possible to divide the reflection material 20h after bonding the micro light emitting element 100h on the driving circuit substrate 50.

Figure 27H:
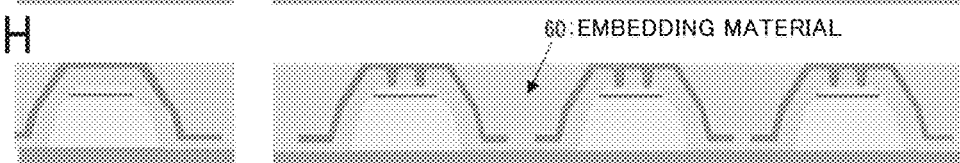
Figure 27I:
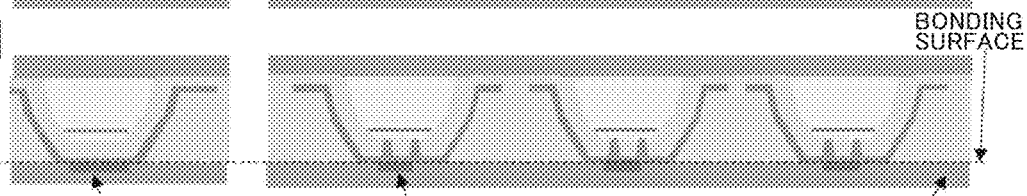

Next, as illustrated in FIG. 27H, the embedding material 60 is formed. As illustrated in FIG. 27I, the growth substrate 9 on which the micro light emitting elements 100h are formed and the driving circuit substrate 50 are bonded to each other. Here, in the pixel region 1, the P-electrode 23P is connected to the P-drive electrode 51, and in the N connection region 3, the N-electrode 23N is connected to the N-drive electrode 52.

Figure 27J:
Figure 27K:
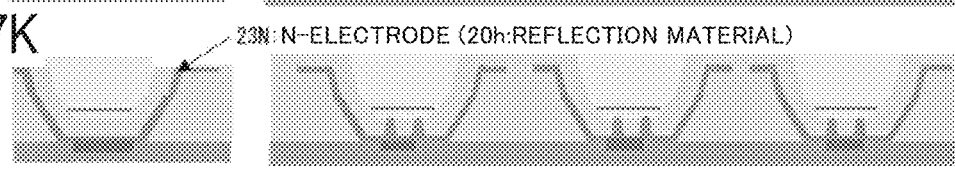
Figure 27L:
Figure 27M:
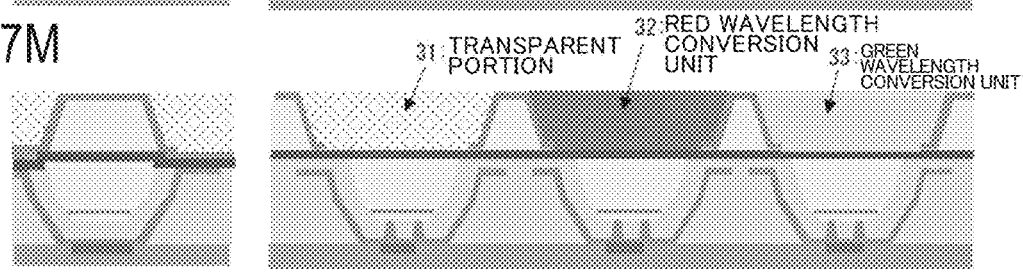

Subsequently, as illustrated in FIG. 27J, the growth substrate 9 is separated. As illustrated in FIG. 27K, in the N connection region 3, the transparent insulating film 17 is etched to expose the upper surface of the N-electrode 23N. Furthermore, as illustrated in FIG. 27L, the common N-electrode 30 is deposited. The common N-electrode 30 contacts the upper surface of the N-side layer 11 of the micro light emitting element 100h in the pixel region 1, and contacts the upper surface of the N-electrode 23N in the N connection region 3. After FIG. 27M, it is the same as FIGS. 11A-11E.

In the image display element 200h, since the transparent insulating film 17 can be disposed also on the N-side layer 11, the light reflectance on the N-side layer 11 can be improved. As a result, light emission efficiency can be increased. Therefore, the same effect as that of Embodiment 1 can be realized in the configuration of the image display element 200h.

In the image display element 200h, since the common N-electrode 30 and the transparent insulating film 17 exist between the partition wall reflection material 36 and the reflection material 20h, there is a possibility that the optical crosstalk may occur through this gap. However, by reducing the thickness of the common N-electrode 30 and the transparent insulating film 17, such optical crosstalk can be suppressed to a level that does not cause any problem.

SUMMARY

The image display element according to Aspect 1 of the present invention includes a driving circuit substrate that includes a driving circuit supplying current to a micro light emitting element to emit light, the micro light emitting elements arranged in an array on the driving circuit substrate, and a wavelength conversion unit disposed on the micro light emitting element, and that converts excitation light emitted by the micro light emitting element into long wavelength light having a longer wavelength than the excitation light and emits the light to a side opposite to the driving circuit substrate, in which the micro light emitting element includes a semiconductor (nitride semiconductor 14) in which a first conductive layer (N-side layer 11), a light emission layer, and a second conductive layer (P-side layer 13) having a conductivity type opposite to that of the first conductive layer are laminated in order from a light emitting surface side, a side surface of the semiconductor is inclined so as to open in a light emitting direction and is covered with a reflection material, the wavelength conversion unit is surrounded on sides by a partition wall, and a side surface of the partition wall facing the wavelength conversion unit is a reflection surface inclined so as to open in the light emitting direction.

According to the above configuration, the light emitted from the side surface of the semiconductor is reflected by the reflection material and travels in the light emitting direction. In addition, the light emitted from the side surface of the wavelength conversion unit is reflected by the reflection surface and travels in the light emitting direction. Therefore, by preventing the optical crosstalk between adjacent micro light emitting elements, it is possible to prevent a decrease in contrast and a decrease in color purity, and to improve the light emission efficiency of the micro light emitting element.

In the image display element according to Aspect 2 of the present invention, in above Aspect 1, a bottom opening portion (opening portion 37) surrounded by the reflection surface may be disposed inside the micro light emitting element from an upper end portion of the reflection material on the light emitting surface side. As a result, light returned from the bottom opening portion to the inside of the semiconductor is prevented from leaking to the outside of the reflection material, so that loss due to light leakage and the optical crosstalk can be reduced.

In the image display element according to Aspect 3 of the present invention, in Aspect 1, a transparent insulating film may be disposed between the side surface of the semiconductor and the reflection material. As a result, the light extraction efficiency can be increased.

In the image display element according to Aspect 4 of the present invention, in above Aspect 3, a bottom opening portion surrounded by the reflection surface may cover the light emitting surface of the semiconductor. As a result, the light emitted from the light emitting surface of the semiconductor can be emitted from the bottom opening portion in the light emitting direction without leaking from between the bottom opening portion and the semiconductor.

In the image display element according to Aspect 5 of the present invention, in above Aspect 1, an inclination angle ($\theta w$) of the side surface of the partition wall may be in a range of 85° to 45° with respect to an upper surface of the light emission layer. According to experiments performed by the inventors of the present application, it has been found that the light extraction efficiency can be increased by setting the inclination angle of the side surface of the partition wall within the above range. Therefore, according to the above configuration, the light extraction efficiency of the image display element can be increased. The inclination angle of the side surface of the partition wall is the same or substantially the same as the inclination angle of the reflection surface.

The image display element according to Aspect 6 of the present invention, in above Aspect 1, the micro light emitting elements arranged in an array may include micro light emitting elements of sub pixels in which transparent portions are arranged instead of the wavelength conversion units, the transparent portion may be surrounded on sides by a partition wall, and a side surface of the partition wall facing the transparent portion may be a reflection surface inclined so as to open in the light emitting direction. As a result, it is possible to prevent optical crosstalk between the sub pixel on which the transparent portion is disposed and another pixel, and to improve the light emission efficiency of the sub pixel.

In the image display element according to Aspect 7 of the present invention, in above Aspect 3, a film thickness of the transparent insulating film may be 75 nm or more. According to experiments performed by the inventors of the present application, it has been found that the light extraction efficiency is significantly reduced when the film thickness of the transparent insulating film is less than 75 nm. Therefore, by setting the film thickness of the transparent insulating film to 75 nm or more as in the above configuration, the effect of improving the light extraction efficiency by providing the transparent insulating film can be sufficiently enjoyed.

In the image display element according to Aspect 8 of the present invention, in above Aspect 3, a film thickness of the transparent insulating film may be 400 nm or more. According to the experiments performed by the inventors of the present application, it is found that the light extraction efficiency is improved as the film thickness of the transparent insulating film is increased, and the change in the light extraction efficiency is poor when the film thickness is 400 nm or more. Therefore, by setting the film thickness of the transparent insulating film to 400 nm or more as in the above configuration, the effect of improving the light extraction efficiency by providing the transparent insulating film can be maximized.

In the image display element according to Aspect 9 of the present invention, in above Aspect 1, an inclination angle ($\theta e$) of a side surface in a periphery of the light emission layer among the side surfaces of the semiconductor may be 60° or less with respect to the upper surface of the light emission layer. According to experiments performed by the inventors of the present application, it has been found that the light extraction efficiency can be increased by setting the inclination angle of the side surface in the periphery of the light emission layer to the above range. Therefore, according to the above configuration, the light extraction efficiency of the image display element can be increased.

The image display element according to Aspect 10 of the present invention, in above Aspect 9, the inclination angle ($\theta e$) of the side surface in the periphery of the light emission layer among the side surfaces of the semiconductor may be 50° or less with respect to the upper surface of the light emission layer. According to experiments performed by the inventors of the present application, it has been found that the light extraction efficiency can be further increased by setting the inclination angle of the side surface in the periphery of the light emission layer to the above range. Therefore, according to the above configuration, the light extraction efficiency of the image display element can be further increased.

The image display element according to Aspect 11 of the present invention, in above Aspect 1, an inclination angle ($\theta b$) of a side surface in a periphery of the first conductive layer among the side surfaces of the semiconductor may be less than 90° with respect to the upper surface of the light emission layer. By setting the inclination angle of the side surface in the periphery of the first conductive layer in such a range, the light emitted from the side surface in the periphery of the first conductive layer can be reflected in the light emitting direction. Therefore, it is possible to reduce the optical crosstalk and improve the light emission efficiency.

In the image display element according to Aspect 12 of the present invention, in above Aspect 1, the reflection material may conduct the first conductive layer. According to this configuration, the reflection material can be used as the wiring supplying a current to the first conductive layer.

In the image display element according to Aspect 13, in above Aspect 1, the reflection material may conduct the second conductive layer. According to this configuration, the reflection material can be used as the wiring supplying a current to the second conductive layer.

The image display element according to Aspect 14 of the present invention, in above Aspect 1, an inclination angle ($\theta w$) of the side surface of the partition wall with respect to the upper surface of the light emission layer may be equal to or less than the inclination angle ($\theta b$) of the side surface of the first conductive layer with respect to the upper surface of the light emission layer. According to this configuration, the light extraction efficiency can be increased.

In the image display element according to Aspect 15, in above Aspect 1, the reflection surface may be formed of a reflection material, and the reflection material surrounding the side surface of the semiconductor and the reflection material forming the reflection surface of the partition wall may be in direct contact with each other. In this configuration, since the light does not leak from between the reflection materials, light leakage to other pixels can be substantially completely prevented.

The image display element according to Aspect 16 of the present invention, in above Aspect 15, the reflection material surrounding the side surface of the semiconductor and the reflection material forming the reflection surface of the partition wall may be formed of the same material. According to this configuration, the reflection material surrounding the side surface of the semiconductor and the reflection material forming the reflection surface of the partition wall can be simultaneously formed of the same material. As a result, the manufacturing flow of the image display element can be simplified.

In the image display element according to Aspect 17 of the present invention, in above Aspect 1, the reflection surface may be formed of the reflection material, and the reflection material forming the reflection surface of the partition wall may conduct the first conductive layer. As a result, it possible to reduce the resistance of the wiring that electrically connects the first conductive layer and the driving circuit substrate. In the image display element of Aspect 17, the reflection material may conduct the first conductive layer by directly contacting the first conductive layer, or may conduct through another conductive body (for example, common N-electrode 30 in the example of FIG. 10).

The image display element according to Aspect 18 of the present invention, in above Aspect 17, the reflection material forming the reflection surface of the partition wall may form a portion of a wiring that electrically connects the first conductive layer and the driving circuit substrate. As a result, power can be supplied to the first conductive layer through the reflection material of the partition wall without providing an electrode on the front surface (light emitting surface) of the first conductive layer. Therefore, the light emission efficiency can be improved.

The image display element according to Aspect 19 of the present invention, in above Aspect 1, a reflection layer (reflection films 9a and 9b) that transmits the excitation light and reflects the long wavelength light may be provided inside the micro light emitting element. According to this configuration, by reflecting the long wavelength light incident on the micro light emitting element from the wavelength conversion unit, the loss in the micro light emitting element can be reduced, and the light extraction efficiency can be improved.

The image display element according to Aspect 20 of the present invention, in above Aspect 1, a reflection layer (reflection film 9C) that reflects both the excitation light and the long wavelength light may be provided inside the micro light emitting element. According to this configuration, the long wavelength light incident on the micro light emitting element from the wavelength conversion unit is reflected, and the excitation light is prevented from leaking from other than the opening portion on the wavelength conversion unit side. Therefore, loss in the micro light emitting element can be reduced and the light extraction efficiency can be improved.

The present invention is not limited to the above-described embodiments, and various changes can be made within the scope of the aspects, and embodiments obtained by appropriately combining technical means disclosed in different embodiments are also included in the technical scope of the present invention. Furthermore, a new technical feature can be formed by combining the technical means disclosed in each embodiment. In addition, the method of manufacturing the micro light emitting element and the method of manufacturing the image display element described in the above embodiments are also included in the scope of the present invention. Furthermore, an apparatus including the image display element described in each of the above embodiments is also included in the scope of the present.

The invention claimed is:

1. An image display element comprising:
    a driving circuit substrate that includes a driving circuit supplying current to a micro light emitting element to emit light, the micro light emitting element being one of a plurality of micro light emitting elements arranged in an array on the driving circuit substrate; and
    a wavelength conversion unit disposed on the micro light emitting element, converting excitation light emitted by the micro light emitting element into long wavelength light having a longer wavelength than the excitation light, and emitting the light to a side opposite to the driving circuit substrate, wherein
    the micro light emitting element includes a semiconductor in which a first conductive layer, a light emission layer, and a second conductive layer having a conductivity type opposite to that of the first conductive layer are laminated in order from a light emitting surface side,
    a side surface of the semiconductor is inclined so as to open in a light emitting direction and is covered with a reflection material,
    the wavelength conversion unit is surrounded on sides by a partition wall,
    a side surface of the partition wall facing the wavelength conversion unit is a reflection surface inclined so as to open in the light emitting direction,
    a common electrode is provided above the first conductive layer, and
    the partition wall is in direct contact with the common electrode.

2. The image display element according to claim 1, wherein
    a bottom opening portion surrounded by the reflection surface is disposed inside the micro light emitting element from an upper end portion of the reflection material on the light emitting surface side.

3. The image display element according to claim 1, wherein
    a transparent insulating film is disposed between the side surface of the semiconductor and the reflection material.

4. The image display element according to claim 3, wherein
    a bottom opening portion surrounded by the reflection surface covers a light emitting surface of the semiconductor.

5. The image display element according to claim 1, wherein
    an inclination angle of the side surface of the partition wall is in a range of 85° to 45° with respect to an upper surface of the light emission layer.

6. The image display element according to claim 1, wherein
    the plurality of micro light emitting elements arranged in the array include micro light emitting elements of sub pixels, each of which comprises a transparent portion in place of the wavelength conversion unit,
    the transparent portion is surrounded on sides by a partition wall, and
    a side surface of the partition wall facing the transparent portion is a reflection surface inclined so as to open in the light emitting direction.

7. The image display element according to claim 3, wherein
    a film thickness of the transparent insulating film is 75 nm or more.

8. The image display element according to claim 3, wherein
    a film thickness of the transparent insulating film is 400 nm or more.

9. The image display element according to claim 1, wherein
    an inclination angle of a side surface in a periphery of the light emission layer among the side surfaces of the semiconductor is 60° or less with respect to an upper surface of the light emission layer.

10. The image display element according to claim 1, wherein
    an inclination angle of a side surface in a periphery of the light emission layer among the side surfaces of the semiconductor is 50° or less with respect to an upper surface of the light emission layer.

11. The image display element according to claim 1, wherein
    an inclination angle of a side surface in a periphery of the first conductive layer among the side surfaces of the semiconductor is less than 90° with respect to an upper surface of the light emission layer.

12. The image display element according to claim 1, wherein
    the reflection material is electrically connected to the first conductive layer.

13. The image display element according to claim 1, wherein
    an inclination angle of the reflection surface with respect to an upper surface of the light emission layer is equal to or less than the inclination angle of the side surface of the first conductive layer with respect to the upper surface of the light emission layer.

14. The image display element according to claim 1, wherein
the reflection material forming the reflection surface of the partition wall is electrically connected to the first conductive layer.

15. The image display element according to claim 1, wherein
a reflection layer that transmits the excitation light and reflects the long wavelength light is provided inside the micro light emitting element.

16. The image display element according to claim 1, wherein
a reflection layer that reflects both the excitation light and the long wavelength light is provided inside the micro light emitting element.

* * * * *